(12) United States Patent
Shinozuka

(10) Patent No.: US 12,038,536 B2
(45) Date of Patent: Jul. 16, 2024

(54) LIGHT RECEPTION DEVICE AND DISTANCE MEASUREMENT DEVICE

(71) Applicant: Sony Semiconductor Solutions Corporation, Kanagawa (JP)

(72) Inventor: Yasuhiro Shinozuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 615 days.

(21) Appl. No.: 17/298,452

(22) PCT Filed: Jan. 7, 2020

(86) PCT No.: PCT/JP2020/000167
§ 371 (c)(1),
(2) Date: May 28, 2021

(87) PCT Pub. No.: WO2020/149173
PCT Pub. Date: Jul. 23, 2020

(65) Prior Publication Data
US 2022/0075033 A1    Mar. 10, 2022

(30) Foreign Application Priority Data
Jan. 15, 2019    (JP) .................................. 2019-004744

(51) Int. Cl.
*G01S 7/48*    (2006.01)
*G01S 7/481*    (2006.01)
(Continued)

(52) U.S. Cl.
CPC .......... *G01S 7/4816* (2013.01); *G01S 7/4863* (2013.01); *G01S 7/4865* (2013.01); *H01L 27/14634* (2013.01)

(58) Field of Classification Search
CPC .... G01S 7/4816; G01S 7/4863; G01S 7/4865; H01L 27/14634
See application file for complete search history.

(56) References Cited

U.S. PATENT DOCUMENTS

| 4,938,588 A | 7/1990 | Taniguchi | |
| 5,981,936 A * | 11/1999 | Fujiie | G11B 7/131 250/214 LA |

(Continued)

FOREIGN PATENT DOCUMENTS

| CN | 1630979 A | 6/2005 |
| CN | 105739584 A | 7/2016 |

(Continued)

OTHER PUBLICATIONS

Extended European Search Report dated Jan. 19, 2022 for corresponding European Application No. 20714368.3.
(Continued)

*Primary Examiner* — Kevin K Pyo
(74) *Attorney, Agent, or Firm* — Michael Best & Friedrich LLP

(57) ABSTRACT

A light reception device according to an embodiment includes: a light receiving element ($1000_1$ to $1000_n$) in which a current flows according to an incident photon in a state where a predetermined voltage is applied and that returns to the state by a recharge current; a generation unit ($1100a$) that generates a reference current; and a copying unit ($1001_1$ to $1001_n$) that copies the reference current generated by the generation unit to generate a copy reference current. A recharge current based on the copy reference current is supplied to the light receiving element.

16 Claims, 31 Drawing Sheets

(51) Int. Cl.
G01S 7/4863 (2020.01)
G01S 7/4865 (2020.01)
H01L 27/146 (2006.01)

(56) References Cited

U.S. PATENT DOCUMENTS

| | | |
|---|---|---|
| 10,158,038 B1 | 12/2018 | Do Valle et al. |
| 2015/0285625 A1 | 10/2015 | Deane |
| 2016/0054447 A1 | 2/2016 | Sun et al. |
| 2017/0070029 A1 | 3/2017 | Moeneclaey |
| 2018/0259629 A1 | 9/2018 | Oohata et al. |

FOREIGN PATENT DOCUMENTS

| | | |
|---|---|---|
| CN | 107101596 A | 8/2017 |
| CN | 108172155 A | 6/2018 |
| JP | 06-308240 A | 11/1994 |
| JP | 2005-515450 A | 5/2005 |
| JP | 2008130523 A | 6/2008 |
| JP | 2008-542706 A | 11/2008 |
| JP | 2012-60012 A | 3/2012 |
| JP | 2014081253 A | 5/2014 |
| JP | 2018-179732 A | 11/2018 |
| TW | 201608259 A | 3/2016 |

OTHER PUBLICATIONS

Cruz Hugo et al, "A 2.5 mW/ch, 50 Mcps, 10-Analog Channel, Adaptively Biased Read-Out Front-End IC With Low Intrinsic Timing Resolution for Single-Photon Time-of-Flight PET Applications With Time-Dependent Noise Analysis in 90 nm CMOS", IEEE Transactions on Biomedical Circuits and Systems, IEEE, US, vol. 11, No. 2, Apr. 1, 2017 (Apr. 1, 2017), pp. 287-299, XP011643461, ISSN: 1932-4545, DOI: 10.1109/TBCAS.2016.2623738 [retrieved on Mar. 22, 2017].

Ruggeri Alessandro et al., "Integrated Circuit for Subnanosecond Gating of InGaAs/InP SPAD", IEEE Journal of Quantum Electronics, IEEE, USA, vol. 51, No. 7, Jul. 1, 2015 (Jul. 1, 2015), pp. 1-7, XP011584376, ISSN: 0018-9197, DOI: 10.1109/JQE.2015.2438436 [retrieved on Jun. 12, 2015].

International Search Report (PCT/ISA/210), International Application No. PCT/JP2020/000167, dated Mar. 6, 2020.

Notification of Transmittal of the International Search Report and the Written Opinion of the International Searching Authority, or the Declaration (PCT/ISA/220), International Application No. PCT/JP2020/000167, dated Mar. 24, 2020.

Written Opinion of the International Search Authority (PCT/ISA/237), International Application No. PCT/JP2020/000167, dated Mar. 24, 2020.

* cited by examiner

FIG.16

| $D_0$ | $D_1$ | $D_2$ | $\alpha$ |
|---|---|---|---|
| 0 | 0 | 0 | 0.25 |
| 1 | 0 | 0 | 0.5 |
| 0 | 1 | 0 | 0.75 |
| 1 | 1 | 0 | 1 |
| 0 | 0 | 1 | 1.25 |
| 1 | 0 | 1 | 1.5 |
| 0 | 1 | 1 | 1.75 |
| 1 | 1 | 1 | 2 |

LIGHT RECEPTION DEVICE AND DISTANCE MEASUREMENT DEVICE

FIELD

The present invention relates to a light reception device and a distance measurement device.

BACKGROUND

Light receiving elements capable of converting received light into electrical signals by photoelectric conversion and outputting the electrical signals are known. As one of such light receiving elements, a single photon avalanche diode (hereinafter, referred to as single photon avalanche diode (SPAD)), capable of obtaining a large current in response to incidence of one photon by avalanche multiplication, is known. The incidence of one photon can be detected with high sensitivity by utilizing this characteristic of the SPAD.

A photon detection operation using the SPAD will be described schematically. For example, a current source to which a power supply voltage Vdd is supplied and whose output current is controlled based on a reference voltage Vref is connected to a cathode of the SPAD. An anode of the SPAD provides a large negative voltage (−Vbd) that causes avalanche multiplication. When a photon is incident on the SPAD in this state, the avalanche multiplication is started, and a current flows from the cathode of the SPAD toward the anode. Accordingly, a voltage drop occurs in the SPAD, and the avalanche multiplication is stopped when a voltage across the anode and the cathode drops to the voltage (−Vbd) (a quenching operation). Thereafter, the SPAD is charged by the current from the current source (referred to as a recharge current Id), and a state of the SPAD returns to a state before the photon incidence (a recharging operation).

In the above-described SPAD operations, a period of the recharging operation is called a dead time, and the photon detection is not performed. It is possible to more efficiently perform the photon detection by appropriately controlling the length of the dead time.

CITATION LIST

Patent Literature

Patent Literature 1: JP 2014-081253 A

SUMMARY

Technical Problem

The length of the dead time changes depending on the recharge current Id supplied from the current source to the SPAD. Here, a case where the current source is configured using one transistor is considered. In this case, the recharge current Id flowing from the transistor to the SPAD is determined depending on the power supply voltage Vdd, the reference voltage Vref, and a characteristic of the transistor (threshold voltage Vth and the like). Since the characteristic of the transistor change depending on a temperature and a variation during manufacturing, it is difficult to control the recharge current Id such that the dead time has an appropriate length.

An object of the present disclosure is to provide a light reception device and a distance measurement device capable of more efficiently detecting a photon.

Solution to Problem

For solving the problem described above, a light reception device according to one aspect of the present disclosure has a light receiving element in which a current flows according to an incident photon in a state where a predetermined voltage is applied and that returns to the state by a recharge current; a generation unit that generates a reference current; and a copying unit that copies the reference current generated by the generation unit to generate a copy reference current, wherein the recharge current based on the copy reference current is supplied to the light receiving element.

BRIEF DESCRIPTION OF DRAWINGS

FIG. 16 is a table illustrating a value of a coefficient α for each size of a transistor according to the second modification of the first embodiment.

DESCRIPTION OF EMBODIMENTS

Hereinafter, embodiments of the present disclosure will be described in detail with reference to the drawings. Note that the same portions are denoted by the same reference signs in the following embodiments, and a repetitive description thereof will be omitted.

Technology Applicable to Embodiments

The present disclosure is suitable for use in a technology for performing photon detection. Prior to the description of each of the embodiments of the present disclosure, a technology of performing distance measurement by the photon detection will be described as one of technologies applicable to the respective embodiments in order to facilitate understanding. A direct time of flight (ToF) method is applied as a distance measurement method in this case. The direct ToF method is a method of receiving reflection light, generated as light emitted from a light source is reflected by a measured object, by a light receiving element, and performing distance measurement based on a time difference between a light emission timing and a light reception timing.

Figure 1:
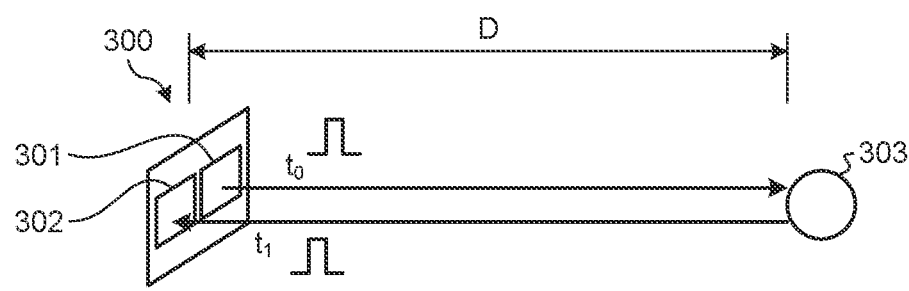
FIG. 1 is a diagram schematically illustrating distance measurement using a direct ToF method applicable to each of embodiments.

The distance measurement using the direct ToF method will be schematically described with reference to FIGS. 1 and 2. FIG. 1 is a diagram schematically illustrating the distance measurement using the direct ToF method applicable to each of the embodiments. A distance measurement device 300 includes a light source unit 301 and a light receiving unit 302. The light source unit 301 is, for example, a laser diode, and is driven so as to emit laser light in a pulsed manner. Light emitted from the light source unit 301 is reflected by a measured object 303 and is received by the light receiving unit 302 as reflection light. The light receiving unit 302 includes a light receiving element that converts light into an electrical signal by photoelectric conversion, and outputs a signal in response to the received light.

Here, the time when the light source unit 301 emits light (light emission timing) is time to, and the time (light reception timing) at which the light receiving unit 302 receives the reflection light, generated as the light emitted from the light source unit 301 is reflected by the measured object 303, is time $t_1$. Assuming that a constant c is a speed of light ($2.9979 \times 10_8$ [m/sec]), a distance D between the distance measurement device 300 and the measured object 303 is calculated by the following Formula (1).

$$D=(c/2)\times(t_1-t_0) \quad (1)$$

The distance measurement device 300 repeats the above-described processing a plurality of times. The light receiving unit 302 may include a plurality of light receiving elements, and the distance D may be calculated based on each light reception timing when reflection light is received by each of the light receiving elements. The distance measurement device 300 classifies time $t_m$ (called light reception time $t_m$) from time to of the light emission timing to the light reception timing when the light is received by the light receiving unit 302 based on glasses (bins) to generate a histogram.

Note that the light received by the light receiving unit 302 during the light reception time $t_m$ is not limited to the reflection light generated as the light emitted by the light source unit 301 is reflected by the measured object. For example, ambient light around the distance measurement device 300 (light receiving unit 302) is also received by the light receiving unit 302.

Figure 2:
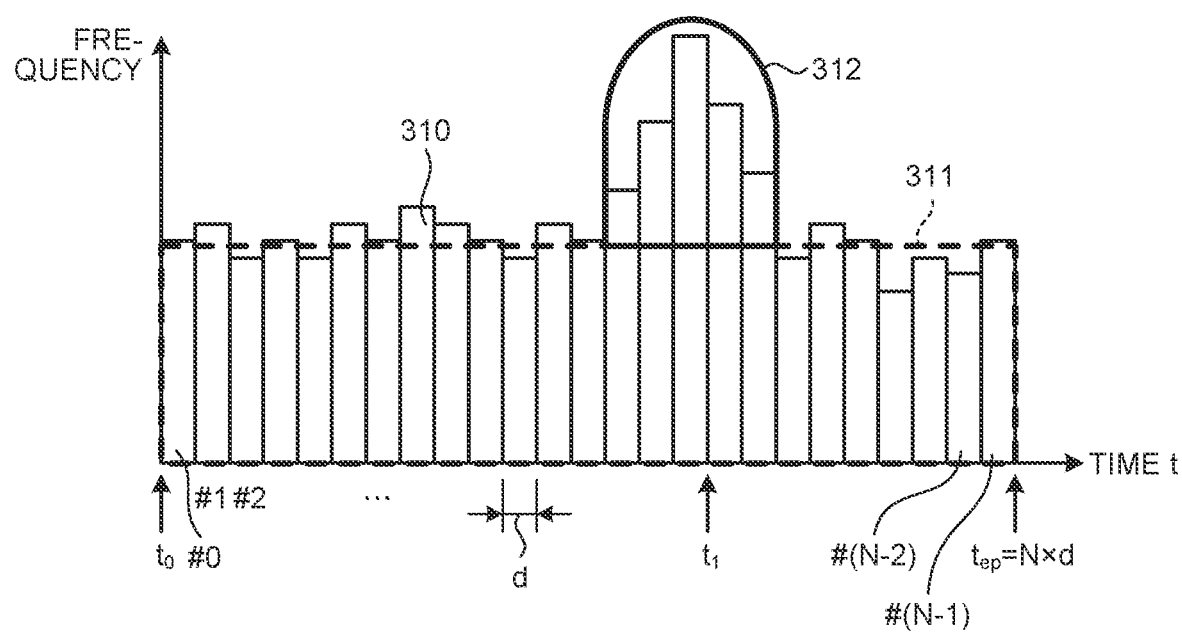
FIG. 2 is a graph illustrating a histogram of an example based on the time when a light receiving unit receives light, which is applicable to a first embodiment.

FIG. 2 is a graph illustrating a histogram of an example based on the time when the light receiving unit 302 receives light, which is applicable to each of the embodiments. In FIG. 2, the horizontal axis represents a bin and the vertical axis represents a frequency for each bin. The bin is a classification of the light reception time $t_m$ for each predetermined unit time d. Specifically, bin #0 is $0 \le t_m < d$, bin #1 is $d \le t_m < 2\times d$, bin #2 is $2\times d \le t_m < 3\times d$, ..., and bin #(N−2) is $(N-2)\times d \le t_m < (N-1)\times d$. When an exposure time of the light receiving unit 302 is time $t_{ep}$, $t_{ep} = N\times d$.

The distance measurement device 300 counts the number of times the light reception time $t_m$ is acquired based on bins to obtain a frequency 310 for each of the bins to generate a histogram. Here, the light receiving unit 302 also receives light other than the reflection light generated as the light emitted from the light source unit 301 is reflected. An example of such light other than the target reflection light is the above-described ambient light. A portion indicated by a range 311 in the histogram includes an ambient light component of the ambient light. The ambient light is light that is randomly incident on the light receiving unit 302 and becomes noise with respect to the target reflection light.

Meanwhile, the target reflection light is light received according to a specific distance and appears as an active light component 312 in the histogram. A bin corresponding to a frequency of a peak in the active light component 312 is a bin corresponding to the distance D of the measured object 303. The distance measurement device 300 can calculate the distance D to the measured object 303 according to the above Formula (1) by acquiring representative time of the bin (for example, time at the center of the bin) as the above-described time $t_1$. In this manner, it is possible to execute appropriate distance measurement for random noise.

Figure 3:
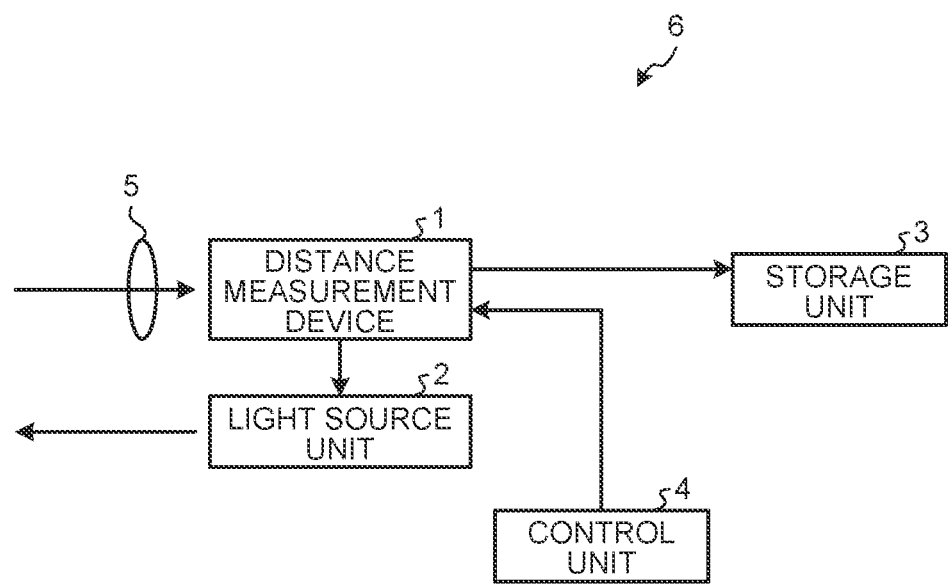
FIG. 3 is a block diagram illustrating a configuration of an example of an electronic device including a distance measurement device according to each of the embodiments.

FIG. 3 is a block diagram illustrating a configuration of an example of an electronic device including the distance measurement device according to each of the embodiments. In FIG. 3, an electronic device 6 includes a distance measurement device 1, a light source unit 2, a storage unit 3, a control unit 4, and an optical system 5.

The light source unit 2 corresponds to the above-described light source unit 301, and is a laser diode, and is driven so as to emit laser light in a pulsed manner, for example. A vertical cavity surface emitting laser (VCSEL) that emits laser light as a surface light source can be applied to the light source unit 2. A configuration in which an array in which laser diodes are arrayed on a line is used as the light source unit 2 and laser light emitted from the laser diode array is scanned in a direction perpendicular to the line may be applied without being limited thereto. Furthermore, it is also possible to apply a configuration in which a laser diode as a single light source is used and laser light emitted from the laser diode is scanned in horizontal and vertical directions.

The distance measurement device 1 includes a plurality of light receiving elements corresponding to the above-described light receiving unit 302. The plurality of light receiving elements are arrayed in a two-dimensional lattice, for example, to form a light reception surface. The optical system 5 guides light incident from the outside to the light reception surface included in the distance measurement device 1.

The control unit 4 controls the overall operation of the electronic device 6. For example, the control unit 4 supplies the distance measurement device 1 with a light emission trigger which is a trigger for causing the light source unit 2 to emit light. The distance measurement device 1 causes the light source unit 2 to emit light at a timing based on this light emission trigger, and stores time to indicating the light emission timing. In addition, the control unit 4 sets a pattern for distance measurement for the distance measurement device 1 in response to an instruction from the outside, for example.

The distance measurement device 1 counts the number of times of acquisition of time information (light reception time $t_m$) indicating the timing at which light is received on the light reception surface within a predetermined time range, and obtains a frequency for each bin to generate the above-described histogram. The distance measurement device 1 further calculates the distance D to the measured object based on the generated histogram. Information indicating the calculated distance D is stored in the storage unit 3.

Figure 4:
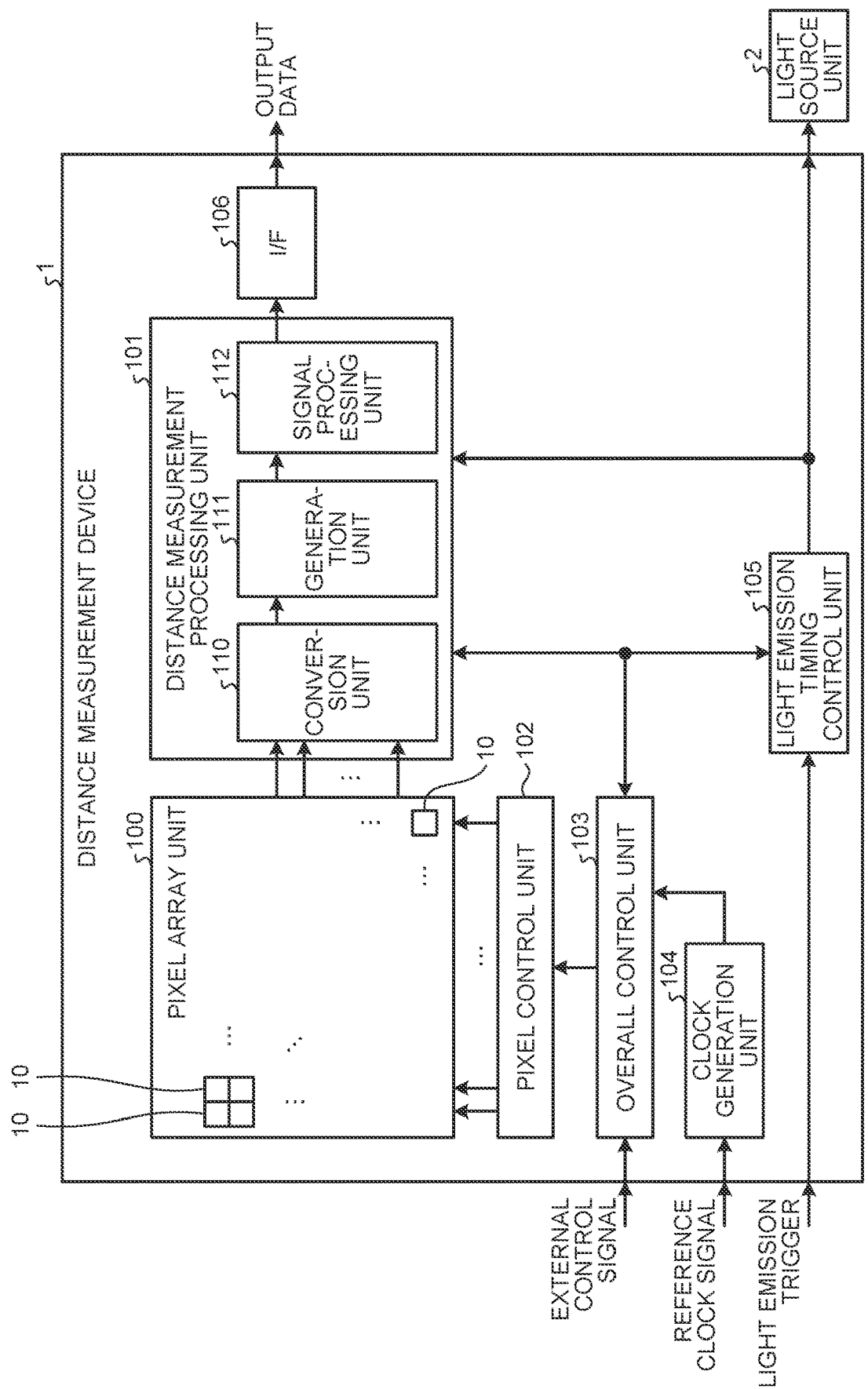
FIG. 4 is a block diagram illustrating a more detailed configuration of an example of the distance measurement device applicable to each of the embodiments.

FIG. 4 is a block diagram illustrating a more detailed configuration of an example of the distance measurement device 1 applicable to each of the embodiments. In FIG. 4, the distance measurement device 1 includes a pixel array unit 100, a distance measurement processing unit 101, and a pixel control unit 102, an overall control unit 103, a clock generation unit 104, a light emission timing control unit 105, and an interface (I/F) 106. These pixel array unit 100, distance measurement processing unit 101, pixel control unit 102, overall control unit 103, clock generation unit 104, light emission timing control unit 105, and interface (I/F) 106 are arranged on, for example, one semiconductor chip.

In FIG. 4, the overall control unit 103 controls an overall operation of the distance measurement device 1 according to, for example, a program incorporated in advance. In addition, the overall control unit 103 can also execute control according to an external control signal supplied from the outside. The clock generation unit 104 generates one or more clock signals used in the distance measurement device 1 based on a reference clock signal supplied from the outside. The light emission timing control unit 105 generates a light emission control signal indicating a light emission timing according to a light emission trigger signal supplied from the outside. The light emission control signal is supplied to the light source unit 2 and also supplied to the distance measurement processing unit 101.

The pixel array unit 100 includes a plurality of pixels 10, 10, and so on which are arrayed in a two-dimensional lattice and include the light receiving elements, respectively. An operation of each of the pixels 10 is controlled by the pixel control unit 102 according to an instruction of the overall control unit 103. For example, the pixel control unit 102 can control reading of a pixel signal from each of the pixels 10 for each block including (p×q) pixels 10 with p pixels in the row direction and q pixels in the column direction. In addition, the pixel control unit 102 can scan each of the pixels 10 in the row direction and further in the column direction in a unit of the block to read the pixel signal from each of the pixels 10. The pixel control unit 102 can also control the respective pixels 10 independently without being limited thereto. Further, the pixel control unit 102 can set a predetermined region of the pixel array unit 100 as a target region, and set the pixel 10 included in the target region as the pixel 10 as a read target of the pixel signal.

The pixel signal read from each of the pixels 10 is supplied to the distance measurement processing unit 101. The distance measurement processing unit 101 includes a conversion unit 110, a generation unit 111, and a signal processing unit 112.

The pixel signal read from each of the pixels 10 and output from the pixel array unit 100 is supplied to the conversion unit 110. Here, the pixel signal is asynchronously read from each of the pixels 10 and supplied to the conversion unit 110. That is, the pixel signal is read from a light receiving element and output according to a timing at which light is received in each of the pixels 10.

The conversion unit 110 converts the pixel signal supplied from the pixel array unit 100 into digital information. That is, the pixel signal supplied from the pixel array unit 100 is output in response to the timing at which light is received by the light receiving element included in the pixel 10 corresponding to the pixel signal. The conversion unit 110 converts the supplied pixel signal into time information indicating the timing.

The generation unit 111 generates a histogram based on the time information in which the pixel signal is converted by the conversion unit 110. Here, the generation unit 111 counts the time information based on the unit time d set by a setting unit 113 to generate the histogram. Details of histogram generation processing of the generation unit 111 will be described later.

The signal processing unit 112 performs predetermined arithmetic processing based on data of the histogram generated by the generation unit 111, and calculates, for example, distance information. The signal processing unit 112 creates, for example, a curve approximation of the histogram based on the data of the histogram generated by the generation unit 111. The signal processing unit 112 can detect a peak of the curve obtained by approximating this histogram and obtain the distance D based on the detected peak.

When performing the curve approximation of the histogram, the signal processing unit 112 can apply filter processing to the curve obtained by approximating the histogram. For example, the signal processing unit 112 can suppress a noise component by performing low-pass filter processing to the curve obtained by approximating the histogram.

The distance information obtained by the signal processing unit 112 is supplied to the interface 106. The interface 106 outputs the distance information supplied from the signal processing unit 112 to the outside as output data. As the interface 106, for example, a mobile industry processor interface (MIPI) can be applied.

Note that the distance information obtained by the signal processing unit 112 is output to the outside via the interface 106 in the above description, but the present invention is not limited to this example. That is, it may be configured such that histogram data, which is the data of the histogram generated by the generation unit 111, is output from the interface 106 to the outside. In this case, information indicating a filter coefficient can be omitted from distance measurement condition information set by the setting unit 113. The histogram data output from the interface 106 is supplied to, for example, an external information processing device, and is appropriately processed.

Figure 5:
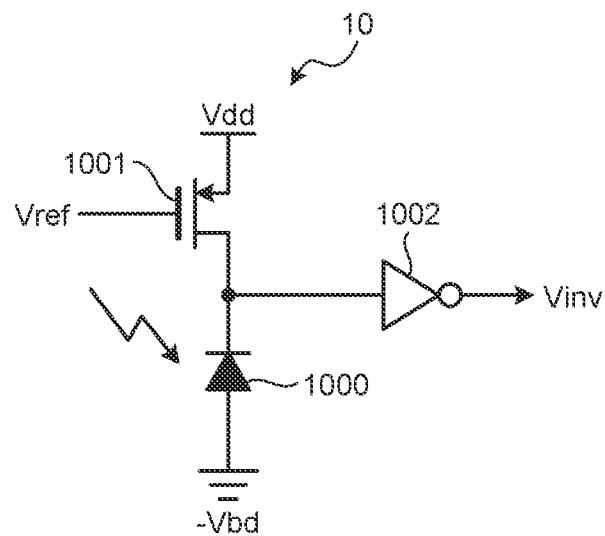
FIG. 5 is a diagram illustrating a configuration of an example of a pixel applicable to each of the embodiments.

FIG. 5 is a diagram illustrating a basic configuration example of the pixel 10 applicable to each of the embodiments. In FIG. 5, the pixel 10 includes a light receiving element 1000, a transistor 1001, and an inverter 1002.

The light receiving element 1000 converts incident light into an electrical signal by photoelectric conversion and outputs the electrical signal. In each of the embodiments, the light receiving element 1000 converts an incident photon (photon) into the electrical signal by photoelectric conversion, and outputs a pulse in response to the incidence of the photon. In each of the embodiments, a single photon avalanche diode is used as the light receiving element 1000. Hereinafter, the single photon avalanche diode is referred to as single photon avalanche diode (SPAD). The SPAD has a characteristic that a large current flows as an electron generated in response to the incidence of one photon causes avalanche multiplication if a large negative voltage is applied to a cathode that causes the avalanche multiplication. The incidence of one photon can be detected with high sensitivity by utilizing this characteristic of the SPAD.

In FIG. 5, the light receiving element 1000, which is the SPAD, has a cathode connected to a drain of the transistor 1001 and an anode connected to a voltage source of a voltage (−Vbd). The voltage (−Vbd) will be described later. A source of the transistor 1001 is connected to a power supply voltage Vdd. A reference voltage Vref is input to a gate of the transistor 1001. The transistor 1001 is a current source that outputs a current corresponding to the power supply voltage Vdd and the reference voltage Vref from the drain. With such a configuration, a reverse bias is applied to the light receiving element 1000. In addition, a photocurrent flows in a direction from the cathode to the anode of the light receiving element 1000.

A signal extracted from a connection point between the drain of the transistor 1001 and the cathode of the light receiving element 1000 is input to the inverter 1002. The inverter 1002 determines, for example, a threshold for the input signal, inverts the signal each time the signal exceeds the threshold in the positive direction or the negative direction, and outputs the signal as an output signal Vinv. Details of the operation of the pixel 10 will be described later.

Note that the light receiving element 1000 is not limited to the SPAD. It is also possible to apply an avalanche photodiode (APD) or an ordinary photodiode as the light receiving element 1000.

Figure 6:
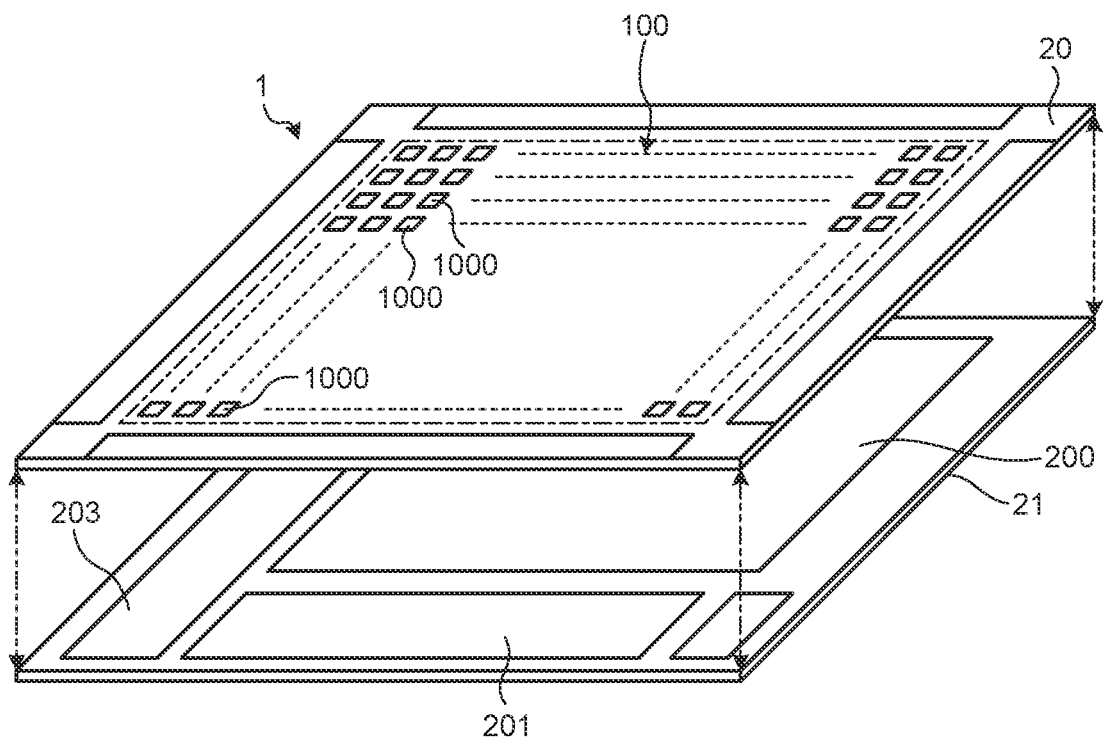
FIG. 6 is a schematic view illustrating an example of a device configuration applicable to the distance measurement device according to each of the embodiments.

FIG. 6 is a schematic view illustrating an example of a device configuration applicable to the distance measurement device 1 according to each of the embodiments. In FIG. 6, the distance measurement device 1 is configured by stacking a light receiving chip 20 and a logic chip 21 each of which is made of a semiconductor chip. Note that FIG. 5 illustrates the light receiving chip 20 and the logic chip 21 in a separated state for the sake of the description.

In the light receiving chip 20, the light receiving elements 1000 included in the plurality of pixels 10, respectively, are arrayed in a two-dimensional lattice in a region of the pixel array unit 100. In addition, the transistor 1001 and the inverter 1002 are formed on the logic chip 21 in the pixel 10. Both ends of the light receiving element 1000 are connected between the light receiving chip 20 and the logic chip 21 via, for example, a coupling portion 1105 by a copper-copper connection (CCC) or the like.

The logic chip 21 is provided with a logic array unit 200 including a signal processing unit that processes a signal acquired by the light receiving element 1000. A signal processing circuit unit 201 that processes a signal acquired by the light receiving element 1000 and an element control unit 203 that controls the operation as the distance measurement device 1 can be provided with respect to the logic chip 21 in close proximity to the logic array unit 200.

For example, the signal processing circuit unit 201 can include the above-described distance measurement processing unit 101. In addition, the element control unit 203 can include the above-described pixel control unit 102, overall control unit 103, clock generation unit 104, light emission timing control unit 105, and interface 106.

Note that the configuration on the light receiving chip 20 and the logic chip 21 is not limited to this example. In addition, the element control unit 203 can be arranged, for example, in the vicinity of the light receiving element 1000 for the other purpose of driving or control, in addition to the control of the logic array unit 200. The element control unit 203 can be provided so as to have an arbitrary function in an arbitrary region on the light receiving chip 20 and the logic chip 21 in addition to the arrangement illustrated in FIG. 6.

[Details of Operation of Light Receiving Element Applicable to Each of Embodiments]

Figure 7:
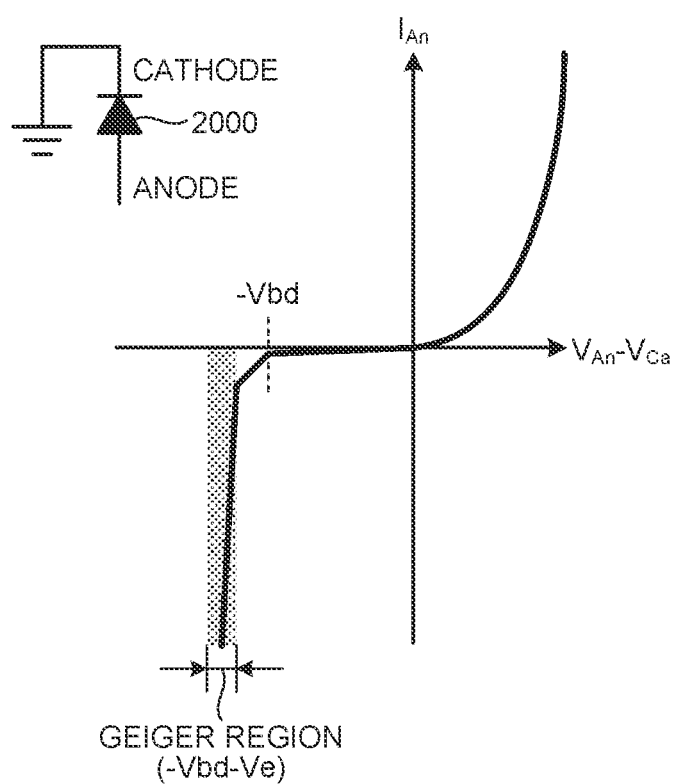
FIG. 7 is a graph illustrating an example of a characteristic of a SPAD.

Next, an operation of the light receiving element 1000 applicable to each of the embodiments will be described in more detail. Hereinafter, a description will be given assuming that the light receiving element 1000 is the SPAD. FIG. 7 is a graph illustrating an example of a characteristic of a SPAD 2000. As illustrated in FIG. 7, it is assumed that a cathode of the SPAD 2000 is connected to a ground potential and an anode is connected to a negative potential. In FIG. 7, the horizontal axis represents a voltage $V_{An}-V_{Ca}$ of (anode potential-cathode potential), and the vertical axis represents an anode current $I_{An}$ flowing from the cathode to the anode.

As illustrated in FIG. 7, in a region where the anode potential $V_{An}$ is higher than the cathode potential $V_{Ca}$, the anode current $I_{An}$ flows in the forward direction and increases according to the voltage $V_{An}-V_{Ca}$. On the other hand, in a region where the anode potential is lower than the cathode potential, the avalanche multiplication occurs when the voltage $V_{An}-V_{Ca}$ is equal to or lower than the voltage (−Vbd), and the anode current $I_{An}$ as a large current starts to flow in the opposite direction. A Geiger region is a region where the voltage $V_{An}-V_{Ca}$ is the voltage (−Vbd−Ve), and a gain of the avalanche multiplication is theoretically infinite. Here, the voltage Vbd is a breakdown voltage of the SPAD 2000, and the voltage Ve is called an excess bias and is a difference between the breakdown voltage Vbd and the voltage $V_{An}-V_{Ca}$. The SPAD is used in this Geiger region.

Figure 8:
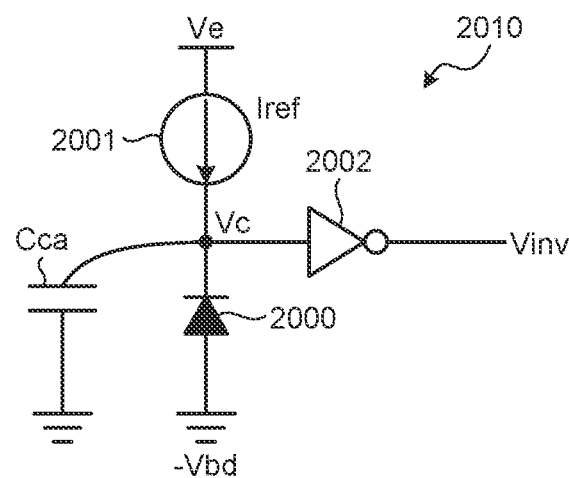
FIG. 8 is a diagram for describing an operation of a pixel using the SPAD, which can be applied to each of the embodiments.
Figure 9:
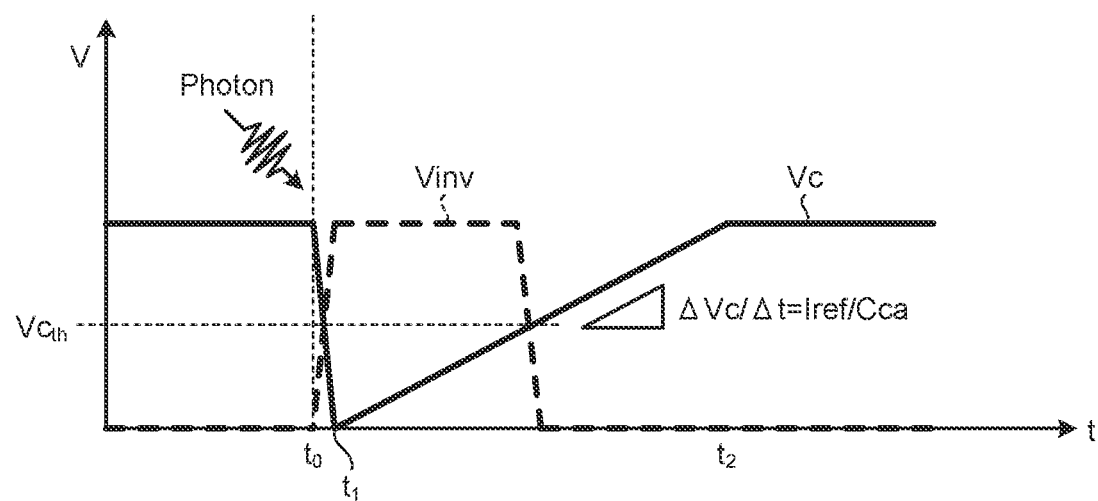
FIG. 9 is a graph for describing the operation of the pixel using the SPAD, which can be applied to each of the embodiments.

FIGS. 8 and 9 are views for describing an operation of a pixel using the SPAD 2000, which can be applied to each of the embodiments. FIG. 8 is a diagram illustrating a configuration of a pixel 2010 corresponding to the above-described pixel 10 in consideration of a parasitic capacitance Cca. In FIG. 8, the anode of the SPAD 2000 is connected to the voltage (−Vbd) and the cathode is connected to one end of a current source 2001. In the current source 2001, the voltage Ve is connected to the other end, and a reference current Iref is supplied to the SPAD 2000 from the other end in one direction. A inverter 2002 and the parasitic capacitance Cca are connected to the cathode of the SPAD 2000.

The parasitic capacitance Cca is the parasitic capacitance at a cathode terminal of the SPAD 2000, and is a sum of a capacitance of a PN junction between the anode and cathode of the SPAD 2000, element capacitances of the current source 2001 and the inverter 2002, a parasitic capacitance related to a wiring, and the like.

FIG. 9 is a graph illustrating the operation of the pixel 2010 when a photon is received by the SPAD 2000. In FIG. 9, the vertical axis represents a voltage and the horizontal axis represents time. A cathode voltage Vc of the SPAD 2000 is a predetermined initial voltage value until the photon is received. In addition, the voltage VA-$V_{Ca}$ between the anode and the cathode of the SPAD 2000 is a voltage (−Vbd). When the SPAD 2000 receives the photon (time to), avalanche multiplication occurs, a large current flows from the cathode to the anode, and the cathode voltage Vc decreases.

When the cathode voltage Vc decreases to the voltage (−Vbd) (time $t_1$), the avalanche multiplication stops, and charging of the cathode of the SPAD 2000 is started with the reference current Iref from the current source 2001. The charging of the cathode of the SPAD 2000 is called recharge. The recharge is performed over a certain time according to a time constant determined by the parasitic capacitance Cca. When the cathode voltage Vc of the SPAD 2000 returns to an initial voltage value (time $t_2$), a recharging operation is completed. In the SPAD 2000, a period of this recharging operation is a period during which it is difficult to detect the photon reception, and is called a dead time.

Here, a slope of a change of the cathode voltage Vc in the recharging of the SPAD 2000 is proportional to the reference current Iref as illustrated in the following Formula (2). That is, the dead time is shortened if the reference current Iref is large, and the dead time is lengthened if the reference current Iref is small.

$$\Delta Vc/\Delta t = Iref/Cca \quad (2)$$

The inverter 2002 outputs the output signal Vinv based on a result obtained by comparing the cathode voltage Vc of the SPAD 2000 with a threshold $Vc_{th}$ (for example, ½Vc). As a result, a pulse corresponding to the photon reception in the SPAD 2000 is generated. A width of this bulse depends on the above-described slope of the cathode voltage Vc, and the pulse width is narrowed when the slope becomes steep and is widened when the slope becomes gentle. Note that the output signal Vinv can be regarded as, for example, a signal obtained by inverting the change of the cathode voltage Vc.

As described above, when the reference current Iref is small, the dead time becomes long, and the sensitivity of the photon detection by the SPAD 2000 decreases. In addition, when the reference current Iref is large, the dead time is shortened, but the pulse width is narrowed, so that high-speed processing is required in the subsequent signal processing. Therefore, it is preferable that the reference current Iref be maintained at an appropriate value.

The operation of the pixel 2010 will be described in more detail with reference to FIGS. 10A to 10D. In FIGS. 10A to 10D, examples of a circuit of the pixel 2010 and the output signal Vinv of the inverter 2002 are illustrated on the right side of each diagram, and an operation example of the SPAD 2000 is illustrated on the left side.

Each graph on the left side of FIGS. 10A to 10D corresponds to FIG. 7 described above, and the vertical axis represents the voltage $V_{An}-V_{Ca}$ and the vertical axis represents the anode current $I_{An}$. In addition, in each circuit diagram on the right side of FIGS. 10A to 10D, a switch 2003 selectively supplies the voltage Ve and the ground potential to the cathode of the SPAD 2000. This switch 2003 is provided for the sake of convenience to describe the operation of the pixel 2010, and is not used in an actual circuit.

Figure 10A:
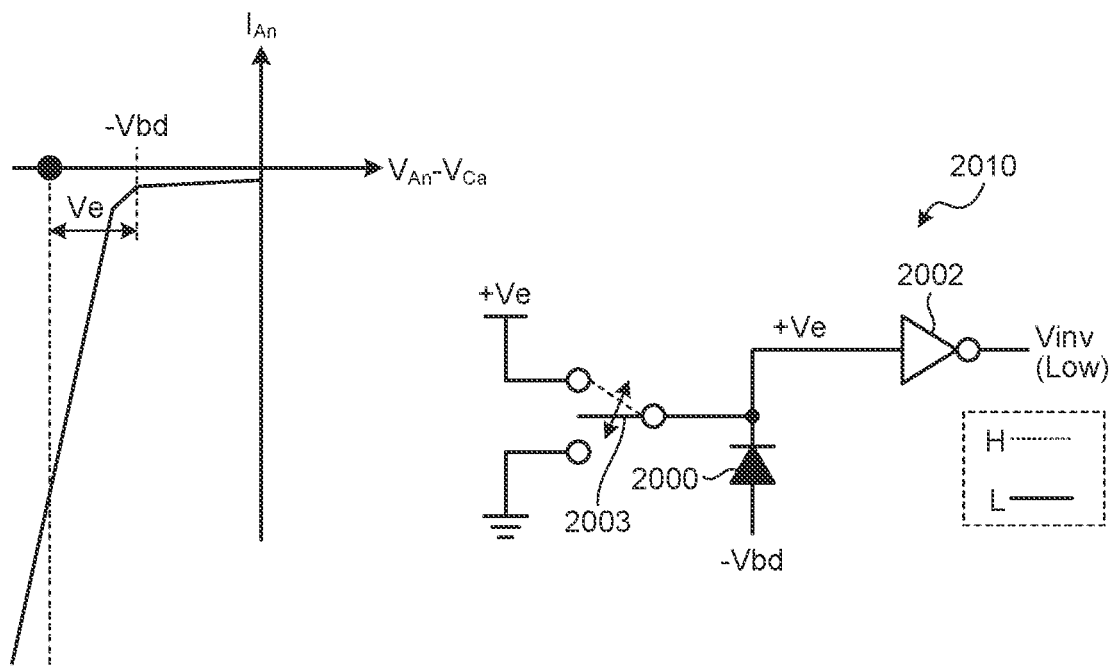
FIG. 10A is a diagram for describing the operation of the pixel in more detail.

As a first step, the voltage Ve is selected in the switch 2003 to charge the cathode of the SPAD 2000 with a voltage (+Ve) as illustrated in FIG. 10A. In addition, the anode potential $V_{An}$ is fixed at the voltage (−Vbd). As a result, a potential across the anode and the cathode of the SPAD 2000 is the voltage (−Vbd−Ve) as indicated by "e (black circle)" in the graph on the left side of FIG. 10A. In this case, no current flows through the SPAD 2000 unless a phenomenon (photon reception, a dark current, or the like) that triggers avalanche multiplication occurs. Therefore, the output signal Vinv of the inverter 2002 is in a low state.

Figure 10B:
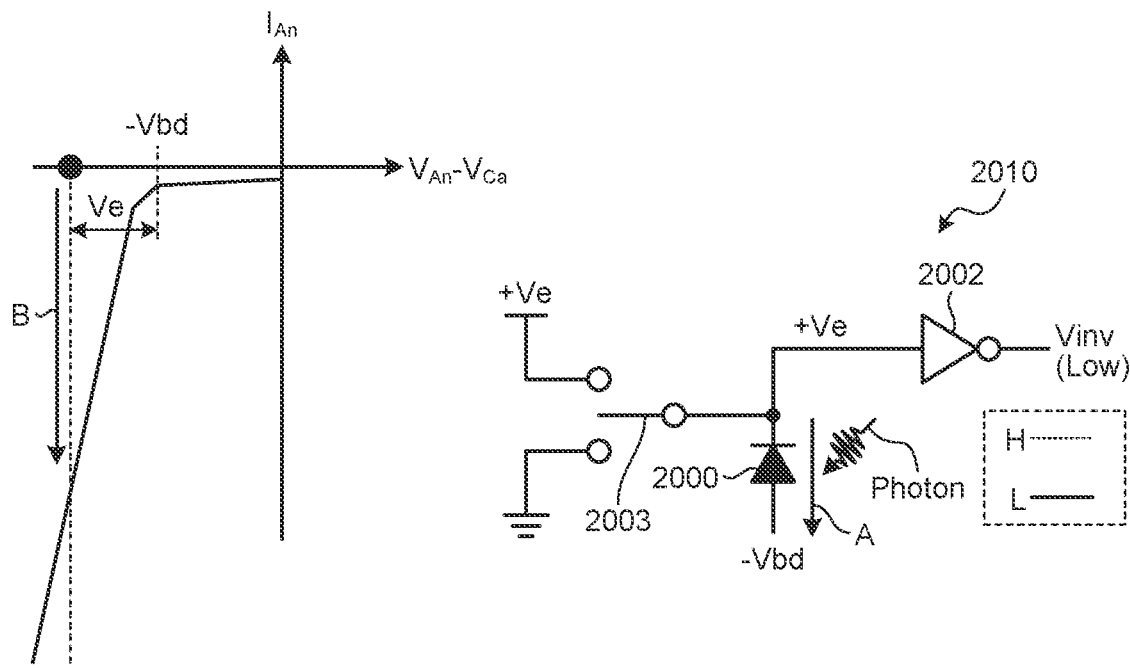
FIG. 10B is a diagram for describing the operation of the pixel in more detail.
Figure 10C:
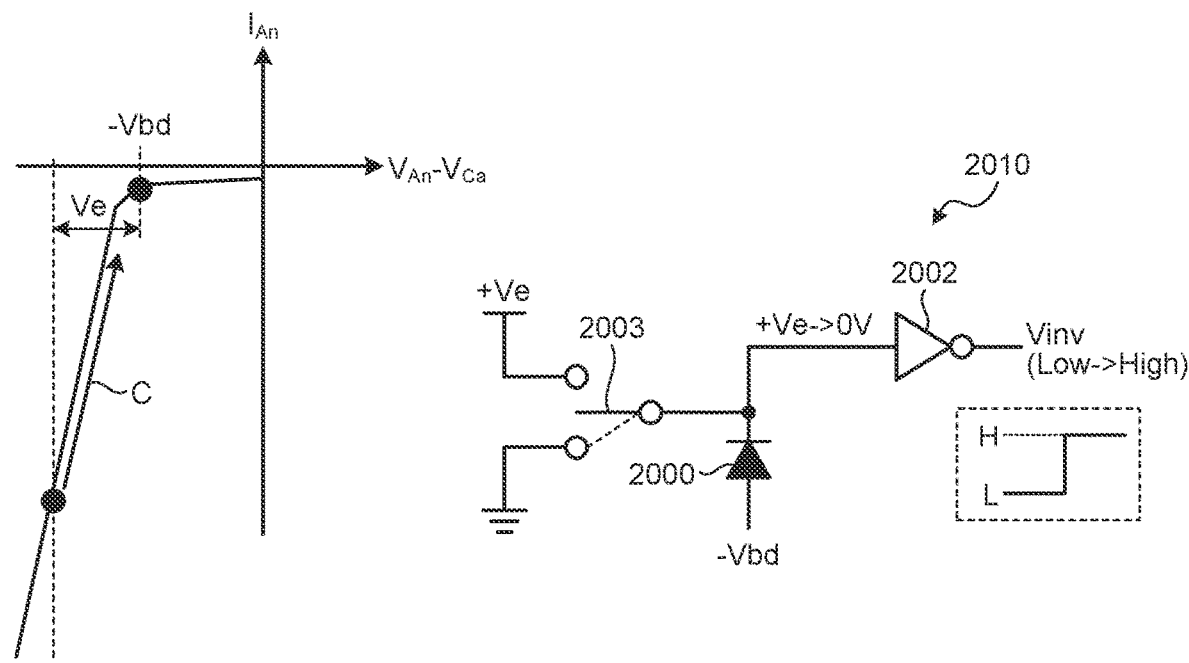
FIG. 10C is a diagram for describing the operation of the pixel in more detail.

As a second step, a case where a photon is received by the SPAD 2000 in the state of FIG. 10A will be described with reference to FIG. 10B. When a photon (illustrated as Photon in the drawing) is received by the SPAD 2000 in the state where the potential across the anode and the cathode of the SPAD 2000 is the voltage (−Vbd−Ve), the avalanche multiplication is started. As a result, a current flows in the opposite direction as indicated by arrow A in the SPAD 2000. The anode current $I_{An}$ flows according to the characteristic of the SPAD 2000 as indicated by arrow B in the graph on the left side of FIG. 10B.

As a third step, a potential of the cathode voltage Vc decreases from the voltage (+Ve) to 0 V when the anode current $I_{An}$ flows. As a result, the output signal Vinv of the inverter 2002 shifts from the low state to a high state. In addition, the avalanche multiplication is stopped when the potential across the anode and the cathode of the SPAD 2000 drops to the voltage (−Vbd) as indicated by arrow C in the graph on the left side of FIG. 10C. This operation in which the avalanche multiplication is stopped in the SPAD 2000 is called a quenching operation.

Note that the quenching operation can also be realized by, for example, selecting the ground potential in the switch 2003 and forcibly connecting the cathode of the SPAD 2000 to 0 V.

Figure 10D:
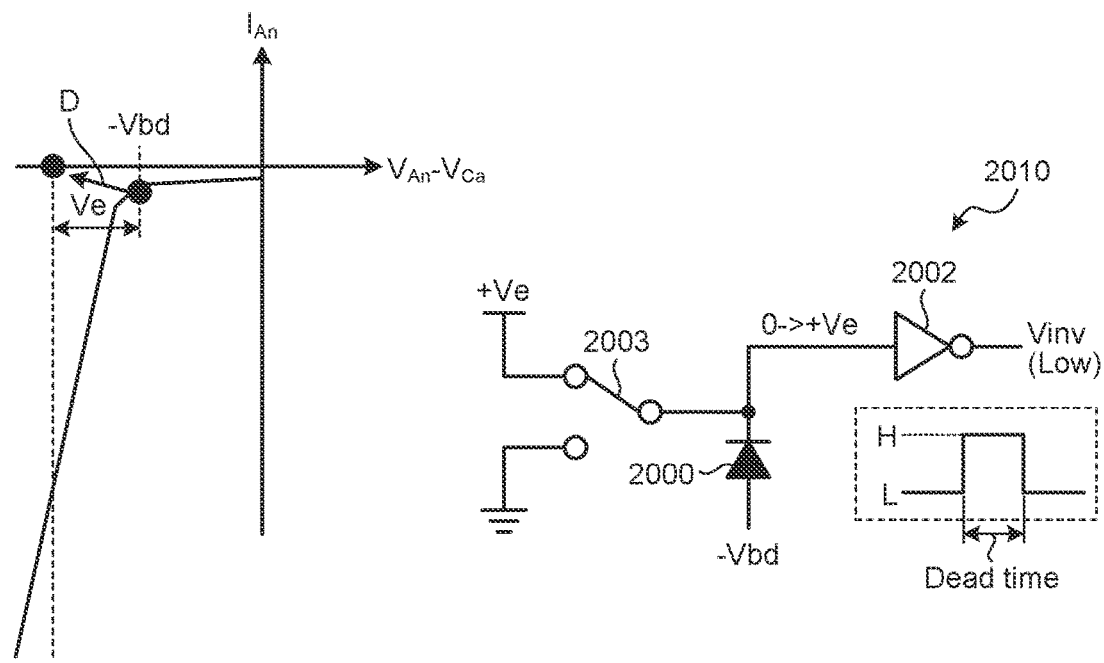
FIG. 10D is a diagram for describing the operation of the pixel in more detail.

As a fourth step, the voltage Ve is selected in the switch 2003 and the cathode of the SPAD 2000 is charged to the voltage Ve, for example, as illustrated on the right side of FIG. 10D after the above-described quenching operation. This charging operation after the quenching operation is called a recharging operation. Through this recharging operation, the potential across the anode and the cathode of the SPAD 2000 changes from the voltage (−Vbd) to the voltage (−Vbd−Ve), and the output signal Vinv of the inverter 2002 shifts from the high state to the low state as indicated by arrow D in the graph on the left side of FIG. 10D.

In this manner, the recharging operation returns the state of the SPAD 2000 to the state according to the first step described with reference to FIG. 10A. The pixel 2010 repeats the operations from the first step to the fourth step each time a photon is received and photoelectric conversion is performed in the SPAD 2000. The pulsed output signal Vinv is output from the inverter 2002 for each photon received by the SPAD 2000.

As illustrated in the diagram on the right side of FIG. 10D, a period from a rise to a fall of the output signal Vinv of the inverter 2002 corresponds to a period of the recharging operation, and the avalanche multiplication does not occur within this period, and thus, it is difficult to detect the photon reception. This period from the photon reception to the completion of recharging is the dead time.

Several types of configurations for driving the SPAD 2000 are conceivable. Three types of configurations for driving the SPAD 2000 will be schematically described with reference to FIGS. 11A to 11C.

Figure 11A:
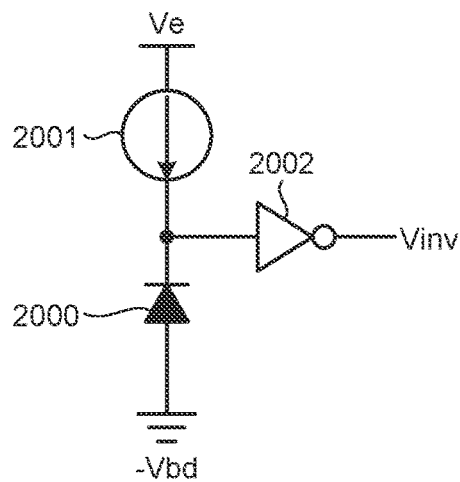
FIG. 11A is a diagram for schematically describing a configuration for driving of the SPAD.

FIG. 11A is a diagram schematically illustrating an example of a configuration in which the SPAD 2000 is passively driven based on the characteristic thereof. The configuration of FIG. 11A corresponds to the configuration of FIG. 5 described above, and thus, the anode of the SPAD 2000 is connected to the voltage (−Vbd) and the cathode is connected to the other end of the current source 2001 whose one end is connected to the voltage Ve, and the inverter 2002. The inverter 2002 outputs the output signal Vinv with the inverted cathode voltage Vc.

In the configuration of FIG. 11A, the quenching operation is performed by a passive operation that is started when the cathode voltage of the SPAD 2000 decreases to the voltage (−Vbd) due to the photon reception. In addition, the recharging operation is performed by a passive operation in which the cathode of the SPAD 2000 is charged to the voltage Ve by the current supplied from the current source 2001. That is, both the quenching operation and the recharging operation are performed by the passive operation in the configuration of FIG. 11A.

Figure 11B:
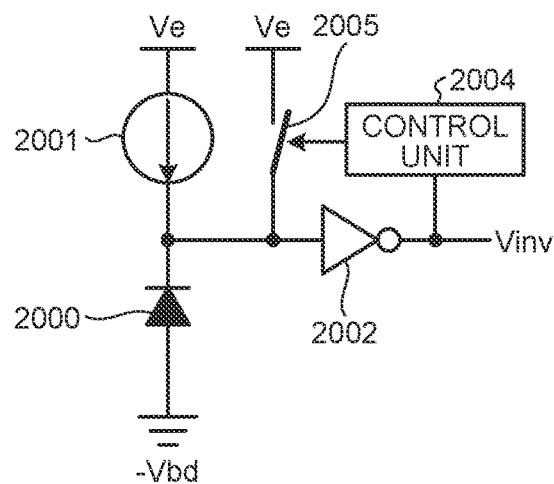
FIG. 11B is a diagram for schematically describing a configuration for driving of the SPAD.

FIG. 11B is a diagram schematically illustrating an example of a configuration in which the quenching operation is performed by the passive operation in the same manner as in the example of FIG. 11A and the recharging operation is actively performed. In FIG. 11B, the cathode of the SPAD 2000 is connected to the voltage Ve via a switch 2005 controlled to be on (closed) and off (open) by a control unit 2004. The control unit 2004 turns on the switch 2005 at a timing when the fall of the output signal Vinv output from the inverter 2002 is delayed by a predetermined time. As a result, the potential of the cathode of the SPAD 2000 is forcibly set to the voltage Ve, and the recharging operation is performed.

Figure 11C:
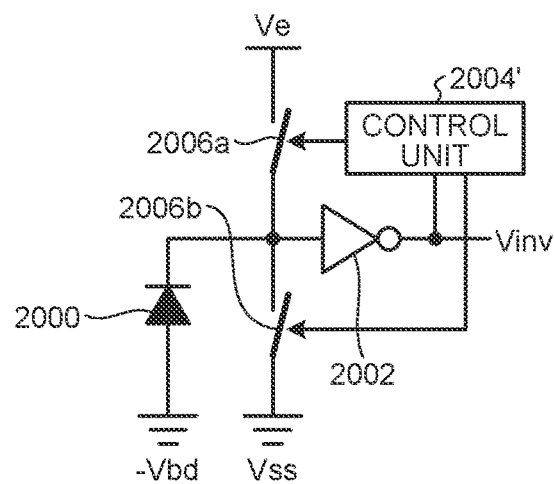
FIG. 11C is a diagram for schematically describing a configuration for driving of the SPAD.

FIG. 11C is a diagram schematically illustrating an example of a configuration in which each of the quenching operation and the recharging operation is actively performed. In FIG. 11C, each of switches 2006a and 2006b is controlled to be on and off by a control unit 2004'. The cathode of the SPAD 2000 is connected to the voltage Ve via the switch 2006a and connected to the power supply voltage Vss via the switch 2006b. For example, the control unit 2004' turns on the switch 2006b and turns off the switch 2006a at the rise of the output signal Vinv output from the inverter 2002 and forcibly connects the cathode of the SPAD 2000 to the power supply voltage Vss to perform the quenching operation. In addition, the control unit 2004' turns on the switch 2006a at a timing when the fall of the output signal Vinv is delayed by a predetermined time, and forcibly sets the potential of the cathode of the SPAD 2000 to the voltage Ve to perform the recharging operation.

Among the configurations of FIGS. 11A to 11C described above, the number of elements is small and a mounting area is the smallest in the configuration of FIG. 11A in which each of the quenching operation and the recharging operation is performed by the passive operation. On the other hand, the dead time depends on the characteristic of the SPAD 2000 and the current source 2001, and control thereof is difficult. In the configuration of FIG. 11B in which the quenching operation is passively performed and the recharging operation is active is performed, the dead time can be easily controlled, but the number of elements is larger than that in the configuration of in FIG. 11A, and a mounting area is larger than that in the configuration of FIG. 11A. In addition, in the configuration of FIG. 11C in which both the quenching operation and the recharging operation are actively performed, the dead time can be easily controlled, but the number of elements is still larger than that in FIG. 11B, and a mounting area is the largest.

In the present disclosure, the characteristic of the current source 2001 is improved such that the desired dead time can be easily obtained in the configuration illustrated in FIG. 11A in which the quenching operation and the recharging operation are performed by the passive operation, which enables mounting in a small area.

First Embodiment (Regarding Existing Technology)

Figure 12:
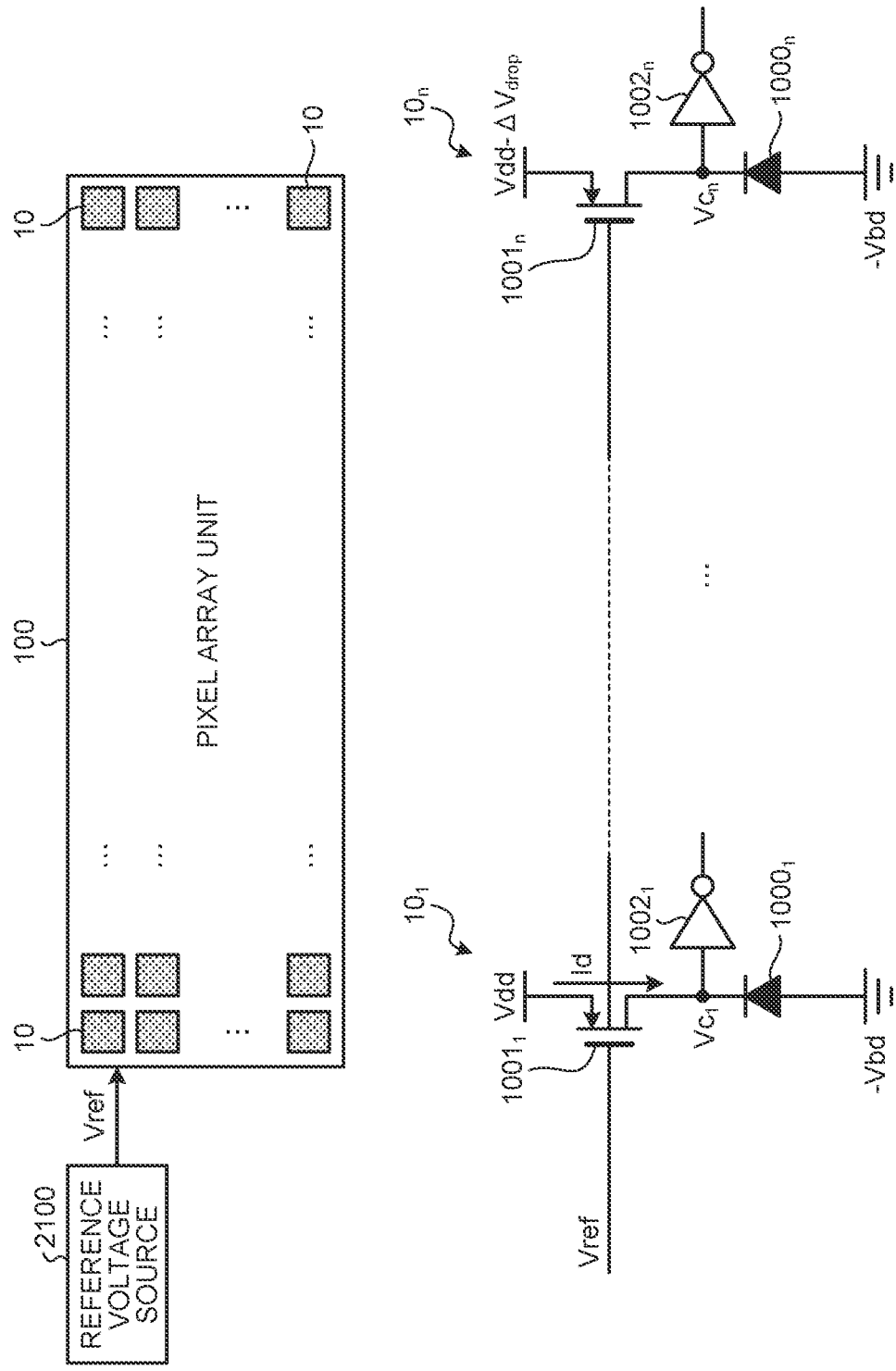
FIG. 12 is a diagram illustrating a configuration of an example of a light reception device according to an existing technology by paying attention to a pixel array unit.

A light reception device according to a first embodiment of the present disclosure will be described. First, a light reception device according to an existing technology will be described in order to facilitate understanding. FIG. 12 is a diagram illustrating a configuration of an example of the light reception device according to the existing technology by paying attention to the pixel array unit 100 (see FIG. 4). As illustrated in the upper part of FIG. 12, the plurality of pixels 10 are arrayed in a two-dimensional lattice in the pixel array unit 100. A reference voltage source 2100 supplies the reference voltage Vref to each of the pixels 10 included in the pixel array unit 100. Note that it is assumed that n pixels 10 are arrayed in the row direction with the horizontal direction (lateral direction) of the pixel array unit 100 as the row direction and the vertical direction (longitudinal direction) as the column direction in the upper part of FIG. 12

The lower part of FIG. 12 illustrates a circuit configuration of an example of each of the pixels 10 according to the existing technology. Note that attention is paid to one row of the pixel array unit 100 in the lower part of FIG. 12, the pixel 10 at a left end in the one row is illustrated as a pixel 101, and the pixel 10 at a right end is illustrated as a pixel $10_n$. The pixel 101 includes a light receiving element $1000_1$ which is a SPAD, an inverter $1002_1$, and a transistor $1001_1$ which is a P-channel metal oxide semiconductor-field effect transistor (MOSFET). The pixel $10_n$ is also similarly configured, and includes a light receiving element $1000_m$ which is a SPAD, an inverter $1002_n$, and a transistor $1001_n$ which is a P-channel MOSFET.

In the pixel 101, an anode of the light receiving element $1000_1$ is connected to the voltage (−Vbd) and a cathode is connected to a drain of the transistor $1001_1$. A source of the transistor $1001_1$ is connected to the power supply voltage Vdd. A cathode voltage $Vc_1$ of the light receiving element $1000_1$ is input to the inverter $1002_1$. In addition, the reference voltage Vref from the reference voltage source 2100 is supplied to a gate of the transistor $1001_1$. The transistor $1001_1$ is a current source configured to generate a current Id according to the reference voltage Vref. The current Id is used as a recharge current for the light receiving element $1000_1$ and corresponds to the reference current Iref described with reference to FIG. 8. Hereinafter, the current Id will be referred to as the recharge current Id.

Note that, in the pixel 10, a circuit related to the light receiving element 1000 included in the pixel 10 is called a sub-pixel circuit. In the example of FIG. 12, the sub-pixel circuit is constituted by the inverter $1002_1$ and the transistor $1001_1$ connected to the light receiving element $1000_1$ in the pixel 101. The light receiving element $1000_1$ itself may be included in the sub-pixel circuit.

The pixel 10, also includes the light receiving element $1000_n$, the inverter $1002_n$ into which a cathode voltage $Vc_n$ of the light receiving element $1000_n$ is input, and the transistor $1001_n$, which is similar to the pixel 101. Since the connection relationship is the same as that of the pixel 101, the detailed description thereof will be omitted.

In the pixel $10_n$, the reference voltage Vref from the reference voltage source 2100 is supplied to a gate of the transistor $1001_n$. For example, the reference voltage Vref is commonly supplied to the gates of the transistors as current sources for the light receiving elements 1000 included in the respective pixels 10 included in the pixel array unit 100.

In the configuration of FIG. 12, a current value of the recharge current Id is expressed by the following Formula (3). Note that, in Formula (3), each of values W and L is a constant corresponding to a size of the transistor $1001_1$, and a value β is a value unique to the transistor $1001_1$. In addition, a voltage Vth is a threshold voltage of the transistor $1001_1$. These values W and L, the value β, and the voltage Vth are device parameters that determine a characteristic of a transistor and is likely to differ for each transistor.

$$I_d = \frac{1}{2}\beta\frac{W}{L}(V_{dd} - V_{ref} - V_{th})^2 \qquad (3)$$

From Formula (3), it can be understood that the recharge current Id varies depending on the voltage Vth, which is the threshold voltage of the transistor $1001_1$, and the power supply voltage Vdd. Here, the voltage Vth varies depending on, for example, an ambient temperature. Therefore, if the reference current Iref of the above Formula (2) is replaced with the recharge current Id, it can be understood that a slope of a change in the cathode voltage $Vc_1$ also varies as a value of the recharge current Id varies depending on the ambient temperature or the like, and accordingly, the dead time varies.

In addition, a case where the power supply voltage Vdd supplied to the pixel 10 differs depending on a position of the pixel 10 is also conceivable, for example, depending on a method of supplying the power supply voltage Vdd to the pixel array unit 100. For example, when the power supply voltage Vdd is supplied from the left end side of the pixel array unit 100 in the upper part of FIG. 12, a voltage drop $\Delta V_{drop}$ corresponding to a distance from a supply position of the power supply voltage Vdd to the pixel $10_n$, for example, occurs for the power supply voltage Vdd in the pixel 10, arranged on the right end side. Therefore, a voltage supplied to a source of the transistor $1001_n$ becomes a voltage $(Vdd - \Delta V_{drop})$ different from the power supply voltage Vdd in the pixel $10_n$, and the dead time also becomes a value different from that of the pixel 101.

Details of First Embodiment

Figure 13:
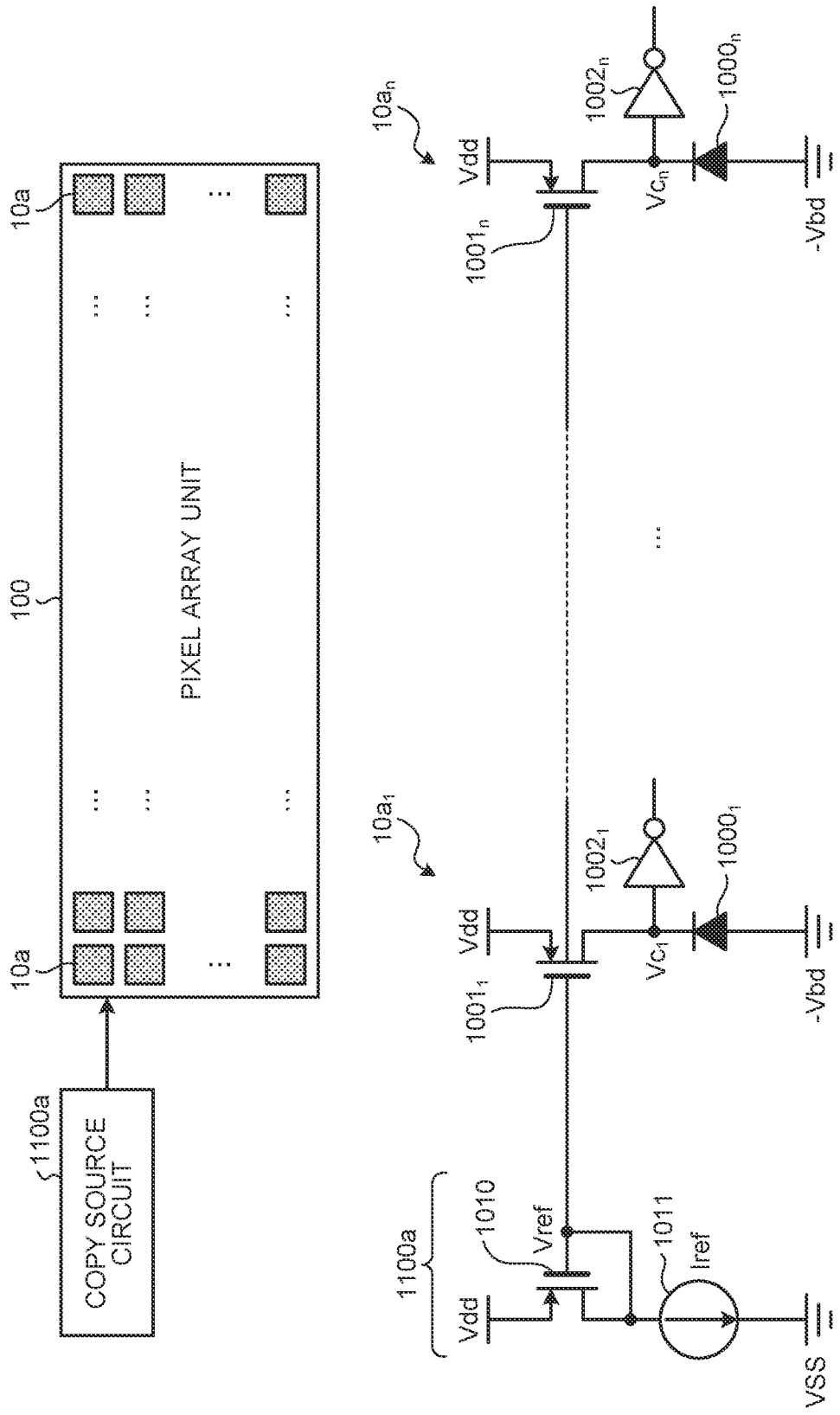
FIG. 13 is a diagram illustrating a configuration of an example of a light reception device according to the first embodiment by paying attention to a pixel array unit.

Next, the first embodiment of the present disclosure will be described. FIG. 13 is a diagram illustrating a configuration of an example of the light reception device according to the first embodiment by paying attention to the pixel array unit 100. As illustrated in the upper part of FIG. 13, a copy source circuit 1100a causes each of pixels 10a included in the pixel array unit 100 to generate the reference current Iref used as the recharge current Id in the first embodiment. The reference current Iref generated by the copy source circuit 1100a is copied by a copy destination circuit included in each of the pixels 10a in the pixel array unit 100, and is used as the recharge current Id for performing the recharging operation of the light receiving element 1000 in each of the pixels 10a.

The lower part of FIG. 13 illustrates circuit configurations of examples of the copy source circuit 1100a and each of the pixels 10a according to the first embodiment. In the lower diagram of FIG. 13, a configuration of each of pixels $10a_1, \ldots,$ and $10a_n$ is the same as the configuration of each of the pixels $10a_1, \ldots,$ and $10a_n$ described in FIG. 12, and thus, the description thereof will be omitted here.

In the lower diagram of FIG. 13, the copy source circuit 1100a includes a transistor 1010 which is a P-channel MOSFET and a current source 1011. The current source 1011 has one end connected to a drain of the transistor 1010, and the other end connected to the power supply voltage Vss. The transistor 1010 has a source connected to the power supply voltage Vdd, and a drain connected to one end of the above-described current source 1011 and connected to a gate of the transistor 1010. When the reference current Iref is constant, a potential of the gate of the transistor 1010 becomes the reference voltage Vref determined according to the reference current Iref.

Note that the current source 1011 can be configured using a reference voltage generation circuit such as a bandgap reference (BGR) circuit. The BGR circuit is a circuit that generates a constant voltage based on a characteristic of a semiconductor element used in the circuit. In addition, the copy source circuit 1100a can be included in, for example, the pixel control unit 102 (see FIG. 4).

The gate of the transistor 1010 is connected to, for example, a gate of the transistor $1001_1$ included in the pixel $10a_1$. As a result, a current mirror circuit is formed by the transistor 1010 and the transistor $1001_1$. This current mirror circuit copies the reference current Iref generated by the current source 1011 in the copy source circuit 1100a, which is a current mirror source, as a source-drain current of the transistor $1001_1$ as a copy destination circuit which is a current mirror destination.

Therefore, at the current mirror destination, the recharge current Id for the light receiving element $1000_1$ matches the reference current Iref of the current mirror source regardless of the device parameters (threshold voltage Vth, value β, and values W and L) of the transistor $1001_1$. Therefore, the recharge current Id can be easily controlled, and the dead time in the light receiving element $1000_1$ can be easily adjusted to an appropriate value. As a result, the operation of the pixel $10a_1$ becomes more stable, and a photon can be more efficiently detected.

In addition, the transistor 1010, which is the current mirror source, can further set another pixel 10a included in the pixel array unit 100 as a current mirror destination. In the example of FIG. 13, the gate of the transistor 1010 of the current mirror source is further connected to a gate of the transistor $1001_n$ of the pixel $10a_n$, and this transistor $1001_n$ is also used as the current mirror destination of the transistor 1010. As a result, the recharge current Id of the pixel $10a_n$ matches the reference current Iref of the current mirror source regardless of the device parameter of the transistor $1001_n$, and the recharge current Id of the pixel $10a_n$ can be easily controlled.

In addition, the reference current Iref of the current mirror source is copied as the recharge current Id even in the pixel $10a_n$ similarly to the pixel $10a_1$, and thus, a variation between pixels can be suppressed.

First Modification of First Embodiment

Next, a first modification of the first embodiment will be described. The first modification of the first embodiment is a more specific example of the first embodiment described above, and is an example in which the reference current Iref is generated using a constant voltage source and a resistance element. In addition, the BGR circuit is used as the constant voltage source. The generated reference current Iref is copied in each of the pixels 10a by the current mirror circuit and used as the recharge current Id for the light receiving element 1000 included in each of the pixels 10a, which is similar to that in the first embodiment described above.

Figure 14:
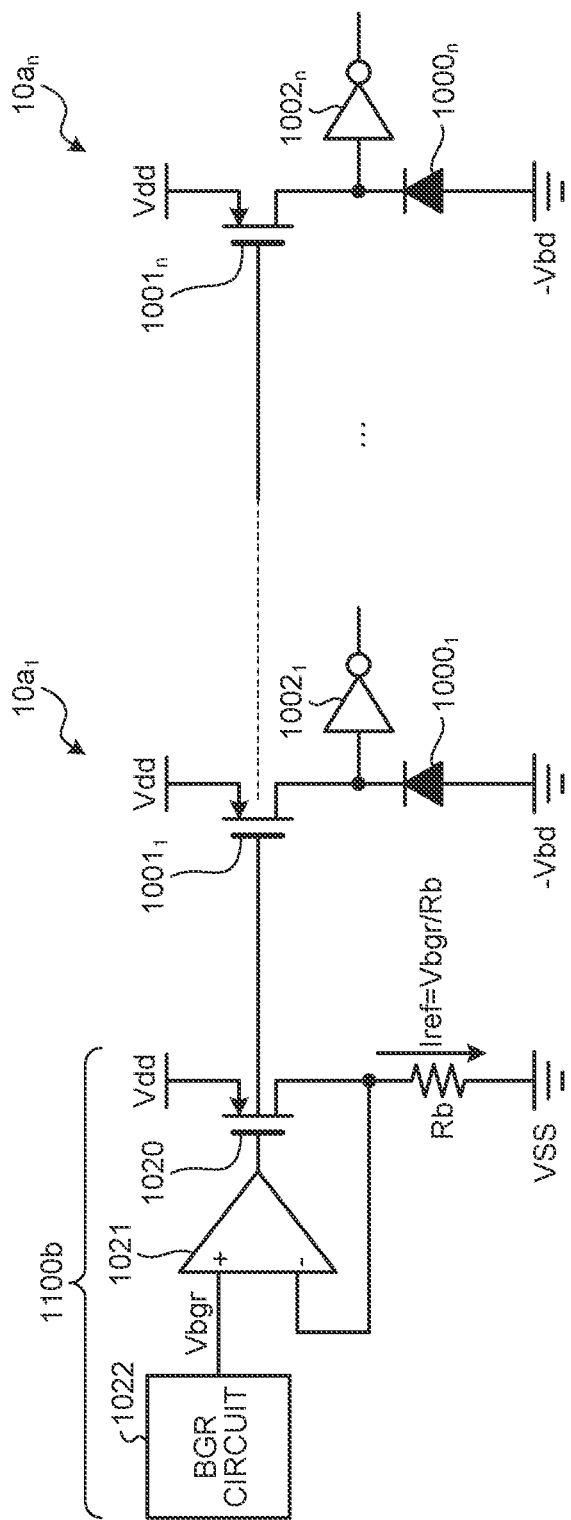
FIG. 14 is a diagram illustrating a circuit configuration of an example according to a first modification of the first embodiment.

FIG. 14 is a diagram illustrating a circuit configuration of an example according to the first modification of the first embodiment. In FIG. 14, a copy source circuit 1100b includes a transistor 1020, a differential amplifier 1021, a BGR circuit 1022 as a constant voltage source, and a resistor Rb. Note that the copy source circuit 1100b can be included in, for example, the pixel control unit 102 (see FIG. 4). The BGR circuit 1022 outputs an output voltage Vbgr which is a constant voltage. This output voltage Vbgr is input to a positive electrode input end (+) of the differential amplifier 1021.

An output of the differential amplifier 1021 is input to a gate of the transistor 1020 which is, for example, a P-channel MOSFET. The gate of the transistor 1020 is further commonly connected to the gates of transistors $1001_1, \ldots ,$ and $1001_n$ of the respective pixels $10a_1, \ldots ,$ and $10a_n$. The transistor 1020 has a source connected to the power supply voltage Vdd, and a drain connected to a negative electrode input end (−) of the differential amplifier 1021 and connected to one end of the resistor Rb. The other end of the resistor Rb is connected to the power supply voltage Vss.

In such a configuration, the differential amplifier 1021 is controlled by negative feedback formed by connecting the drain of the transistor 1020 to the negative electrode input end (−) such that a potential across the resistor Rb matches the output voltage Vbgr of the BGR circuit 1022. A current (Vbgr/Rb) flowing through the resistor Rb is a constant current, and this is used as the reference current Iref.

This reference current Iref is copied as the source-drain current of each of the transistors $1001_1, \ldots ,$ and $1000_n$ included in the respective pixels $10a_1, \ldots ,$ and $10a_n$ as the current mirror destination with the configuration in which the drain and gate of the transistor 1020 are connected via the differential amplifier 1021 as the current mirror source. Each of the copied reference currents Iref is used as the recharge current Id of each of the light receiving elements $1000_1, \ldots ,$ and $1000_n$ in each of the pixels $10a_1, \ldots ,$ and $10a_n$.

In the first modification of the first embodiment, the copy source circuit 1100b uses the BGR circuit 1022 as the constant voltage source to generate the reference current Iref, and copies this reference current Iref in each of the pixels $10a_1, \ldots ,$ and $10a_n$ with the current mirror configuration. In each of the pixels $10a_1, \ldots ,$ and $10a_n$, each of the reference currents Iref copied from the copy source circuit 1100b, which is the current mirror source, is used as the recharge current Id for each of the light receiving elements $1000_1, \ldots ,$ and $1000_n$ included in each of the pixels $10a_1, \ldots ,$ and $10a_n$. Since the recharge current Id is generated based on the output voltage Vbgr of the BGR circuit 1022, it is possible to suppress PVT (process/voltage/temperature) variations of the recharge current Id.

Second Modification of First Embodiment

Next, a second modification of the first embodiment will be described. In the second modification of the first embodiment, the reference current Iref supplied to the pixel array unit 100 can be adjusted after manufacturing a device (see FIG. 6) including the pixel array unit 100.

Figure 15:
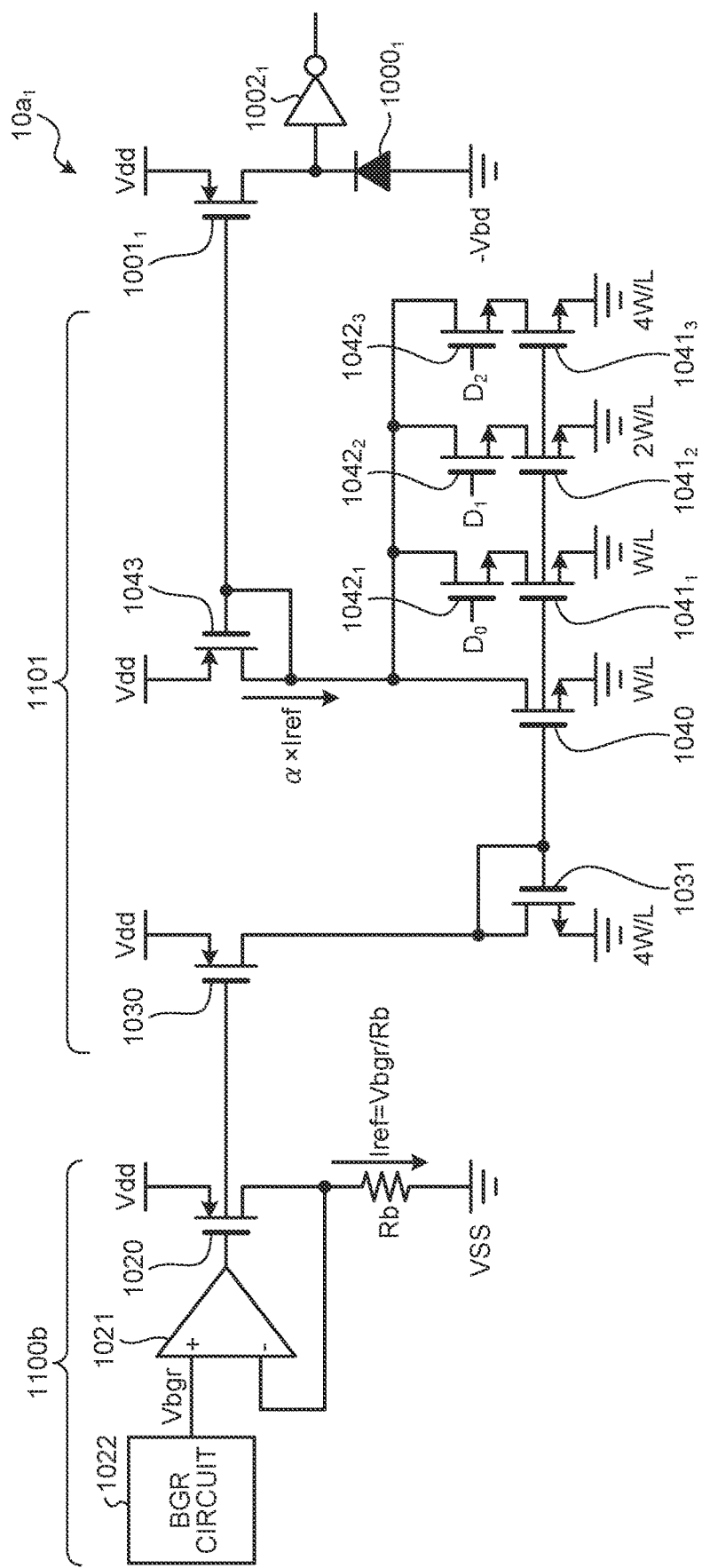
FIG. 15 is a diagram illustrating a circuit configuration of an example according to a second modification of the first embodiment.

FIG. 15 is a diagram illustrating a circuit configuration of an example according to the second modification of the first embodiment. In FIG. 15, the reference current Iref is generated using the copy source circuit 1100b used in the first modification of the first embodiment. A current adjustment unit 1101 adjusts the reference current Iref generated by the copy source circuit 1100b according to a mirror ratio of a current mirror circuit. A current Iref' obtained by adjusting the reference current Iref using the current adjustment unit 1101 is supplied to each of the pixels $10a_1, \ldots ,$ and $10a_n$ included in the pixel array unit 100, and is used as the recharge current Id of each of the light receiving elements $1000_1, \ldots ,$ and $1000_n$.

In the example of FIG. 15, the current adjustment unit 1101 includes transistors 1030, 1031, and 1040, transistors $1041_1$ to $1041_3$, transistors $1042_1$ to $1042_3$, and a transistor 1043. The current adjustment unit 1101 can be included in the pixel control unit 102, for example.

The transistor 1030 is a copy destination (current mirror destination) for the copy source circuit 1100b, and has a gate connected to a gate of the transistor 1020 of the copy source circuit 1100b. In addition, the transistor 1030 has a source connected to the power supply voltage Vdd and a drain connected to a source of the transistor 1031.

The transistor 1031 has the source set to a ground potential, a gate connected to a drain and commonly connected to gates of the transistors 1040 and $1041_1$ to $1041_3$. Sources of the transistors 1040 and $1041_1$ to $1041_3$ are set to a ground potential, a drain of the transistor 1040 is connected to a drain of the transistor 1043, and a drain of each of 1041$_1$ to 1041$_3$ is connected to a drain of the transistor 1043 via the source and drain of each of the transistors 1042$_1$ to 1042$_3$.

The transistors 1040 and 1041$_1$ to 1041$_3$, and the transistors 1042$_1$ to 1042$_3$ constitute a copy destination circuit which is a copy destination of the reference current Iref copied in the transistor 1030 when the transistor 1031 is a copy source.

In the copy destination circuit, the drains of the respective transistors 1040 and 1041$_1$ to 1041$_3$ (transistors 1042$_1$ to 1042$_3$), which are N-channel MOSFETs, are connected to the drain of the transistor 1043. A source of the transistor 1043 is connected to the power supply voltage Vdd. The drain of the transistor 1043 is further connected to a gate, and the gate is connected to each of gates of the transistors 1001$_1$, ..., and 1000$_n$ included in the pixels 10a$_1$, ..., and 10a$_n$. A current mirror circuit is formed by the transistor 1043 and the transistor 1001$_1$, and a current flowing from the source to the drain of the transistor 1043 is copied to a current flowing from the source to the drain of the transistor 1001$_1$.

Note that only the pixel 10a$_1$ is illustrated among the pixels 10a$_1$, ..., and 10a$_n$ in FIG. 15, and the other pixels are omitted.

Signals D$_0$ to D$_2$ are supplied from the outside to gates of the transistors 1042$_1$ to 1042$_3$, respectively. The transistors 1042$_1$ to 1042$_3$ are turned on and off when the signals D$_0$ to D$_2$ are in the high state and in the low state, respectively. The reference current Iref flowing between the drain and source of the transistor 1031 is copied to each of the transistor 1040 and the transistors 1041$_1$ to 1041$_3$ connected to the transistors 1042$_1$ to 1042$_3$ which are turned on among the transistors 1041$_1$ to 1041$_3$.

Therefore, a current flowing into the entire copy destination circuit is a sum of currents flowing into the transistors 1040 and the transistors 1041$_1$ to 1041$_3$ connected to the transistors 1042$_1$ to 1042$_3$ which are turned on among the transistors 1041$_1$ to 1041$_3$. For example, considering a predetermined coefficient α, the current flowing into the entire copy destination circuit is expressed by a current (α×Iref) using the reference current Iref flowing through the transistor 1031.

Here, sizes of the transistors 1031 and 1040 are set to 4 W/L and W/L, respectively, and sizes of the transistors 1041$_1$ to 1041$_3$ are set to W/L, 2 W/L, and 4 W/L, respectively. FIG. 16 is a table illustrating values of the coefficient α according to the on and off of the signals D$_0$, D$_1$, and D$_2$ in this case. In FIG. 16, on and off are illustrated as "1" and "0", respectively. In the example of FIG. 15, the transistor 1031 having the size of 4 W/L as a copy source and the transistor 1040 having the size of W/L as a copy destination are fixed, and the transistors 1041$_1$ to 1041$_3$ having the sizes of W/L, 2 W/L, and 4 W/L as copy destinations can be turned on and off individually. In this case, the values of the coefficient α can be set between "0.25" and "2" in increments of "0.25" as illustrated in FIG. 16.

The signals D$_0$, D$_1$, and D$_2$ are generated by the pixel control unit 102 based on, for example, an instruction of the overall control unit 103 and supplied to the current adjustment unit 1101. The values indicating the signals D$_0$, D$_1$, and D$_2$ may be written in a register provided in the pixel control unit 102 or the overall control unit 103. It is possible to adjust the recharge current Id according to the characteristic of each of the light receiving elements 1000 included in the pixel array unit 100 by appropriately setting the signals D$_0$, D$_1$, and D$_2$.

Third Modification of First Embodiment

Next, a third modification of the first embodiment will be described. The third modification of the first embodiment is an example in which a signal is taken out from an anode side of a SPAD which is the light receiving element 1000.

Figure 17:
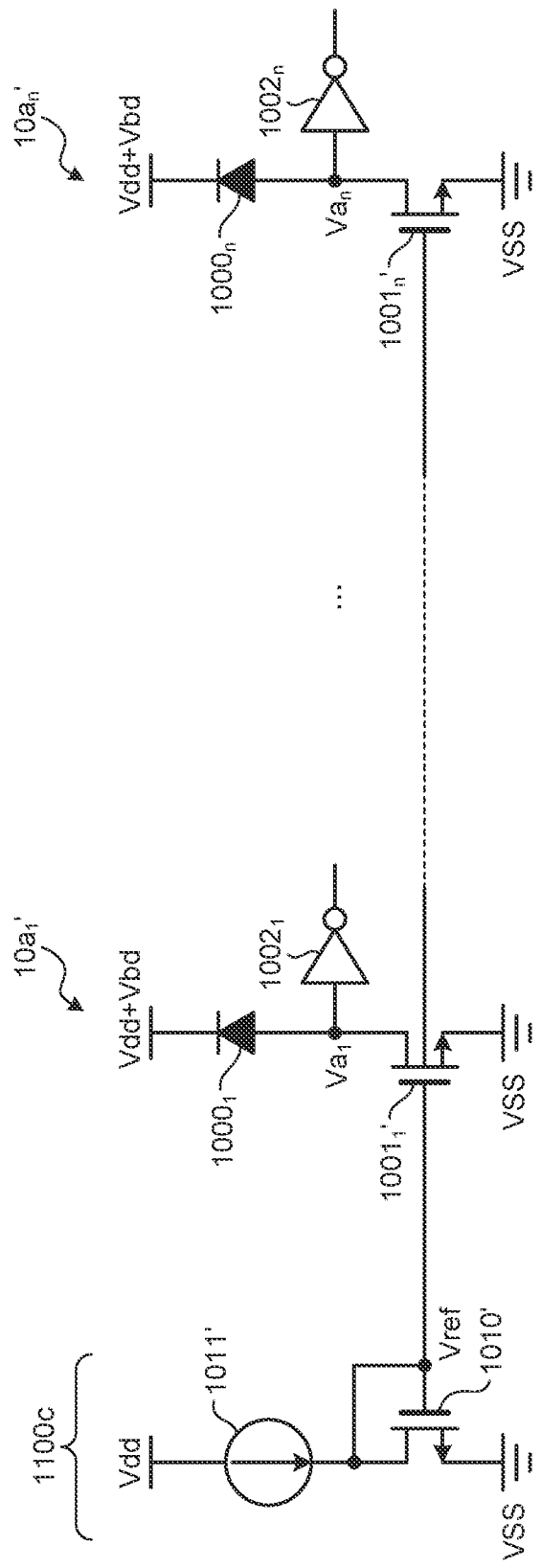
FIG. 17 is a diagram illustrating a circuit configuration of an example according to a third modification of the first embodiment.

FIG. 17 is a diagram illustrating a circuit configuration of an example according to the third modification of the first embodiment. The example of FIG. 17 corresponds to the above-described circuit configuration of FIG. 13, and a copy source circuit 1100c includes a transistor 1010' which is an N-channel MOSFET and a current source 1011'. One end of the current source 1011' is connected to the power supply voltage Vdd, and a current flows from the one end to the other end. The N-channel transistor 1010' has a source connected to the power supply voltage Vss and a drain connected to the other end of the current source 1011'. In addition, the drain and a gate of the transistor 1010' are connected, and the gate is further connected to gates of transistors 1001$_1$', ..., and 1001$_n$' included in pixels 10a$_1$', ..., and 10a$_n$', which are copy destination circuits, respectively.

The pixels 10a$_1$', ..., and 10a$_n$' include the transistors 1001$_1$, ..., and 1001$_n$, which are N-channel MOSFETs as the copy destinations of the current mirror circuit, respectively. In the pixel 10a$_1$', the transistor 1001$_1$' has a source connected to the power supply voltage Vss and a drain connected to an anode of the light receiving element 1000$_1$. In addition, a connection point between the drain of the transistor 1001$_1$' and the anode of the light receiving element 1000$_1$ is connected to an input end of the inverter 1002$_1$.

A cathode of the light receiving element 1000$_1$ is connected to a voltage (Vdd+Vbd) obtained by adding a voltage Vbd that is a breakdown voltage of the light receiving element 1000$_1$, which is a SPAD, to the power supply voltage Vdd. As a result, a potential across the light receiving element 1000$_1$ becomes the voltage (Vdd+Vbd) in a state where the light receiving element 1000$_1$ does not receive a photon. In this state, when the photon is received by the light receiving element 1000$_1$, avalanche multiplication is started and a current flows from the cathode to the anode of the light receiving element 1000$_1$, and accordingly, the potential across the light receiving element 1000$_1$ decreases so that the avalanche multiplication is stopped. Thereafter, the light receiving element 1000 is charged by the recharge current Id to which the reference current Iref of the copy source circuit 1100c is copied.

As described above, in the third modification of the first embodiment, the light receiving element 1000$_1$ is charged by the recharge current Id in which the reference current Iref of the copy source circuit 1100c is copied. Therefore, even when a signal is taken out from the anode side of the SPAD, which is the light receiving element 1000$_1$, the recharge current Id matches the reference current Iref of the current mirror source regardless of device parameters of the transistor 1001$_n$, and the recharge current Id is easily controlled, which enables more efficient photon detection. In addition, the reference current Iref of the current mirror source is copied as the recharge current Id even in the pixel 10a$_n$' similarly to the pixel 10a$_1$', and thus, a variation between pixels can be suppressed.

Second Embodiment

Next, a second embodiment of the present disclosure will be described. In the second embodiment, each of pixels 10b$_1$, ..., and 10b$_n$ is provided with a sample hold function for acquiring and holding a reference voltage Vref determined based on a reference current Iref in a copy source circuit 1100. In each of the pixels $10b_1, \ldots,$ and $10b_n$, light receiving elements $1000_1, \ldots,$ and $1000_n$ perform a recharging operation using a current based on the reference voltage Vref held by this sample hold function as a recharge current Id.

Figure 18:
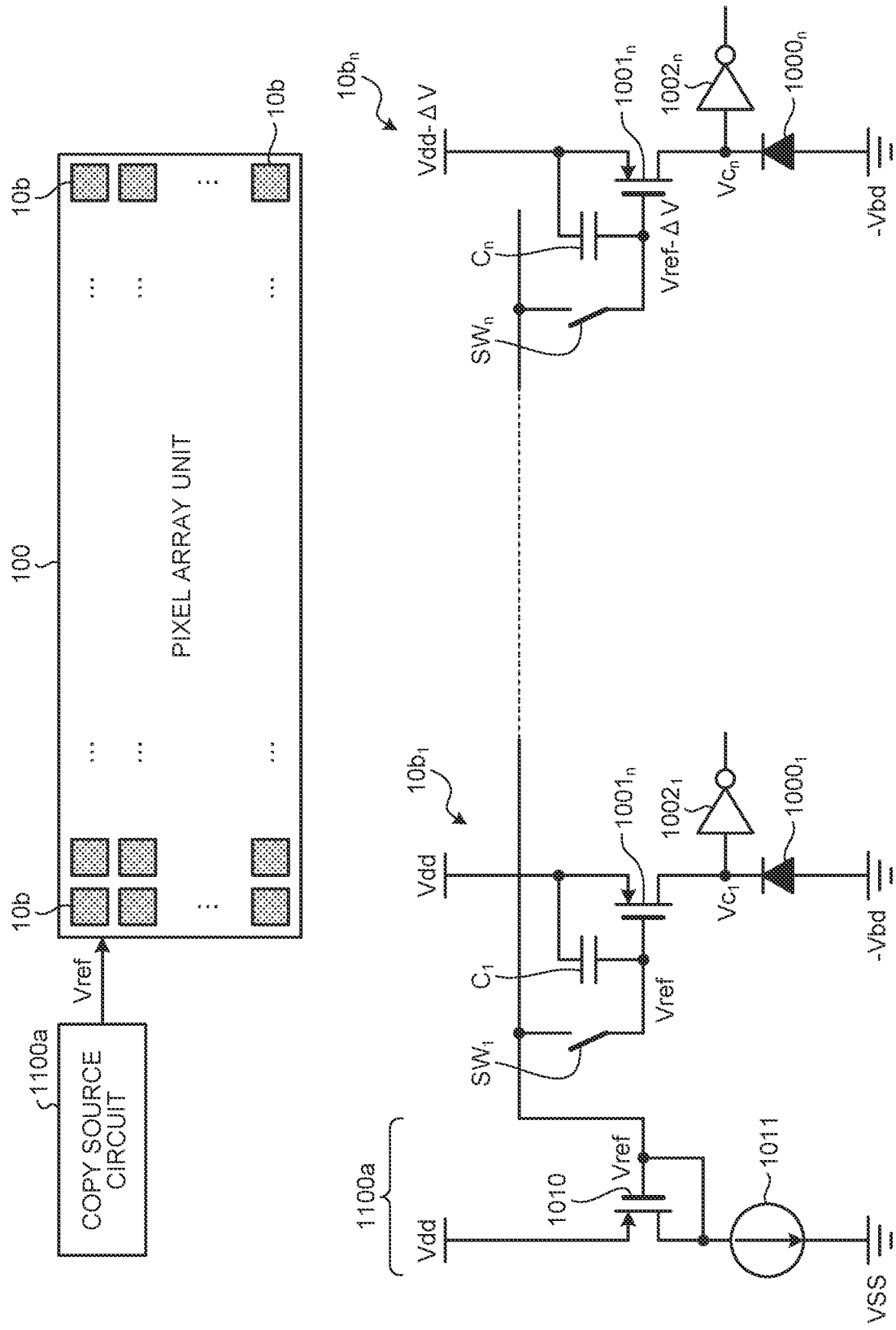
FIG. 18 is a diagram schematically illustrating a configuration of an example of a light reception device according to a second embodiment by paying attention to a pixel array unit.

FIG. 18 is a diagram schematically illustrating a configuration of an example of a light reception device according to the second embodiment by paying attention to a pixel array unit 100. In the second embodiment, a copy source circuit 1100a generates the reference current Iref used by each of the pixels 10b included in the pixel array unit 100 as the recharge current Id, and the reference voltage Vref determined by the reference current Iref is output as illustrated in the upper part of FIG. 18. This reference voltage Vref is supplied to and held by each of the pixels 10b included in the pixel array unit 100. In each of the pixels 10b, a current Iref' based on the held reference voltage Vref is used as the recharge current Id during the recharging operation.

The lower part of FIG. 18 illustrates a circuit configuration of an example of each of the pixels 10b according to the second embodiment. Note that the copy source circuit 1100a has the same configuration as the copy source circuit 1100a described with reference to FIG. 13, and thus, the description thereof will be omitted here. In addition, attention is paid to one row of the pixel array unit 100 in the lower part of FIG. 18, and the pixel 10b at a left end of the one row is illustrated as the pixel $10b_1$ and the pixel 10b at a right end is illustrated as the pixel $10b_n$.

The pixel $10b_1$ is includes a light receiving element $1000_1$ which is a SPAD, an inverter $1002_1$, and a transistor $1001_1$ which is a P-channel MOSFET. Further, the pixel $10b_1$ includes a switch $SW_1$ configured to realize the sample hold function according to the second embodiment, and a capacitor $C_1$.

In the pixel $10b_1$, the switch $SW_1$ has one end connected to a gate of a transistor 1010 in the copy source circuit 1100a, and the other end connected to one end of the capacitor $C_1$ and a gate of the transistor $1001_1$. The other end of the capacitor $C_1$ is connected to a source of the transistor $1001_1$. In addition, the source of the transistor $1001_1$ is also connected to a power supply voltage Vdd. A drain of the transistor $1001_1$ is connected to a cathode of the light receiving element $1000_1$, and an anode of the light receiving element $1000_1$ is connected to a voltage (−Vbd). A cathode voltage $Vc_1$ of the light receiving element $1000_1$ is input to an inverter $1002_1$.

In such a configuration of the pixel $10b_1$, on and off timings of the switch $SW_1$ are controlled according to an operation of the light receiving element $1000_1$. In an on state of the switch $SW_1$, the capacitor $C_1$ is charged with the reference voltage Vref. In addition, in an off state of the switch $SW_1$, the cathode of the light receiving element $1000_1$ is charged using the current Iref' determined by a voltage Vref' across the capacitor $C_1$ as the recharge current Id.

Here, in the on state of the switch $SW_1$, the gate of the transistor $1001_1$ is set to a floating state, and a gate-source voltage of the transistor $1001_1$ (hereinafter referred to as a voltage $V_{GS}$) matches the voltage across the capacitor $C_1$. Therefore, the voltage $V_{GS}$ of the transistor $1001_1$ can maintain a constant value with respect to a variation of the power supply voltage Vdd, and the current Iref' determined by the voltage $V_{GS}$ also becomes a constant value.

The pixel $10b_n$ is also similarly configured, and includes the light receiving element $1000_n$ which is a SPAD, an inverter $1002_n$ to which the cathode voltage $Vc_n$ of the light receiving element $1000_n$ is input, a transistor $1001_n$ which is a P-channel MOSFET, and a switch $SW_n$ and a capacitor $C_n$ to realize the sample hold function. Since an operation in the pixel $10b_n$ is the same as the operation in the pixel $10b_1$ described above, the description thereof will be omitted here.

In the second embodiment, the reference voltage Vref is held in each of the pixels $10b_1, \ldots,$ and $10b_n$ in this manner, and the recharge current Id is generated based on the held reference voltage Vref. At this time, the gates of the transistors $1001_1, \ldots,$ and $1001_n$, which are current sources for the light receiving elements $1000_1, \ldots,$ and $1000_n$ included in the respective pixels $10b_1, \ldots,$ and $10b_n$, are set to the floating state. Therefore, it is possible to suppress a variation of the voltage $V_{GS}$ between the gate and source of the transistor $1001_n$ caused by a voltage drop $\Delta V_{drop}$ depending on the distance from the power supply voltage Vdd in the pixel $10_n$ far from the supply position of the power supply voltage Vdd, which has been described with reference to FIG. 12. As a result, the uniformity of a characteristic of the pixel array unit 100 in a light reception surface can be improved, and the pixel array unit 100 can more efficiently detect a photon.

Figure 19:
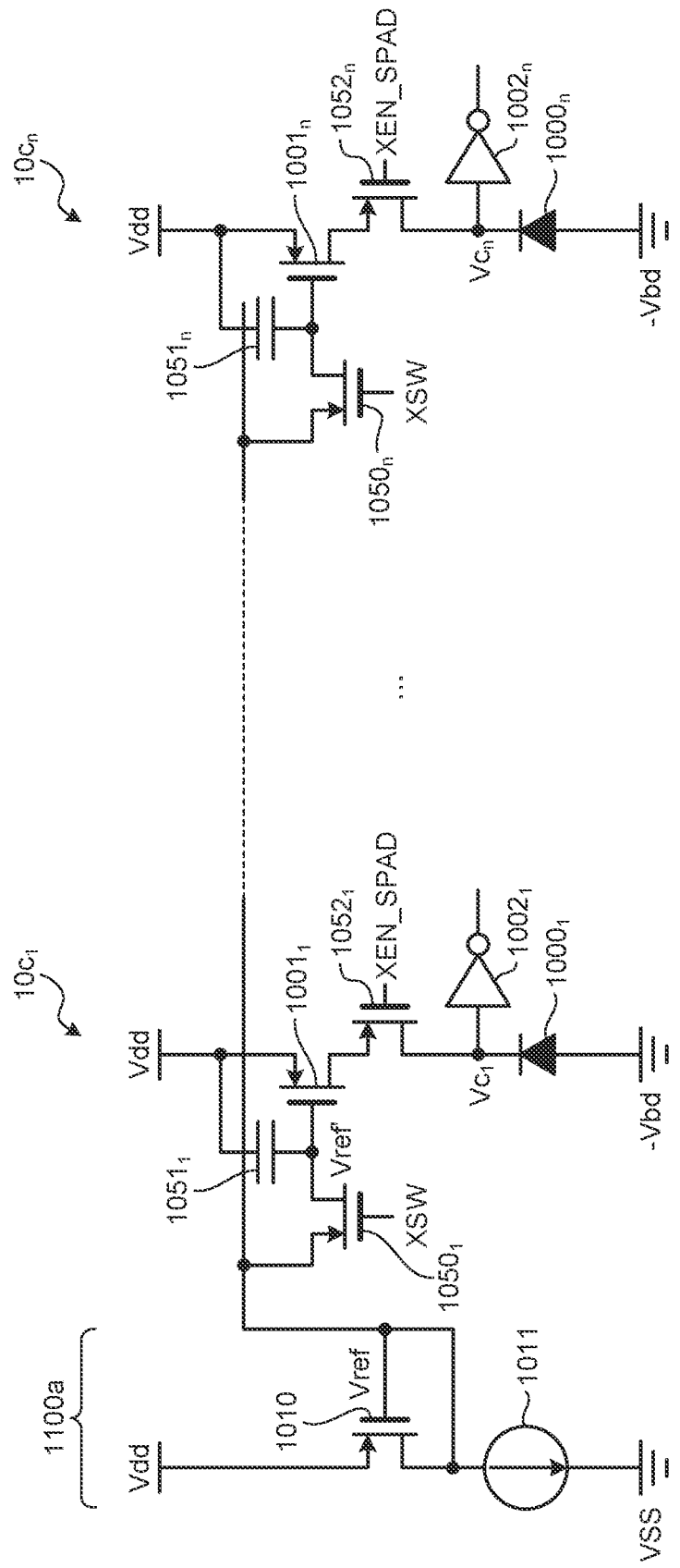
FIG. 19 is a diagram illustrating an example of a more specific circuit configuration of the configuration according to the second embodiment.

FIG. 19 is a diagram illustrating an example of a more specific circuit configuration of the configuration according to the second embodiment. The configuration illustrated in FIG. 19 corresponds to the lower diagram of FIG. 18 described above, and illustrates partial configurations of the switch $SW_1$ and the capacitor $C_1$, the switch $SW_n$, and the capacitor $C_n$ in the lower diagram of FIG. 18 in more details. Note that the copy source circuit 1100a in FIG. 19 has the same configuration as the copy source circuit 1100a described with reference to FIG. 13, and thus, the description thereof will be omitted here. In addition, attention is paid to one row of the pixel array unit 100 in FIG. 19, a pixel at a left end of the one row is illustrated as a pixel $10c_1$, and a pixel at a right end is illustrated as a pixel $10c_n$.

When attention is paid to the pixel $10c_1$, the pixel $10c_1$ includes a light receiving element $1000_1$, a transistor $1001_1$ and an inverter $1002_1$, which is similar to the lower diagram of FIG. 18. The pixel $10c_1$ further includes transistors $1050_1$ and $1052_1$, which are P-channel MOSFETs, and a capacitor $1051_1$.

The transistor $1050_1$ has a source connected to the gate of the transistor 1010 in the copy source circuit 1100a and a drain connected to the gate of the transistor $1001_1$. A control signal XSW is input to a gate of the transistor $1050_1$. The transistor 1001 and the transistor 1010 of the copy source circuit 1100a form a current mirror circuit via the transistor $1050_1$ when the transistor $1050_1$ is turned on by the control signal XSW.

In addition, the drain of the transistor $1001_1$ is connected to a source of the transistor $1052_1$, and a drain of the transistor $1052_1$ is connected to the cathode of the light receiving element $1000_1$. A connection point between the drain of the transistor $1052_1$ and the cathode of the light receiving element $1000_1$ is connected to an input end of the inverter $1002_1$. A control signal XEN_SPAD is input to a gate of the transistor $1052_1$.

One end of the capacitor $1051_1$ is connected to a connection point between the drain of the transistor $1050_1$ and the gate of the transistor $1001_1$. The other end of the capacitor $1051_1$ is connected to the power supply voltage Vdd.

Note that the signals XSW and _SPAD are generated by a pixel control unit 102, for example, according to an instruction of an overall control unit 103 and supplied to the pixel array unit 100. Each of the signals XSW and XEN_SPAD supplied to the pixel array unit 100 is supplied to each of the pixels $10c_1, \ldots,$ and $10c_n$ included in the pixel array unit 100.

Figure 20:
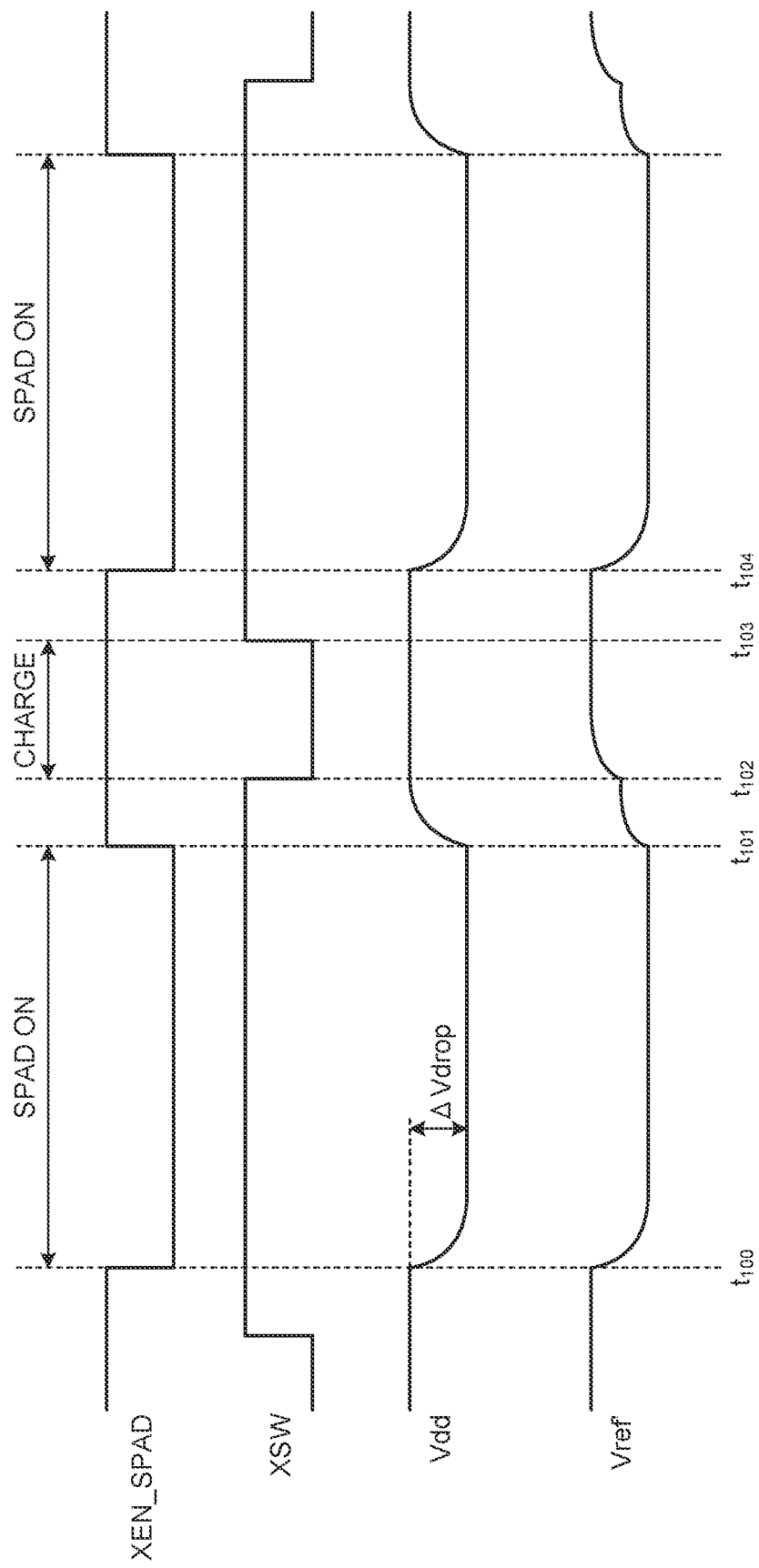
FIG. 20 is a view illustrating an example of an operation waveform in the configuration according to the second embodiment.

FIG. 20 is a view illustrating an example of an operation waveform in the configuration according to the second embodiment illustrated in FIG. 19. The signal XEN_SPAD, the signal XSW, the power supply voltage Vdd, and the voltage Vref' at one end of the capacitor $1051_1$ are illustrated from the top in FIG. 20. In addition, the transistor $1052_1$ is turned off and on in a high state and a low state of the control signal XEN_SPAD, respectively. The transistor $1050_1$ is turned off and on in a high state and a low state of the control signal XSW, respectively.

In FIG. 20, in the initial state, the control signal XEN_SPAD is set to be high, the transistor $1001_1$ and the light receiving element $1000_1$ are disconnected, the control signal XSW is set to be low, and the capacitor $1051_1$ is charged with the reference voltage Vref. Thereafter, the pixel control unit 102 shifts the control signal XSW from the low state to the high state. As a result, the capacitor $1051_1$ and the reference voltage Vref are disconnected, and the reference voltage Vref is held in the capacitor $1051_1$.

At time $t_{100}$, the pixel control unit 102 shifts the control signal XEN_SPAD from the high state to the low state and turns on the transistor $1052_1$. The transistor $1050_1$ remains in the off state. As a result, the gate of the transistor $1001_1$ is set to the floating state. A potential of the gate of the transistor $1001_1$ becomes the voltage Vref' based on the reference voltage Vref held in the capacitor $1051_1$. At time $t_{100}$, the power supply voltage Vdd is supplied to the cathode of the light receiving element $1000_1$, and the light receiving element $1000_1$ is set to a state where avalanche multiplication according to photon reception can be started.

Here, a photon is received by the light receiving element $1000_1$, the avalanche multiplication is started, a large current flows from the cathode to the anode, and a potential of the cathode decreases. The avalanche multiplication stops when the potential of the cathode decreases to the voltage (−Vbd). In the light receiving element $1000_1$, the current Iref' corresponding to the voltage Vref' supplied from the capacitor $1051_1$ to the gate of the transistor $1001_1$ flows through the transistors $1001_1$ and $1052_1$. In the light receiving element $1000_1$, the recharging operation is performed using this current Iref' as the recharge current Id.

Here, the power supply voltage Vdd varies due to the influence of the operation of the light receiving element $1000_1$. In addition, the power supply voltage Vdd changes depending on a position of the pixels $10c_1, \ldots,$ and $10c_n$ in the pixel array unit 100. For example, the power supply voltage Vdd causes the voltage drop $\Delta V_{drop}$ depending on the position in the pixel array unit 100.

When the control signal XEN_SPAD is in the low state and the light receiving element $1000_1$ is in the middle of operating (time $t_{100}$ to $t_{101}$, period SPAD ON), the control signal XSW is in the high state, the transistor $1050_1$ is turned off, and the gate of the transistor $1001_1$ is in the floating state. Therefore, the voltage Vref' supplied to the gate of the transistor $1001_1$ varies depending on the variation of the power supply voltage Vdd, and the voltage $V_{GS}$ of the transistor $1001_1$ becomes equal to the voltage across the capacitor $1051_1$.

Therefore, the current Iref', which is a constant current, flows between the source and drain of the transistor $1001_1$ according to the voltage $V_{GS}$. As the recharging operation is performed using this current Iref' as the recharge current Id, it is easy to control the recharge current Id in the pixels $10c_1, \ldots,$ and $10c_n$. As a result, it is possible to more efficiently detect the photon in the pixel $10c_1$.

The pixel control unit 102 shifts the control signal XEN_SPAD from the low state to the high state at a timing when the recharging operation of the light receiving element $1000_1$ ends (time $t_{101}$). As a result, the light receiving element $1000_1$ is disconnected from the power supply voltage Vdd, so that the operation of the light receiving element $1000_1$ is stopped. When the operation of the light receiving element $1000_1$ is stopped, the power supply voltage Vdd gradually increases and returns to the original value. The voltage Vref' also increases along with the increase of the power supply voltage Vdd. Here, since an electric charge stored in the capacitor $1051_1$ decreases due to a leakage or the like, an increase width of the voltage Vref' is smaller than an increase width of the power supply voltage Vdd.

After time $t_{101}$, the pixel control unit 102 shifts the control signal XSW from the high state to the low state at time $t_{112}$. The control signal XEN_SPAD remains in the high state. As a result, the capacitor $1051_1$ is charged with the reference voltage Vref, and the voltage Vref' returns to the voltage of the reference voltage Vref (period CHARGE).

The pixel control unit 102 shifts the control signal XSW from the low state to the high state at a timing when the charging of the capacitor $1051_1$ is completed (time $t_{103}$). As a result, the capacitor $1051_1$ is disconnected from the reference voltage Vref, and the gate of the transistor $1001_1$ is set to the floating state.

The pixel control unit 102 shifts the control signal XEN_SPAD from the high state to the low state at time $t_{104}$ after a lapse of a predetermined time from time $t_{103}$. An operation after time $t_{104}$ is the same as the operation from time $t_{100}$ described above. The pixel control unit 102 controls the control signals XSW and XEN_SPAD such that the above-described operation from time $t_{100}$ to time $t_{104}$ is repeatedly executed for each of the pixels $10c_1, \ldots,$ and $10c_n$ included in the pixel array unit 100.

Note that a configuration of the pixel $10c_n$ is the same as that of the pixel $10c_1$. That is, the pixel $10c_n$ includes the light receiving element $1000_n$, the transistor $1001_n$, and the inverter $1002_n$ into which the cathode voltage $Vc_n$ of the light receiving element $1000_n$ is input. The pixel $10c_n$ further includes the transistors $1050_1$ and $1052_1$, which are P-channel MOSFETs, and the capacitor $1051_1$. Since a connection and an operation of the pixel $10c_n$ are the same as those of the pixel $10c_1$ described above, the description thereof will be omitted here.

First Modification of Second Embodiment

Next, a first modification of the second embodiment will be described. The first modification of the second embodiment is an example in which the transistor $1052_1$ connected in series with, for example, the transistor $1001_1$, which form the copy destination circuit by the current mirror, is not used in the configuration of FIG. 19 described above.

Figure 21:
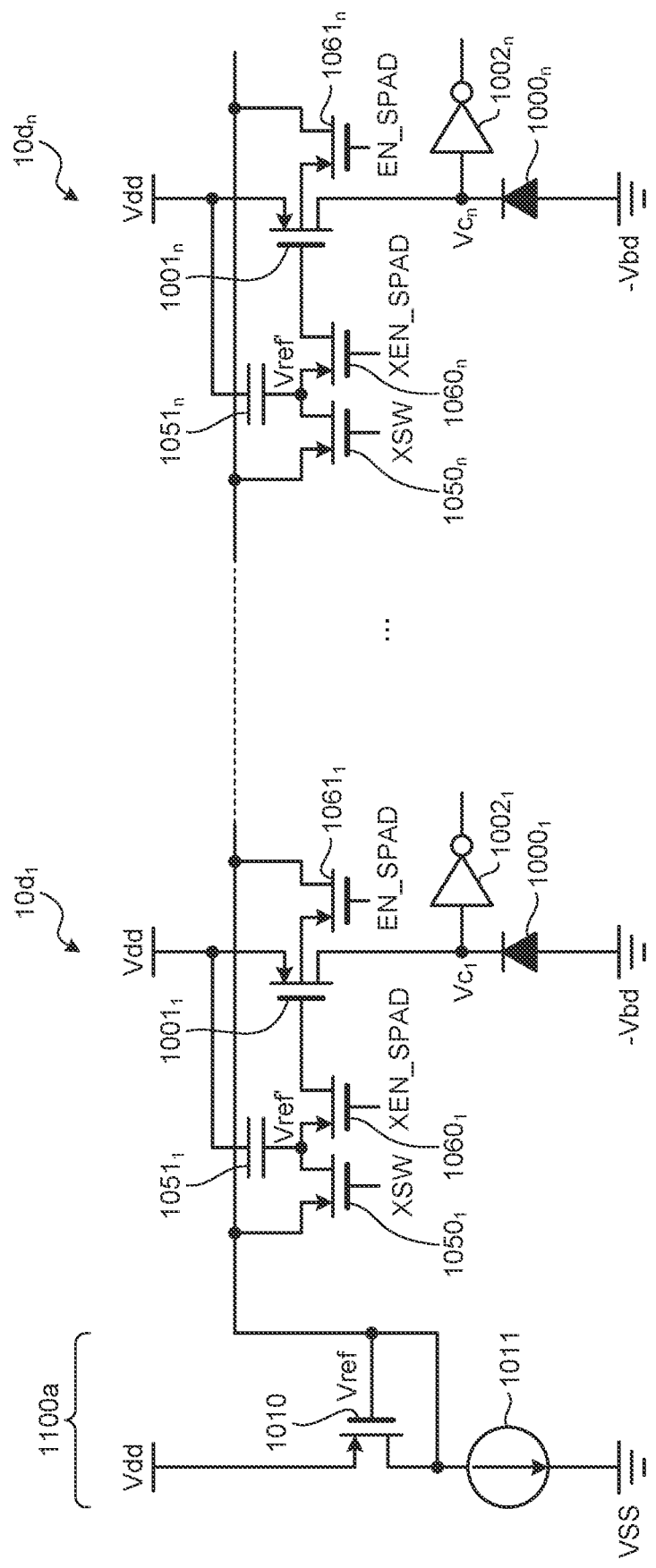
FIG. 21 is a diagram illustrating an example of a circuit configuration according to a first modification of the second embodiment.

FIG. 21 is a diagram illustrating an example of a circuit configuration according to the first modification of the second embodiment. Note that the copy source circuit 1100a in FIG. 21 has the same configuration as the copy source circuit 1100a described with reference to FIG. 13, and thus, the description thereof will be omitted here. In addition, attention is paid to one row of the pixel array unit 100 in FIG. 21, a pixel at a left end of the one row is illustrated as a pixel $10d_1$, and a pixel at a right end is illustrated as a pixel $10d_n$.

When attention is paid to the pixel $10d_1$, transistor $1052_1$ is omitted and transistors $1060_1$ and $1061_1$, which are P-channel MOSFETs, are added in the pixel $10d_1$ as compared with the pixel $10c_1$ described with reference to FIG. 19.

In FIG. 21, a source of the transistor $1060_1$ is connected to a connection point between the transistor $1050_1$ and the capacitor $1051_1$, and a drain of the transistor $1060_1$ is connected to a gate of the transistor $1001_1$. In addition, the control signal XEN_SPAD is supplied to a gate of the transistor $1060_1$. That is, the gate of the transistor $1001_1$ is connected to one end of the capacitor $1051_1$ via the transistor $1060_1$ that is controlled to be on and off by the control signal XEN_SPAD.

The transistor $1061_1$ has a source connected to the gate of the transistor $1001_1$ and a drain connected to the reference voltage Vref. In addition, a control signal EN_SPAD is supplied to a gate of the transistor $1061_1$. The control signal EN_SPAD is generated by the pixel control unit 102 according to an instruction of the overall control unit 103, and is supplied to the gate of the transistor $1061_1$, for example.

Figure 22:
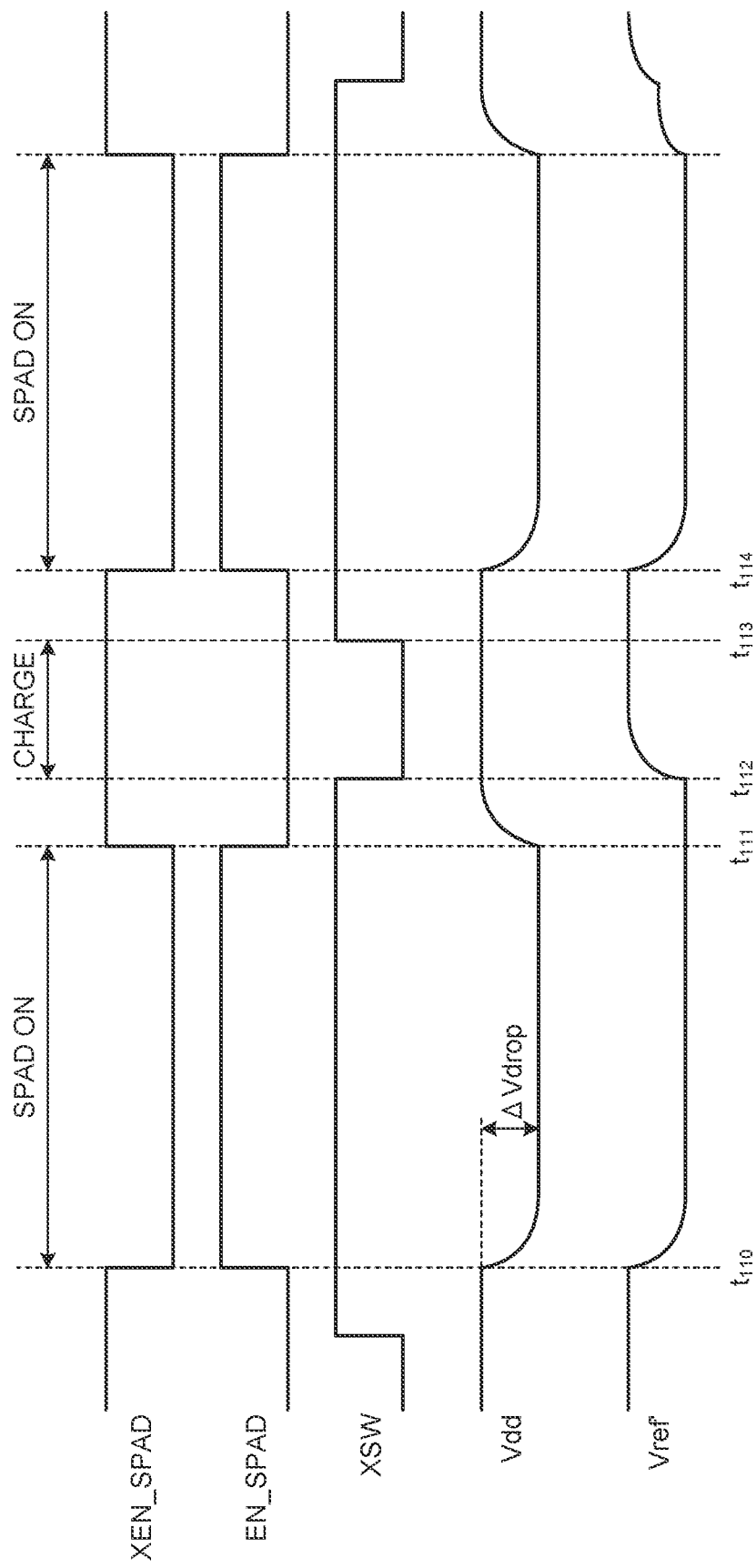
FIG. 22 is a view illustrating an example of an operation waveform in the configuration according to the first modification of the second embodiment.

FIG. 22 is a view illustrating an example of an operation waveform in the configuration according to the first modification of the second embodiment illustrated in FIG. 21. Note that the meaning of each part in FIG. 22 is the same as that in FIG. 20 described above, and thus, the description thereof will be omitted here.

In FIG. 22, control of the control signals XEN_SPAD and XSW is the same as that in FIG. 20 described above. In the case of FIG. 22, an operation of the light receiving element $1000_1$ is controlled by controlling supply of the voltage Vref' to the transistor $1001_1$ according to the control signal XEN_SPAD.

More specifically, the pixel control unit 102 sets the control signal XEN_SPAD to a low state and turns on the transistor $1060_1$ during a period from time $t_{110}$ to till. The gate of the transistor $1001_1$ is set to a floating state, and a voltage of the gate becomes the voltage Vref' based on the reference voltage Vref held in the capacitor $1051_1$. As a result, the power supply voltage Vdd is supplied to a cathode of the light receiving element $1000_1$ during the period from time $t_{110}$ to $t_{111}$, and the current Iref' corresponding to the voltage Vref' flows through the transistors $1001_1$ and $1052_1$. The light receiving element $1000_1$ is in a state where avalanche multiplication according to photon reception can be started.

The pixel control unit 102 controls the control signal EN_SPAD to a state exclusive to the control signal XEN_SPAD. The pixel control unit 102 shifts the control signal EN_SPAD from a low state to a high state at time $t_{110}$, and disconnects the gate of the transistor 1001 from the reference voltage Vref.

At time $t_{111}$, the pixel control unit 102 shifts the control signal XEN_SPAD from the low state to the high state, and disconnects one end of the capacitor $1051_1$ from the gate of the transistor $1001_1$. In addition, the pixel control unit 102 shifts the control signal EN_SPAD from the high state to the low state at time $t_{111}$, and connects the gate of the transistor $1001_1$ to the reference voltage Vref. As a result, the cathode voltage $Vc_1$ of the light receiving element $1000_1$ decreases, and the state in which the avalanche multiplication of the light receiving element $1000_1$ can be started is released.

Note that the control signals XSW and XEN_SPAD are both in the high state at time $t_{111}$, and each of the transistors $1050_1$ and $1060_1$ is turned off, so that the capacitor $1051_1$ is disconnected from the circuit. Therefore, a voltage of the capacitor $1051_1$ does not change from a value immediately before time $t_{111}$.

The pixel control unit 102 shifts the control signal XSW from the high state to the low state at time $t_{112}$, and turns on the transistor $1050_1$. As a result, the capacitor $1051_1$ is connected to the reference voltage Vref, and charging with the reference voltage Vref of the capacitor $1051_1$ is started. The charging of the capacitor $1051_1$ with the reference voltage Vref is continued until the control signal XSW is set to the high state at time $t_{113}$ by the pixel control unit 102.

The pixel control unit 102 shifts the control signal XEN_SPAD from the high state to the low state and shifts the control signal EN_SPAD from the low state to the high state at time $t_{114}$ after a lapse of a predetermined time from time $t_{113}$. An operation after time $t_{114}$ is the same as the operation from time $t_{110}$ described above. The pixel control unit 102 controls the control signals XSW, XEN_SPAD, and EN_SPAD such that the above-described operation from time $t_{110}$ to time $t_{114}$ is repeatedly executed for each of the pixels $10d_1, \ldots,$ and $10d_n$ included in the pixel array unit 100.

In the first modification of the second embodiment, for example, the pixel $10d_1$ has no transistor connected in series with transistor $1001_1$, such as the transistor $1052_1$ with FIG. 19. Therefore, it is advantageous for the configuration described with reference to FIG. 19 when each of the pixels $10d_1, \ldots,$ and $10d_n$ is operated at a low voltage.

Note that a configuration of the pixel $10d_n$ is the same as that of the pixel $10d_1$. That is, transistor $1052_n$ is omitted and transistors $1060_n$ and $1061_n$, which are P-channel MOSFETs, are added in the pixel $10d_n$ as compared with the pixel $10c_n$ described with reference to FIG. 19. Since a connection and an operation of the pixel $10d_n$ are the same as those of the pixel $10d_1$ described above, the description thereof will be omitted here.

Second Modification of Second Embodiment

Figure 23:
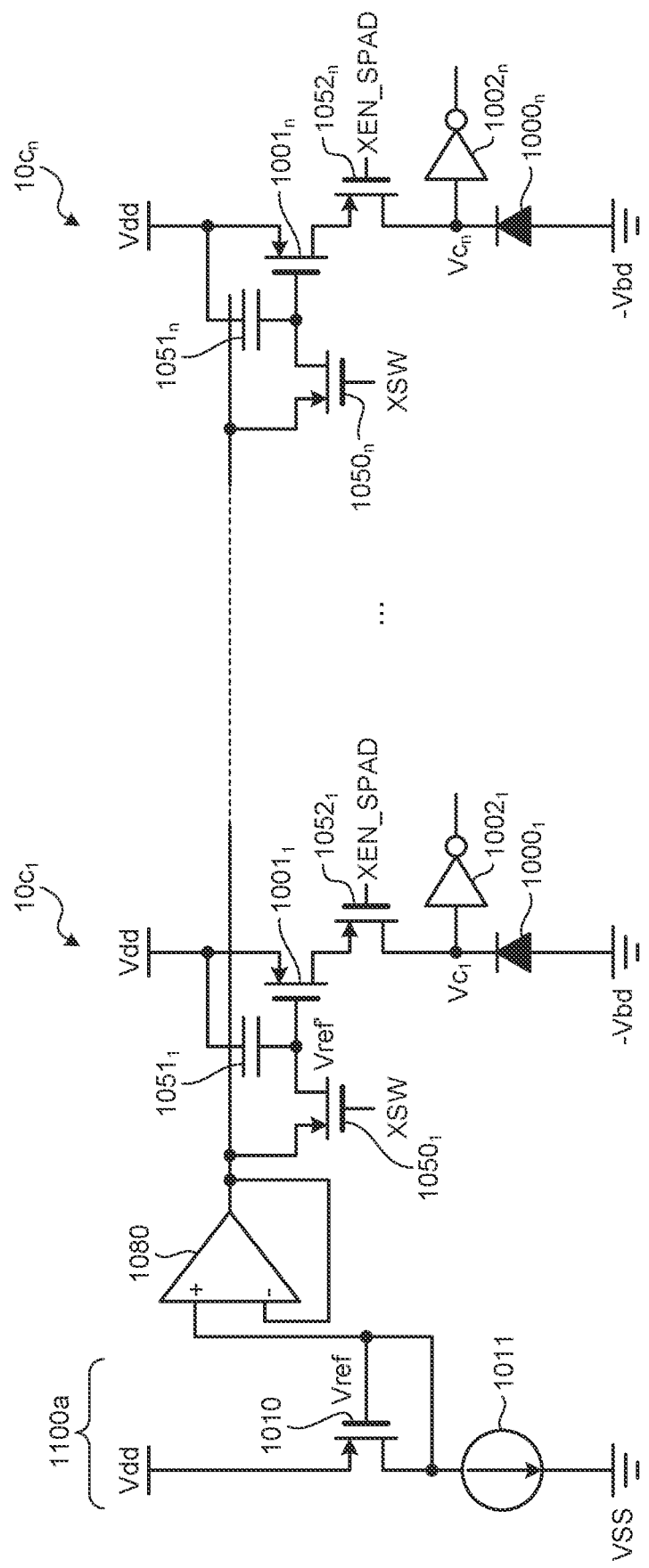
FIG. 23 is a diagram illustrating an example of a circuit configuration according to a second modification of the second embodiment.

Next, a second modification of the second embodiment will be described. FIG. 23 is a diagram illustrating an example of a circuit configuration according to the second modification of the second embodiment. In FIG. 23, the copy source circuit 1100a and the respective pixels $10c_1, \ldots,$ and $10c_n$ are the same as the copy source circuit 1100a and the respective pixels $10c_1, \ldots,$ and $10c_n$ described with reference to FIG. 19, and thus, the description thereof will be omitted here.

As illustrated in FIG. 23, the second modification of the second embodiment provides a buffer amplifier 1080 between the copy source circuit 1100a and the pixels $10c_1, \ldots,$ and $10c_n$ in the configuration of the second embodiment described above. The reference voltage Vref output from the copy source circuit 1100a is supplied to each of the pixels $10c_1, \ldots,$ and $10c_n$ via the buffer amplifier 1080. With reference to FIG. 20 above, charging of each of the capacitors $1051_1, \ldots,$ and $1051_n$ in each of the pixels $10c_1, \ldots,$ and $10c_n$ during the period CHARGE from time $t_{102}$ to $t_{103}$ is performed with the reference voltage Vref output from this buffer amplifier 1080.

For example, in the configuration of FIG. 19 described above, the capacitors $1051_1, \ldots,$ and $1051_n$ are charged by directly using the reference voltage Vref output from the copy source circuit 1100a. Therefore, for example, when the number of the pixels $10c_1, \ldots,$ and $10c_n$ is large, the current supplied to each of the capacitors $1051_1, \ldots,$ and $1051_n$, becomes small, so that there is a risk that the time required for the charging of each of the capacitors $1051_1$, . . . , and $1051_n$ becomes long.

In the second modification of the second embodiment, the charging of each of the capacitors $1051_1$, . . . , and $1051_n$ is performed with the reference voltage Vref output from the buffer amplifier 1080. Therefore, the buffer amplifier 1080 can drive the charging of each of the capacitors $1051_1$, . . . , and $1051_n$, and the charging time of each of the capacitors $1051_1$, . . . , and $1051_n$ can be shortened.

Note that the configuration in which the buffer amplifier 1080 is provided between the copy source circuit 1100a and the transistor $1001_1$ which is a copy destination circuit can also be applied to the configuration according to the first embodiment described above. For example, in the lower diagram of FIG. 13 described above, a configuration in which the buffer amplifier 1080 is inserted between the copy source circuit 1100a and the transistor $1001_1$ is conceivable.

Third Modification of Second Embodiment

Next, a third modification of the second embodiment will be described. The third modification of the second embodiment is an example in which a current mirror circuit is cascode-connected (connected in cascade) to form a copy source circuit.

Figure 24:
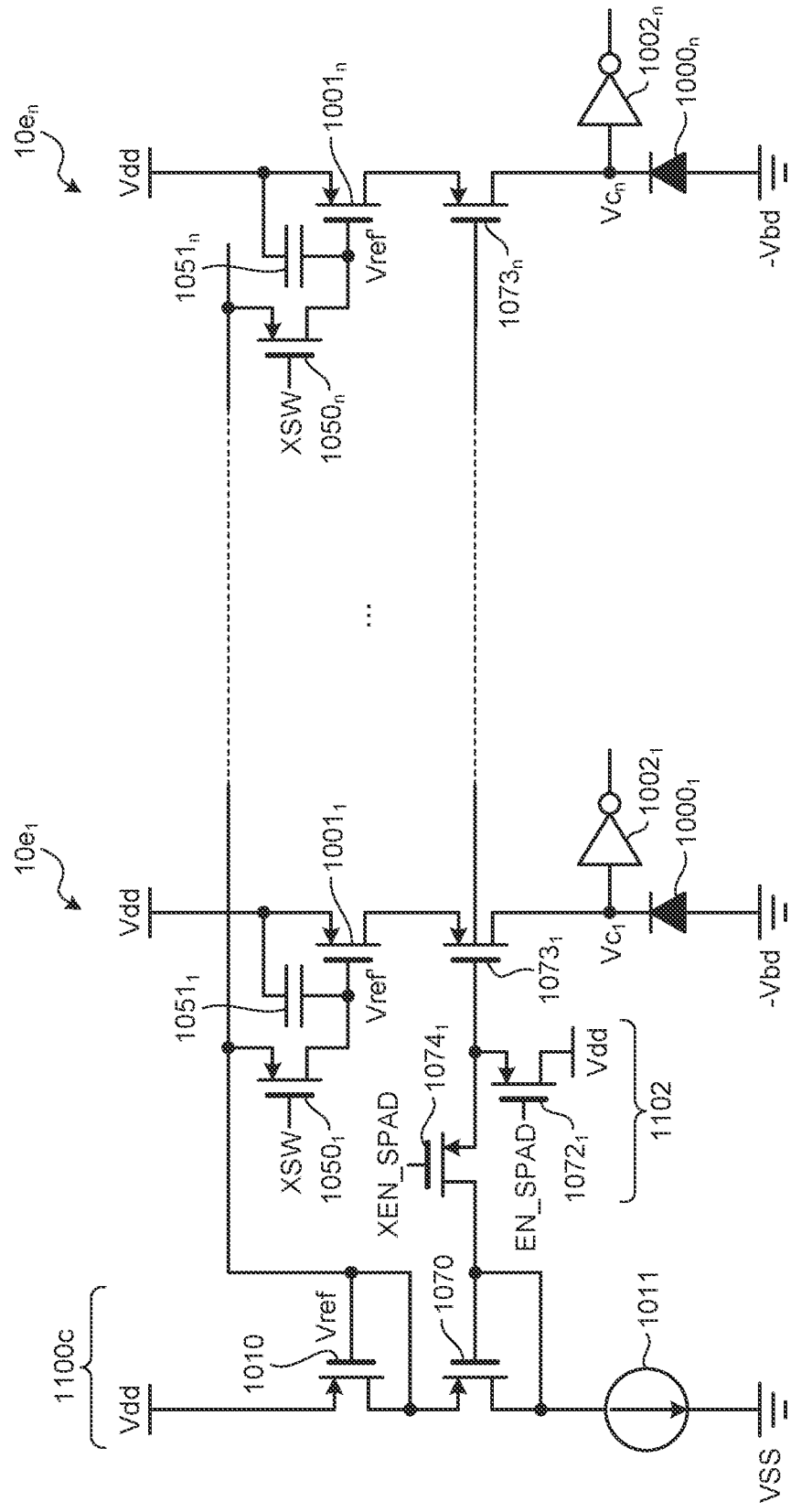
FIG. 24 is a diagram illustrating a circuit configuration of an example according to a third modification of the second embodiment.

FIG. 24 is a diagram illustrating a circuit configuration of an example according to the third modification of the second embodiment. The configuration illustrated in FIG. 24 includes a copy source circuit 1100c, an operation control circuit 1102, and pixels $10e_1$, . . . , and $10e_n$.

The copy source circuit 1100c includes two transistors 1010 and 1070 connected in cascade, and a current source 1011. In the transistor 1010, a source is connected to the power supply voltage Vdd, a gate and a drain are connected, and the drain is connected to a source of the transistor 1070. In the transistor 1070, a gate and a drain are connected, and the drain is connected to one end of the current source 1011. The other end of the current source 1011 is connected to a power supply voltage VSS. The current source 1011 can be configured using a reference voltage generation circuit such as a BGR circuit. A gate voltage of the transistor 1010 is set as the reference voltage Vref. In each of the transistors 1010 and 1070, the reference current Iref corresponding to the reference voltage Vref flows from the source to the drain.

The pixel $10e_1$ includes the light receiving element $1000_1$, the inverter $1002_1$, the transistors $1001_1$ and $1050_1$ and a transistor $1073_1$, which are P-channel MOSFETs, and the capacitor $1051_1$.

The transistors $1001_1$, $1050_1$, and $1073_1$ correspond to, for example, the transistors $1001_1$, $1050_1$, and $1052_1$ described with reference to FIG. 19, respectively. A source of the transistor $1050_1$ is connected to a gate of the transistor 1010, and the reference voltage Vref is supplied. The control signal XSW is input to a gate of the transistor $1050_1$, and a drain is connected to one end of capacitor $1051_1$ and to a gate of the transistor $1001_1$. A source of the transistor $1001_1$ is connected to the power supply voltage Vdd and is connected to the other end of the capacitor $1051_1$.

A drain of the transistor $1001_1$ is connected to a source of the transistor $1073_1$. A drain of the transistor $1073_1$ is connected to a cathode of the light receiving element $1000_1$, and an anode of the light receiving element $1000_1$ is connected to the voltage (−Vbd). A gate of the transistor $1073_1$ is connected to the gate of the transistor 1070 of the copy source circuit 1100c via the operation control circuit 1102.

The cathode voltage $Vc_1$ of the light receiving element $1000_1$ is input to the inverter $1002_1$.

The operation control circuit 1102 includes transistors $1072_1$ and $1074_1$ configured using P-channel MOSFETs, respectively. The transistor $1074_1$ has a drain connected to the gate of the transistor 1070 in the copy source circuit 1100c and a source connected to the gate of the transistor $1073_1$. The control signal XEN_SPAD is input to a gate of the transistor $1074_1$. A source of the transistor $1072_1$ is connected to a connection point between the source of the transistor $1074_1$ and the gate of the transistor $1073_1$. The source of the transistor $1072_1$ is connected to the power supply voltage Vdd. The control signal EN_SPAD is input to the gate of the transistor $1072_1$.

When the transistor $1050_1$ is turned on in response to the control signal XSW in the pixel $10e_1$, a current mirror circuit in which the transistor 1010 is a copy source and the transistor $1050_1$ is a copy destination is formed by the transistor $1001_1$ and the transistor 1010 of the copy source circuit 1100c. In addition, when the transistor $1074_1$ is turned on in response to the control signal XEN_SPAD and the transistor $1072_1$ is turned off in response to the control signal EN SPAD in the pixel $10e_1$, a current mirror circuit in which the transistor 1070 is a copy source and the transistor $1073_1$ is a copy destination is formed by the transistor $1073_1$ and the transistor 1070 of the copy source circuit 1100c.

Each of the control signals XSW, XEN_SPAD, and EN_SPAD is generated by the pixel control unit 102 according to an instruction of the overall control unit 103, for example. Control of the high state and the low state of each of the control signals XSW, XEN_SPAD, and EN_SPAD is the same as the control according to the first modification of the second embodiment described with reference to FIG. 22, and thus, the description thereof will be omitted here.

An effect of the configuration according to the third modification of the second embodiment will be described in comparison with the configuration according to the first modification of the second embodiment described with reference to FIGS. 21 and 22. In the configuration of FIG. 21, the light receiving element $1000_1$ operates during the period from $t_{110}$ to $t_{111}$ (see FIG. 22) when the control signal XEN_SPAD is in the low state, and the recharge current Id corresponding to the voltage Vref' of the capacitor $1051_1$ is supplied to the light receiving element $1000_1$. At this time, avalanche multiplication is started in response to reception of a photon in the light receiving element $1000_1$, and accordingly, the cathode voltage $Vc_1$ varies greatly. There is a possibility that this variation of the cathode voltage $Vc_1$ affects the voltage Vref' supplied by the capacitor $1051_1$.

On the other hand, in the configuration of the third modification of the second embodiment illustrated in FIG. 24, the transistor $1073_1$ is interposed between the cathode of the light receiving element $1000_1$ and the drain of the transistor $1001_1$ to which the voltage Vref' is supplied by the capacitor $1051_1$. Since the transistor $1073_1$ is interposed, the influence of the cathode voltage $Vc_1$ on the voltage Vref' is mitigated. As a result, the recharge current Id is easily controlled, so that a dead time can be easily set to an appropriate value.

Note that the pixel $10e_n$ includes the light receiving element $1000_n$, the inverter $1002_n$, the transistor $1001_n$, transistors $1050_n$ and $1073_n$, and the capacitor $1051_n$ corresponding to the above-described light receiving element $1000_1$, inverter $1002_1$, transistor $1001_1$, $1050_1$, and $1073_1$, and capacitor $1051_1$ of the pixel $10e_1$, respectively. Since a connection of each of parts of the pixel $10e_n$ is the same as the connection of each of the corresponding parts of the pixel $10e_1$, the description thereof will be omitted here.

Fourth Modification of Second Embodiment

Next, a fourth modification of the second embodiment will be described. The fourth modification of the second embodiment is an example in which a signal is taken out from an anode side of a SPAD which is the light receiving element 1000.

Figure 25:
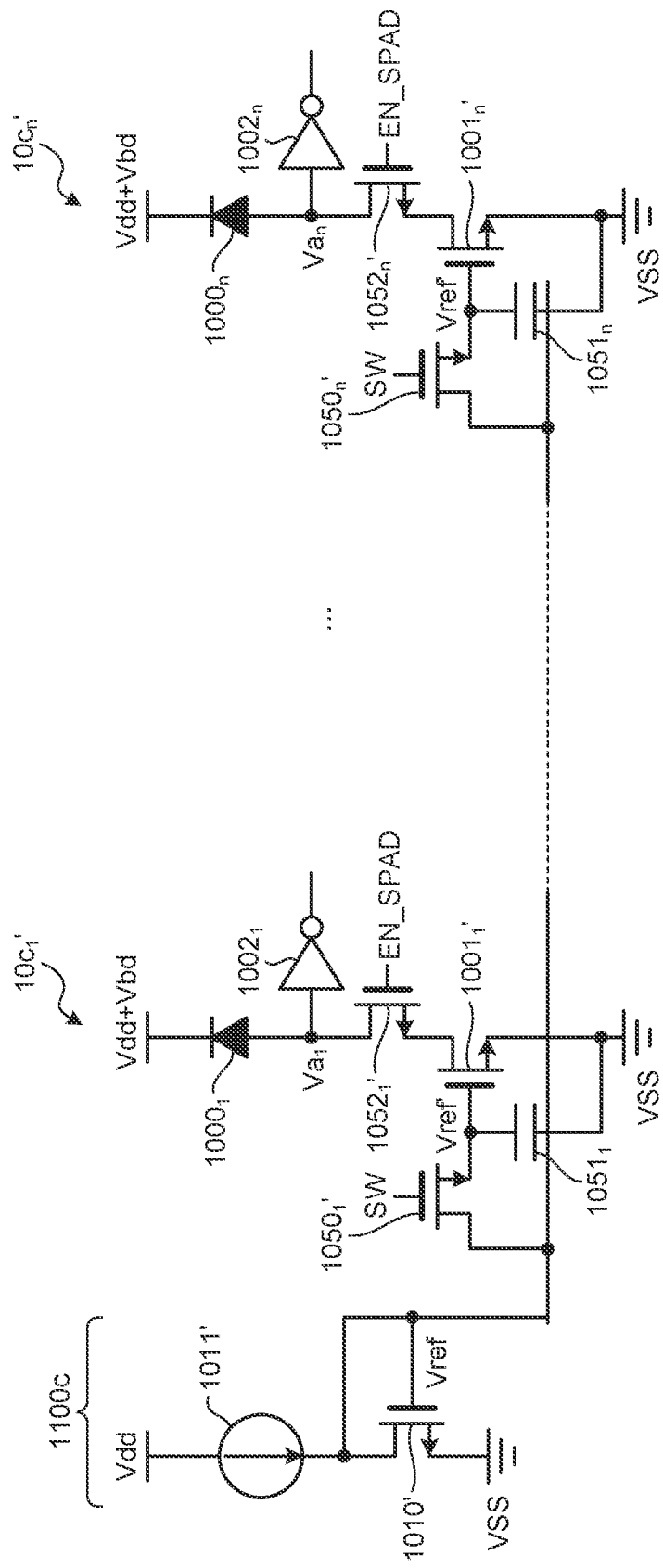
FIG. 25 is a diagram illustrating a circuit configuration of an example according to a fourth modification of the second embodiment.

FIG. 25 is a diagram illustrating a circuit configuration of an example according to the fourth modification of the second embodiment. The circuit configuration illustrated in FIG. 25 corresponds to the circuit configuration of FIG. 19 described above. In addition, the copy source circuit $1100c$ is the same as the copy source circuit $1100c$ described with reference to FIG. 17, and thus, the description thereof will be omitted here.

In the copy source circuit $1100c$, a gate of a transistor $1010'$ is connected to pixels $10c_1'$, ..., and $10c_n'$, which are copy destination circuits, respectively. Among the pixels $10c_1'$, ..., and $10c_n'$, the pixel $10c_1'$ will be described as an example. The pixel $10c_1'$ includes the light receiving element $1000_1$, transistors $1001_1'$, $1050_1'$, and $1052_1'$, which are N-channel MOSFETs, the capacitor $1051_1$, and the inverter $1002_1$.

In the pixel $10c1'$, the cathode of the light receiving element $1000_1$ is connected to a voltage (Vdd+Vbd) obtained by adding a voltage Vbd that is a breakdown voltage of the light receiving element $1000_1$, which is a SPAD, to the power supply voltage Vdd. An anode of the light receiving element $1000_1$ is connected to a drain of the transistor $1052_1'$. In addition, an anode voltage $Va_1$ of the light receiving element $1000_1$ is input to the inverter $1002_1$. The control signal EN_SPAD is input to a gate of the transistor $1052_1'$. A source of the transistor $1052_1'$ is connected to a drain of the transistor $1001_1'$.

A gate of the transistor $1001_1'$ is connected to one end of the capacitor $1051_1$ and to a source of the transistor $1050_1$. The other end of the capacitor $1051_1$ is connected to the power supply voltage Vss. A drain of the transistor $1050_1'$ is connected to a gate of the transistor $1010'$ in the copy source circuit $1100c$. A control signal SW is input to a gate of the transistor $10501'$.

In such a configuration, the control signals SW and EN_SPAD correspond to the control signals XSW and XEN_SPAD in FIGS. 19 and 20, respectively, and the control signals SW and EN_SPAD are controlled similarly to the control signals XSW and XEN_SPAD in FIG. 20. However, the transistors $1050_1'$ and $1052_1'$ to which these control signals XSW and XEN_SPAD are input are the N-channel MOSFETs in the example of FIG. 25, and thus, each of the transistors $1050_1'$ and $1052_1'$ is turned on in the high state and turned off in the low state. In addition, the power supply voltage Vdd in FIG. 20 is regarded as the power supply voltage (Vdd+Vbd) and inverted. In addition, the voltage Vref' is an inverted signal.

Even in the configuration of FIG. 25, the recharging operation of the light receiving element $1000_1$ is performed with the recharge current Id based on the voltage Vref' of the capacitor $1051_1$ during the period when the transistor $1050_1'$ is turned off and the transistor $1052_1'$ is turned on (see FIG. 20, times $t_{100}$ to $t_{101}$), which is similar to the configuration of FIG. 19. Then, the capacitor $1051_1$ is charged during the period when the transistor $1050_1'$ is turned on and the transistor $1052_1'$ is turned off (see FIG. 20, times $t_{101}$ to $t_{103}$).

Therefore, the transistor $1050_1'$ is turned off and the gate of the transistor $1001_1'$ is set to the floating state during the period when the recharging operation of the light receiving element $1000_1$ is performed. Therefore, the voltage Vref' supplied to the gate of the transistor $1001_1'$ varies depending on the variation of the power supply voltage (Vdd+Vbd), and the voltage $V_{GS}$ of the transistor $1001_1'$ becomes equal to the voltage across the capacitor $1051_1$. Therefore, the current Iref', which is a constant current, flows between the source and drain of the transistor $1001_1'$ according to the voltage $V_{GS}$.

Therefore, even when a signal is taken out from the anode side of the SPAD which is the light receiving element $1000_1$, it is easy to control the recharge current Id in the pixel $10c_1'$ by performing the recharging operation using this current Iref' as the recharge current Id.

Note that the pixel $10c_n'$ also includes the light receiving element $1000_1$, the transistors $1001_1'$, $1050_n'$, and $1052_n'$, which are N-channel MOSFETs, the capacitor $1051_n$, and the inverter 1002, similarly to the pixel $10c_1'$. Since the connection relationship of each of the parts in the pixel $10c_n'$ is the same as the connection relationship of each of the corresponding parts in the pixel $10c_1'$, the description thereof will be omitted here.

Fifth Modification of Second Embodiment

Next, a fifth modification of the second embodiment will be described. The fifth modification of the second embodiment is an example in which the plurality of pixels 10 share a capacitor that charges and holds the reference voltage Vref, for example, corresponding to the above-described capacitors $1051_1$, ..., and $1051_n$.

Figure 26:
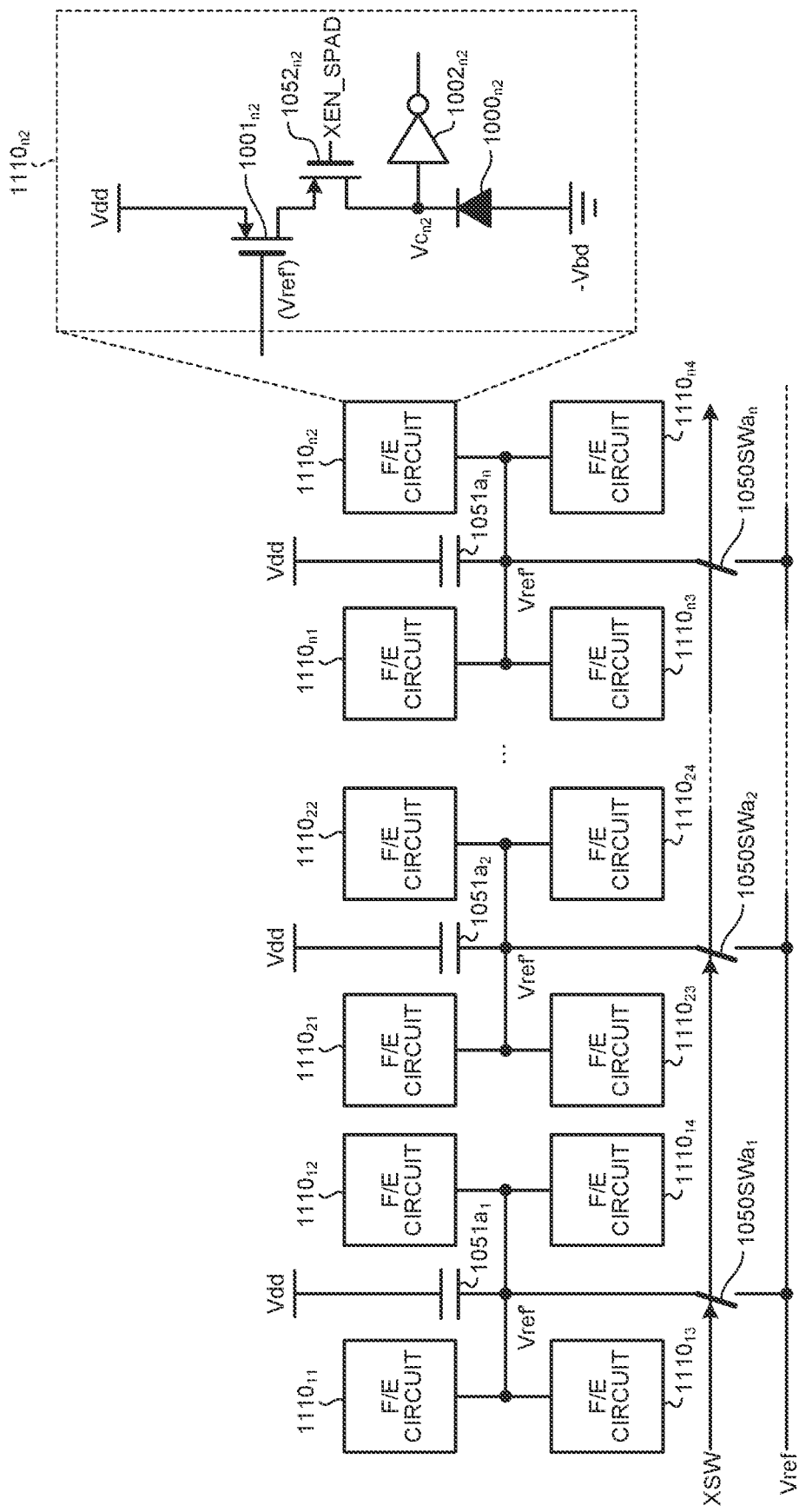
FIG. 26 is a diagram illustrating an example of a configuration according to a fifth modification of the second embodiment.

FIG. 26 is a diagram illustrating an example of a configuration according to the fifth modification of the second embodiment. In FIG. 26, front-end (F/E) circuits $1110_{11}$ to $1110_{14}$, $1110_{21}$ to $1110_{24}$, ..., and $1110_{n1}$ to $1110_{n4}$ are circuits similar to each other, and include light receiving elements 1000, inverters 1002, and transistors 1001 as current sources.

An example of a circuit diagram of the F/E circuit $1110_{n2}$ is illustrated on the right side of FIG. 26. The F/E circuit $1110_{n2}$ includes a light receiving element $1000_{n2}$, transistors $1001_{n2}$ and $1052_{n2}$ which are P-channel MOSFETs, and an inverter $1002_{n2}$. That is, the F/E circuit $1110_{n2}$ corresponds to the circuit including the light receiving element $1000_1$, the transistors $1001_1$ and $1052_1$, and the inverter $1002_1$ in the pixel $10c_1$ described with reference to FIG. 19.

In the F/E circuit $1110_{n2}$, a drain of the transistor $1001_{n2}$ is connected to a source of the transistor $1052_{n2}$, and a drain of the transistor $1052_{n2}$ is connected to a cathode of the light receiving element $1000_{n2}$, which is similar to the pixel $10c_1$ described above. A cathode voltage $Vc_{n2}$ of the light receiving element $1000_{n2}$ is input to the inverter $1002_{n2}$. The control signal XEN_SPAD is input to a gate of the transistor $1052_{n2}$.

Here, the F/E circuits $1110_{11}$ to $1110_{14}$, $1110_{21}$ to $1110_{24}$, ..., and $1110_{n1}$ to $1110_{n2}$ share capacitors $1051a_1$, $1051a_2$, ..., and $1051a_n$, respectively.

That is, one end of the capacitors $1051a_1$, $1051a_2$, ..., and $1051a_n$ is connected to the power supply voltage Vdd. The other end of the capacitor $1051a_1$ is connected to each of the F/E circuits $1110_{11}$ to $1110_{14}$, and is connected to the reference voltage Vref via a switch $1050SWa_1$. The other end of the capacitor $1051a_2$ is connected to each of the F/E circuits $1110_{21}$ to $1110_{24}$, and is connected to the reference voltage Vref via a switch $1050SWa_2$. Similarly, the other end of the capacitor $1051a_n$ is connected to each of the F/E circuits $1110_{n1}$ to $1110_{N4}$, and is connected to the reference voltage Vref via a switch $1050SWa_n$. The switches $1050SWa_1$, $1050SWa_2$, . . . , and $1050SWa_n$ are commonly controlled to be on and off by the control signal XSW.

For example, in the F/E circuit $1110_{n2}$, the other end of the capacitor $1051a_n$ is connected to a gate of the transistor $1001_{n2}$. Here, a case where the switch $1050SW_a$, is replaced with, for example, the transistor $1050_1$ in the pixel $10c_1$ of FIG. 19 is considered. In this case, it can be understood that the circuit including the F/E circuit $1110_{n2}$, the capacitor $1051a_n$, and the switch $1050SWa_n$ is the same circuit as the pixel $10c_1$.

That is, during a period when the switch $1050SWa_n$ is turned off and the transistor $1052_{n2}$ is turned on (for example, times $t_{100}$ to $t_{101}$ in FIG. 20), a recharging operation of the light receiving element $1000_{n2}$ is performed with the recharge current Id based on the voltage Vref' of the capacitor $1051a_n$. Then, the capacitor $1051a_n$ is charged during a period when a switch $1050SWa_n$' is turned on and a transistor $1052_{n2}$' is turned off (see, for example, times $t_{101}$ to $t_{103}$ in FIG. 20).

An operation in the F/E circuit $1110_{n2}$ is similarly performed even in the F/E circuits $1110_{n1}$, $1110_{n3}$, and $1110_{n4}$ that share the same capacitor $1051a_n$. In addition, the same operation is performed in blocks of the F/E circuits $1110_{11}$ to $1110_{14}$ sharing the capacitor $1051a_1$ and blocks of the F/E circuits $1110_{21}$ to $1110_{24}$ sharing the capacitor $1051a_2$.

Note that the reference voltage Vref can be supplied by using the copy source circuit $1100a$ or the copy source circuit $1100b$ described above even in the example of FIG. 26. In addition, it is also possible to apply the configuration of the pixel $10d_1$ according to the first modification of the second embodiment described with reference to FIG. 21 as each of the F/E circuits $1110_{11}$ to $1110_{n4}$.

Since the capacitor that charges and holds the reference voltage Vref is shared among the plurality of pixels 10 in this manner, the number of the capacitors in the pixel array unit 100 can be suppressed to be small, and the area can be reduced.

Figure 27:
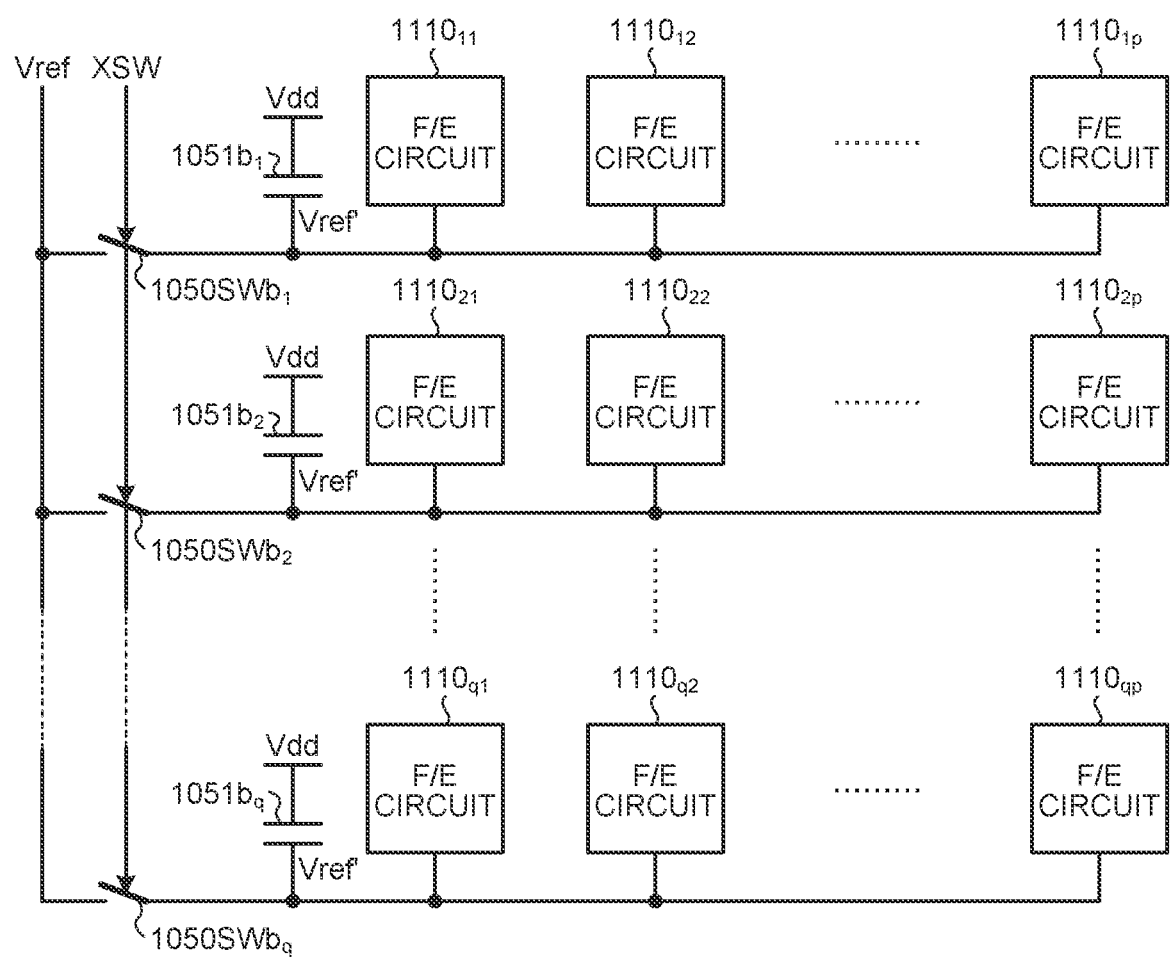
FIG. 27 is a diagram illustrating another example of the configuration according to the fifth modification of the second embodiment.

FIG. 27 is a diagram illustrating another example of the configuration according to the fifth modification of the second embodiment. In the configuration of FIG. 26, one capacitor is shared by the plurality of F/E circuits arranged in units of blocks. On the other hand, in this other example, one capacitor is shared by each row of an array of the pixels 10 in the pixel array unit 100.

In FIG. 27, F/E circuits $1110_{11}$, $1110_{12}$, . . . , and $1110_{1p}$ arranged in the first row of the pixel array unit 100 share a capacitor $1051b_1$ arranged in the first row, and are supplied with the reference voltage Vref via a switch $1050SWb_1$. F/E circuits $1110_{21}$, $1110_{22}$, . . . , and $1110_{2p}$ arranged in the second row of the pixel array unit 100 share a capacitor $1051b_2$ arranged in the second row, and are supplied with the reference voltage Vref via a switch $1050SWb_2$. Similarly, F/E circuits $1110_{q1}$, $1110_{q2}$, . . . , and $1110_{qp}$ arranged in the q-th row of the pixel array unit 100 share one capacitor $1051b_q$ arranged in the q-th row, and are supplied with the reference voltage Vref via a switch $1050SWb_q$.

Each of the switches $1050SWb_1$, $1050SWb_2$, . . . , and $1050SWb_q$ is controlled to be on and off by the control signal XSW. In addition, the reference voltage Vref is supplied by using the copy source circuit $1100a$ or the copy source circuit $1100b$ described above.

This other example of the fifth modification of the second embodiment is preferably applied when the voltage drop $\Delta V_{drop}$ with respect to the power supply voltage Vdd is small in the row direction of the pixel array unit 100 and is large in the column direction. In addition, it is possible to reduce the number of capacitors and to reduce the area as compared with the configuration in which one capacitor is shared by the plurality of F/E circuits arranged in units of blocks illustrated in FIG. 26.

In addition, one capacitor is shared for each row of the array of pixels 10 in the pixel array unit 100 in the example of FIG. 27, but this is not limited to this example. For example, one capacitor may be shared for each column of the array of the pixels 10 in the pixel array unit 100. This is preferably applied when the voltage drop $\Delta V_{drop}$ with respect to the power supply voltage Vdd is small in the column direction of the pixel array unit 100 and is large in the row direction, for example.

Third Embodiment

Next, a third embodiment of the present disclosure will be described. In the first embodiment and respective modifications thereof, and the second embodiment and respective modifications thereof described above, the quenching operation and recharging operation of the light receiving element 1000 (the SPAD 2000) described with reference to FIG. 11A are performed by the passive operation. On the other hand, a quenching operation is performed by a passive operation and a recharging operation is performed by an active operation in the third embodiment.

Since the recharging operation by the active operation is similar to the operation described with reference to FIGS. 10A to 10D, for example, a cathode of a SPAD 2000 (light receiving element 1000) is charged in advance to a voltage at which avalanche multiplication can be started. In a standby state for photon reception of the SPAD 2000, a current path charged with the cathode of the SPAD 2000 is cut off. The avalanche multiplication starts as a photon is received by the SPAD 2000. If a voltage across the SPAD 2000 decreases, the voltage decrease is detected, and the avalanche multiplication is stopped by the quenching operation. After a predetermined delay time has elapsed from a timing of detecting the voltage decrease, the current path for charging the cathode of the SPAD 2000 is connected again, and the cathode of the SPAD 2000 is charged to the voltage at which the avalanche multiplication can be started. It is possible to set a dead time to an optimum value by appropriately controlling the delay time.

Figure 28:
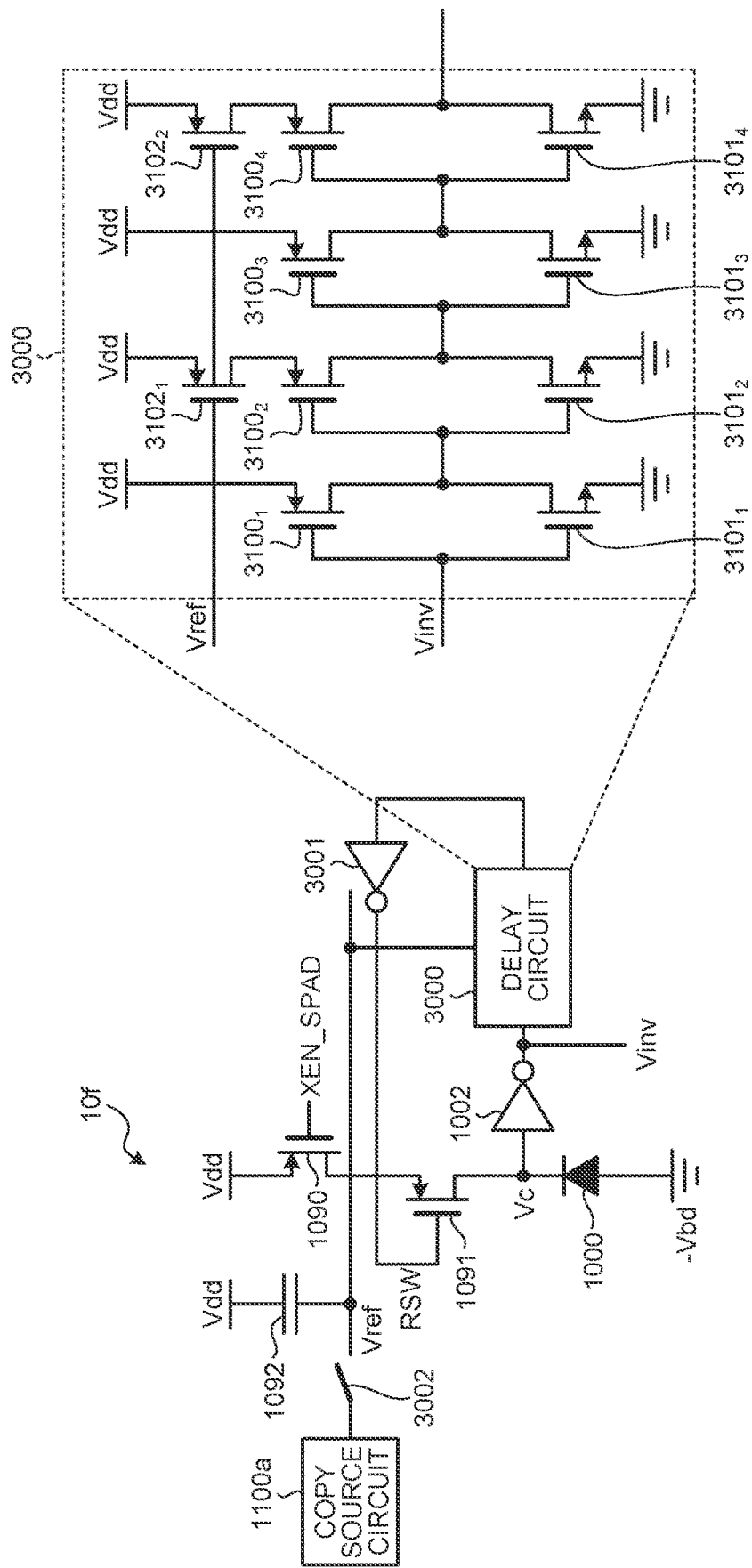
FIG. 28 is a diagram illustrating an example of a circuit configuration according to a third embodiment.

FIG. 28 is a diagram illustrating an example of a circuit configuration according to the third embodiment. In FIG. 28, a pixel $10f$ includes a light receiving element 1000, inverters 1002 and 3001, transistors 1090 and 1091, which are P-channel MOSFETs, a capacitor 1092, a delay circuit 3000, and a switch 3002.

The light receiving element 1000 has an anode connected to a voltage (−Vbd) and a cathode connected to a drain of the transistor 1091. A control signal RSW, which will be described later, is input to a gate of the transistor 1091. A source of the transistor 1091 is connected to a drain of the transistor 1090, and a source of the transistor 1090 is connected to a power supply voltage Vdd. A control signal XEN_SPAD is input to a gate of the transistor 1090.

A reference voltage Vref output from a copy source circuit $1100a$ is connected to one end of the capacitor 1092 via the switch 3002 and is supplied to the delay circuit 3000. The switch 3002 is controlled to be on and off by, for example, a control signal XSW. The other end of the capacitor 1092 is connected to the power supply voltage Vdd.

A cathode voltage Vc of the light receiving element 1000 is input to the inverter 1002. When the cathode voltage Vc has changed by a predetermined value or more, the inverter 1002 outputs an output signal Vinv in which the change is inverted. The output signal Vinv is output to the outside of the pixel 10*f* and input to the delay circuit 3000. The delay circuit 3000 delays the input output signal Vinv by a delay amount corresponding to the reference voltage Vref and outputs the delayed signal. An output of the delay circuit 3000 is inverted by the inverter 3001 and used as the control signal RSW and input to the gate of the transistor 1091.

An example of an operation in such a configuration will be described. First, the switch 3002 is turned on to charge the capacitor 1092 with the reference voltage Vref. The switch 3002 is turned off at a timing when the charging of the capacitor 1092 is completed. The delay time of the delay circuit 3000 after the operation of the light receiving element 1000 is set by the reference voltage Vref charged in the capacitor 1092.

Here, it is assumed that the cathode of the light receiving element 1000 is charged with a voltage (Vdd+Vbd) at the time of immediately previously receiving a photon, for example, and the light receiving element 1000 is in a state where the avalanche multiplication can be started. In a state where the light receiving element 1000 is waiting for reception of a photon, the output signal Vinv of the inverter 1002 is in a low state, and is input to the inverter 3001 via the delay circuit 3000. The inverter 3001 inputs the control signal RSW, obtained by inverting the output signal Vinv in the low state, to the gate of the transistor 1091. As a result, the transistor 1091 is turned on.

When a photon is received by the light receiving element 1000, a voltage across the light receiving element 1000 decreases, the avalanche multiplication is stopped, and the output signal Vinv of the inverter 1002 shifts from the low state to the high state. The output signal Vinv is delayed by the delay circuit 3000 for a predetermined time, inverted by the inverter 3001, and input to the gate of the transistor 1091 as the control signal RSW in the low state. As a result, the transistor 1091 is turned on, the power supply voltage Vdd is supplied to the cathode of the light receiving element 1000, and the cathode is charged with the voltage (Vdd+Vbd).

If the recharging operation is performed by the active operation in this manner, a recharge time can be controlled according to the delay amount in the delay circuit 3000.

A circuit configuration of an example of the delay circuit 3000 applicable to the third embodiment is illustrated on the right side of FIG. 28. The delay circuit 3000 illustrated in FIG. 28 includes a plurality of inverter circuits in which an N-channel MOSFET and a P-channel MOSFET are connected in parallel, and is configured such that the respective inverters are connected in series. In the example of FIG. 28, the delay circuit 3000 includes transistors $3100_1$, $3100_2$, $3100_3$, and $3100_4$, which are P-channel MOSFETs, and transistors $3101_1$, $3101_2$, $3101_3$, and $3101_4$, which are N-channel MOSFETs, to form the inverters.

The transistors $3001_1$ and $3101_1$ form the inverter at the first stage, the transistors $3001_2$ and $3101_2$ form the inverter at the second stage, the transistors $3001_3$ and $3101_3$ form the inverter at the third stage, and the transistors $3001_4$ and $3101_4$ form the inverter at the fourth stage. These inverters at the first to fourth stages are connected in series, the output signal Vinv output from the inverter 1002 is input to the inverter at the first stage, and the output signal Vinv is output with a predetermined time delay from the inverter at the fourth stage.

Here, sources of the transistors $3101_1$ to $3101_4$ in the respective inverters are connected to, for example, a ground voltage in the example of FIG. 28. In addition, among the transistors $3100_1$ to $3100_4$ in the respective inverters, sources of the transistors $3001_1$ and $3100_3$ are directly connected to the power supply voltage Vdd. On the other hand, sources of the transistors $3100_2$ and $3100_4$ are connected to the power supply voltage Vdd via the transistors $3102_1$ and $3102_2$, respectively.

The reference voltage Vref is input to the gates of transistors $3102_1$ and $3102_2$. More specifically, the gates of the transistors $3102_1$ and $3102_2$ are connected to a gate of the transistor 1010 (see the lower part of FIG. 13) of the copy source circuit 1100*a* via the switch 3002. That is, each of the transistors $3102_1$ and $3102_2$ is set as a copy destination of a current mirror circuit whose copy source is the transistor 1010.

In an inverter circuit in which an N-channel MOSFET and a P-channel MOSFET are connected in parallel, a delay time changes depending on the amount of current flowing between a source and a drain of each transistor. That is, the delay time is short if the amount of current is large, and the delay time is long if the amount of current is small. Therefore, it is possible to control the delay time of the delay circuit 3000 based on the current copied from the copy source circuit 1100*a* according to the reference voltage Vref.

In the example of FIG. 28, the delay circuit 3000 includes four inverters, and the transistors $3102_1$ and $3102_2$, which are the copy destinations of the current of the copy source circuit 1100*a*, are connected to the two inverters at the second stage and the fourth stage. However, this is an example, and the invention is not limited to this example. In the delay circuit 3000, a transistor as a copy destination of the current of the copy source circuit 1100*a* may be connected to one of the four inverters or three or more inverters. In addition, the delay circuit 3000 may include five or more or three of less inverters.

In this manner, the reference voltage Vref corresponding to the reference current Iref is used in the copy source circuit 1100*a* as the control voltage for controlling the delay time of the delay circuit 3000 in the third embodiment. Therefore, the delay time of the control signal RSW by the delay circuit 3000 can be controlled more stably. As a result, it is possible to more efficiently perform photon detection.

In addition, the pixel 10*f* charges the capacitor 1092 with the reference voltage Vref supplied from the copy source circuit 1100*a*, and controls the delay time of the delay circuit 3000 based on the output of the capacitor 1092 in the third embodiment. Therefore, it is possible to suppress a time difference of the delay time of the control signal RSW between the respective pixels 10*f* included in a pixel array unit 100.

Fourth Embodiment

Next, a fourth embodiment will be described. The fourth embodiment is an example in which a plurality of copy source circuits for copying a reference current Iref are provided for each of pixels 10 in a pixel array unit 100. Each copy source circuit is arranged for each row, each column, or each region of the plurality of pixels 10 included in the pixel array unit 100.

Figure 29:
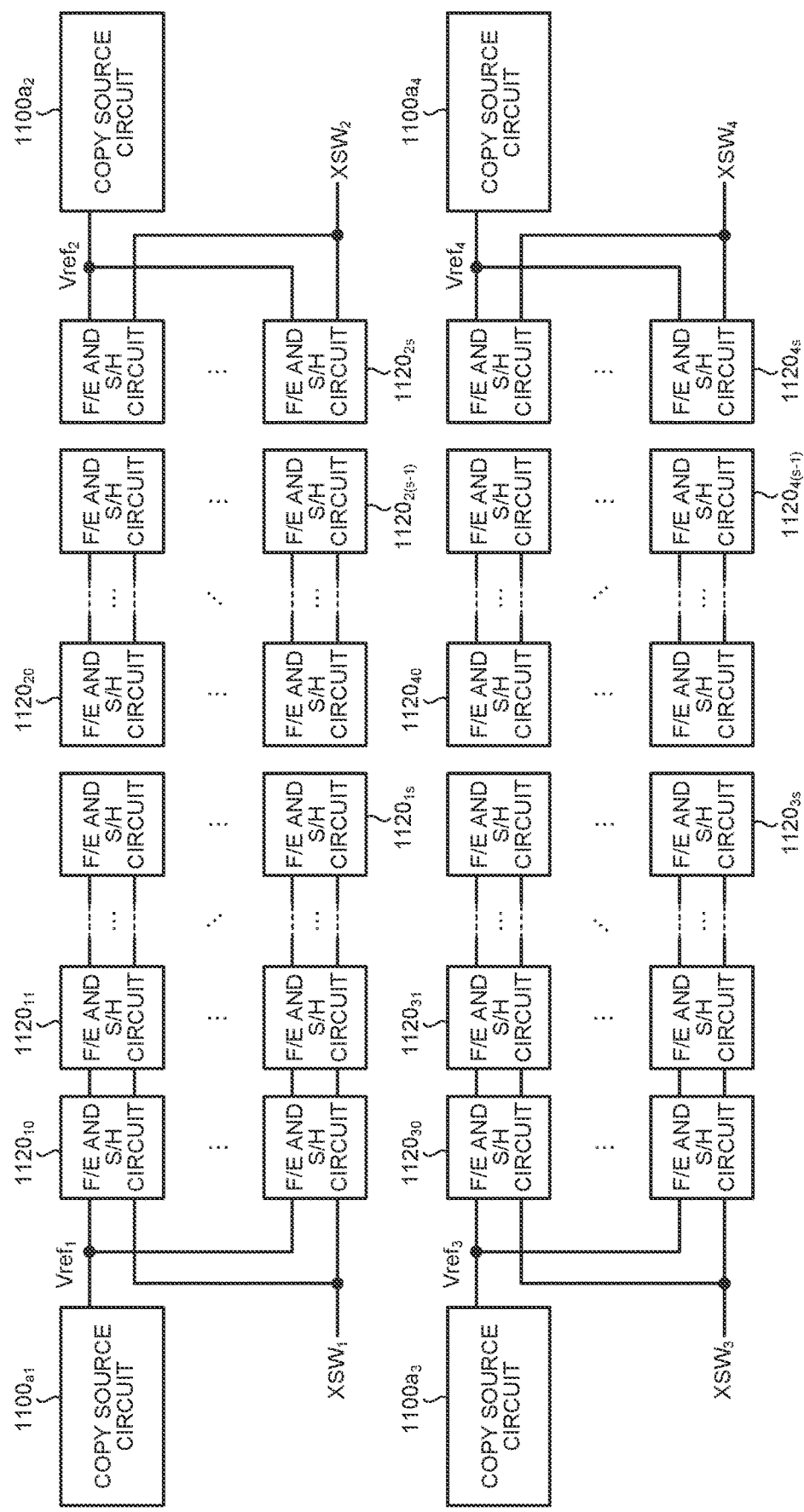
FIG. 29 is a block diagram illustrating a configuration of an example of a pixel array unit according to a fourth embodiment.

FIG. 29 is a block diagram illustrating a configuration of an example of the pixel array unit 100 according to the fourth embodiment. In FIG. 29, each of F/E and S/H (sample and hold) circuits $1120_{10}$, $1120_{11}$ to $1120_{1s}$, $1120_{20}$ to $1120_{2(s-1)}$, $1120_{2s}$, $1120_{30}$, $1120_{31}$ to $1120_{3s}$, and $1120_{40}$ to $1120_{4(s-1)}$, and $1120_{4s}$ has a configuration corresponding to pixel $10c_1$ described with reference to, for example, FIG. 19.

The F/E and S/H circuit $1120_{10}$ will be described by taking the F/E and S/H circuits $1120_{10}$ as an example. With reference to FIG. 19, the F/E and S/H circuit $1120_{10}$ includes, for example, a front-end circuit including a light receiving element $1000_1$, transistors $1001_1$ and $1052_1$, and an inverter $1002_1$, and a sample and hold circuit including a transistor $1050_1$ and a capacitor $1051_1$.

Without being limited thereto, each of the F/E and S/H circuits $1120_{10}$, $1120_{11}$ to $1120_{1s}$, $1120_{20}$ to $1120_{2(s-1)}$, $1120_{2s}$, $1120_{30}$, $1120_{31}$ to $1120_{3s}$, and $1120_{40}$ to $1120_{4(s-1)}$, and $1120_{4s}$ may have a configuration corresponding to the pixel $10d_1$ described with reference to FIG. 21, or a configuration corresponding the pixel $10c_1{}'$ described with reference to FIG. 25.

In addition, the sample and hold circuit may be omitted from the F/E and S/H circuits $1120_{10}$, $1120_{11}$ to $1120_{1s}$, $1120_{20}$ to $1120_{2(s-1)}$, $1120_{2s}$, $1120_{30}$, $1120_{31}$ to $1120_{3s}$, and $1120_{40}$ to $1120_{4(s-1)}$, and $1120_{4s}$ to adopt a configuration corresponding to the pixels $10a_1$ illustrated in the lower part of FIG. 13.

In FIG. 29, each of copy source circuits $1100a_1$, $1100a_2$, $1100a_3$, and $1100a_4$ has a configuration corresponding to the copy source circuit $1100a$ illustrated in the lower part of FIG. 13. Without being limited thereto, each of the copy source circuits $1100a_1$, $1100a_2$, $1100a_3$, and $1100a_4$ may have a configuration corresponding to the copy source circuit $1100b$ illustrated in FIG. 15.

To each of the F/E and S/H circuits $1120_{10}$ and $1120_{11}$ to $1120_{1s}$, a reference voltage $Vref_1$ is commonly supplied from the copy source circuit $1100a_1$, and a control signal $XSW_1$ is commonly supplied from a pixel control unit $102$ (not illustrated). To each of F/E and S/H $1120_{20}$ to $1120_{2(s-1)}$ and $1120_{2s}$, a reference voltage $Vref_2$ is commonly supplied from the copy source circuit $1100a_2$, and a control signal $XSW_2$ is commonly supplied from the pixel control unit $102$ (not illustrated).

Each of the F/E and S/H circuits $1120_{30}$ and $1120_{31}$ to $1120_{3s}$, and $1120_{40}$ to $1120_{4(s-1)}$, and $1120_{4s}$ is similarly configured. Reference voltages $Vref_3$ and $Vref_4$ are supplied from the copy source circuits $1100a_3$ and $1100a_4$, respectively, and control signals $XSW_3$ and $XSW_4$ are supplied from the pixel control unit $102$.

In this manner, the copy source circuits $1100a_1$ to $1100a_4$ are provided for each region of the pixel array unit $100$ in the fourth embodiment. It is possible to suppress a temperature difference and a difference in element characteristic between each transistor as a copy destination of a current mirror circuit in each region and a transistor in a copy source circuit of each region. As a result, the accuracy of copy of the reference current Iref generated by the copy source circuits $1100a_1$ to $1100a_4$ is improved, and the photon detection accuracy in the pixel array unit $100$ can be made uniform. As a result, it is possible to more efficiently perform photon detection.

Fifth Embodiment

Figure 30:
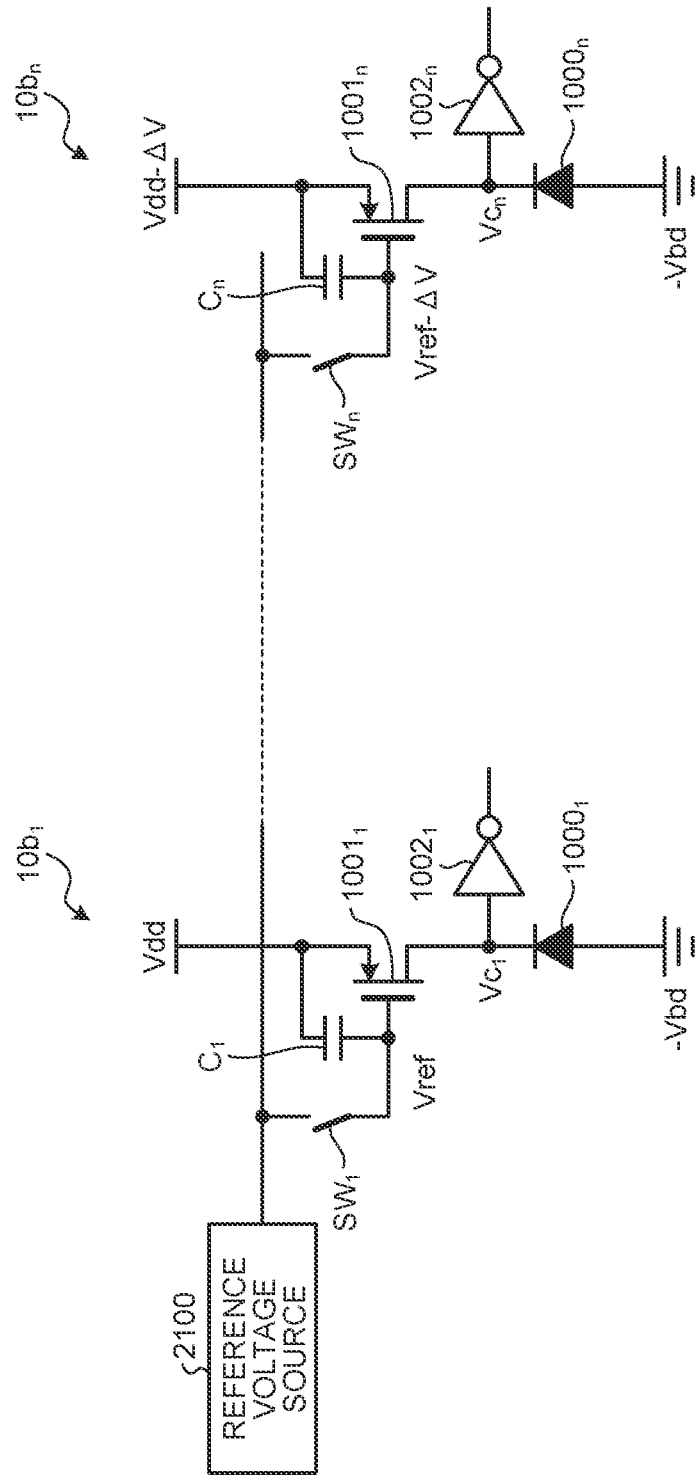
FIG. 30 is a diagram schematically illustrating a configuration of an example according to a fifth embodiment.

Next, a fifth embodiment of the present disclosure will be described. The fifth embodiment is an example in which a reference current Iref is not copied, with respect to the second embodiment described above. FIG. 30 is a diagram schematically illustrating a configuration of an example according to the fifth embodiment. FIG. 30 is the diagram corresponding to FIG. 18 described above, and has the configuration in which the copy source circuit $1100a$ in FIG. 18 is simply changed to a reference voltage source $2100$ that generates a reference voltage Vref. Since configurations of pixels $10b_1, \ldots,$ and $10b_n$ are the same as those of the pixels $10b_1, \ldots,$ and $10b_n$ in FIG. 18, the description thereof will be omitted here.

An operation in the configuration of FIG. 30 is the same as the operation in FIG. 18 described above. That is, a capacitor $C_1$ is charged with the reference voltage Vref in an on state of a switch $SW_1$. In addition, in an off state of the switch $SW_1$, the cathode of the light receiving element $1000_1$ is charged using the current Iref determined by a voltage Vref across the capacitor $C_1$ as the recharge current Id. In the off state of the switch $SW_1$, a gate of a transistor $1001_1$ is in a floating state, and a voltage $V_{GS}$ of the transistor $1001_1$ becomes a voltage across the capacitor $C_1$. Therefore, the voltage $V_{GS}$ of the transistor $1001_1$ can maintain a constant value with respect to a variation of the power supply voltage Vdd, and the current Iref determined by the voltage $V_{GS}$ also becomes a constant value.

Therefore, even in the fifth embodiment, it is possible to suppress a variation of the voltage $V_{GS}$ between gate and source of a transistor $1001_n$ caused by a voltage drop $\Delta V_{drop}$ depending on a distance from the power supply voltage Vdd in a pixel $10_n$ far from a supply position of the power supply voltage Vdd that has been described with reference to FIG. 12, which is similar to the second embodiment described above. As a result, it is possible to improve the uniformity of a characteristic in a light reception surface of a pixel array unit $100$ and to more efficiently perform photon detection.

Sixth Embodiment

Figure 31:
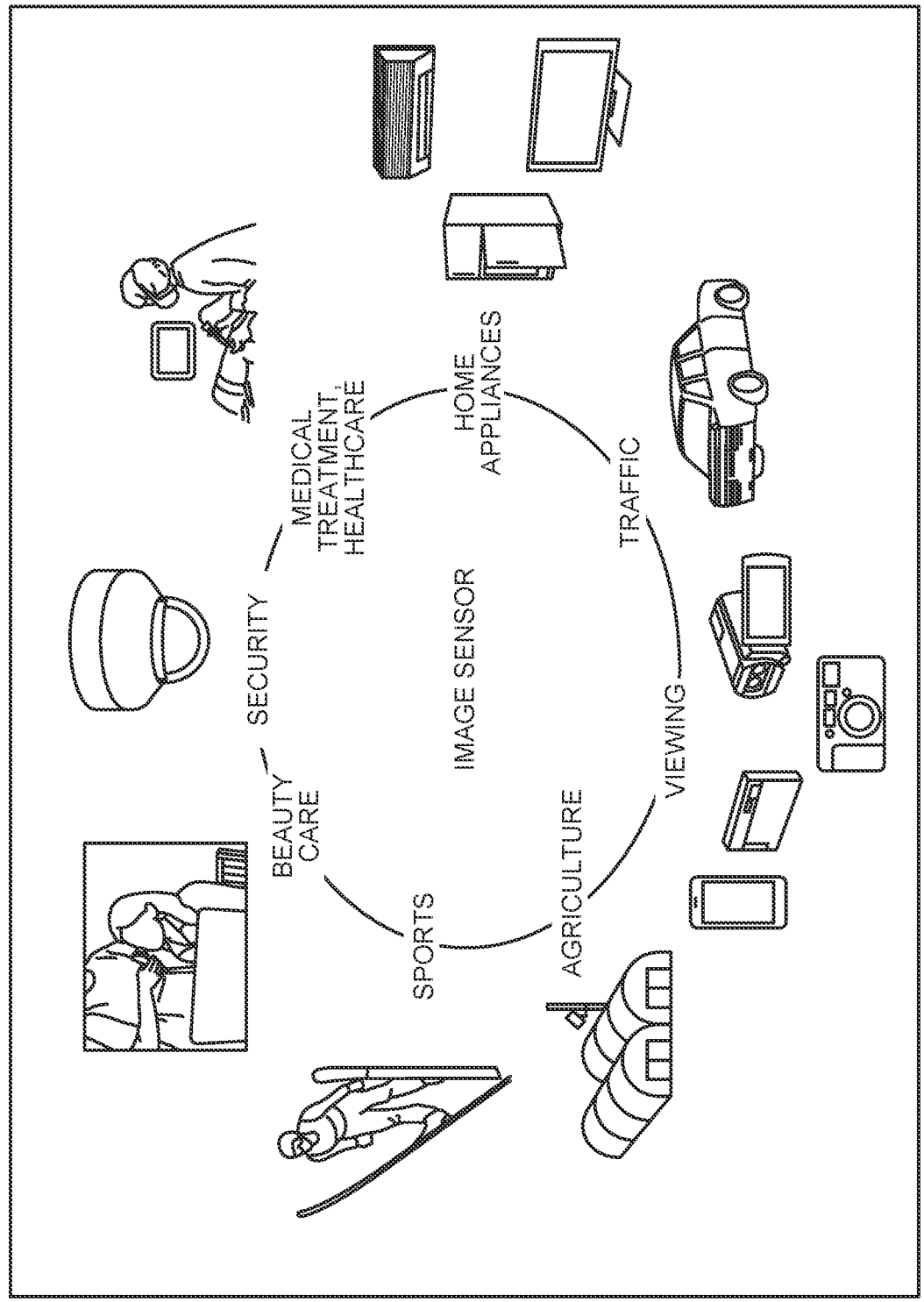
FIG. 31 is a view illustrating use examples according to a sixth embodiment using a distance measurement device to which the first embodiment and respective modifications thereof, the second embodiment and respective modifications thereof, and the third to fifth embodiments are applied.

Next, as a sixth embodiment of the present disclosure, application examples of the first embodiment and respective modifications thereof, the second embodiment and respective modifications thereof, and the third to fifth embodiments of the present disclosure will be described. FIG. 31 is a view illustrating use examples according to a sixth embodiment using the distance measurement device 1 to which the first embodiment and respective modifications thereof, the second embodiment and respective modifications thereof, and the third to fifth embodiments are applied.

The above-described distance measurement device 1 can be used in various cases for sensing light such as visible light, infrared light, ultraviolet light, and X-ray as will be described below.

A device that captures an image used for viewing, such as a digital camera and a mobile device with a camera function.

A device used for traffic, such as in-vehicle sensors that capture the front, rear, surroundings, interior, and the like of an automobile in order for safe driving such as automatic stop and recognition of a driver's condition, a surveillance camera that monitors a traveling vehicle and a road, and a distance measurement sensor that measures a distance between vehicles.

A device used in home appliances, such as a TV, a refrigerator, and an air conditioner to capture a user's gesture and operate the device according to the gesture.

A device used for medical treatment and healthcare, such as an endoscope and a device that performs angiography by receiving infrared light.

A device used for security, such as a surveillance camera for crime prevention and a camera for personal authentication.

A device used for beauty care, such as a skin measuring device that captures a skin and a microscope that captures a scalp.

A device used for sports, such as an action camera and a wearable camera for sports applications.

A device used for agriculture, such as a camera for monitoring conditions of a field and a crop.

Additional Application Example of Technology According to Present Disclosure

Application Example to Moving Object

The technology according to the present disclosure may be further applied to a device mounted on various moving objects such as a vehicle, an electric vehicle, a hybrid electric vehicle, a motorcycle, a bicycle, a personal mobility, an airplane, a drone, a ship, and a robot.

Figure 32:
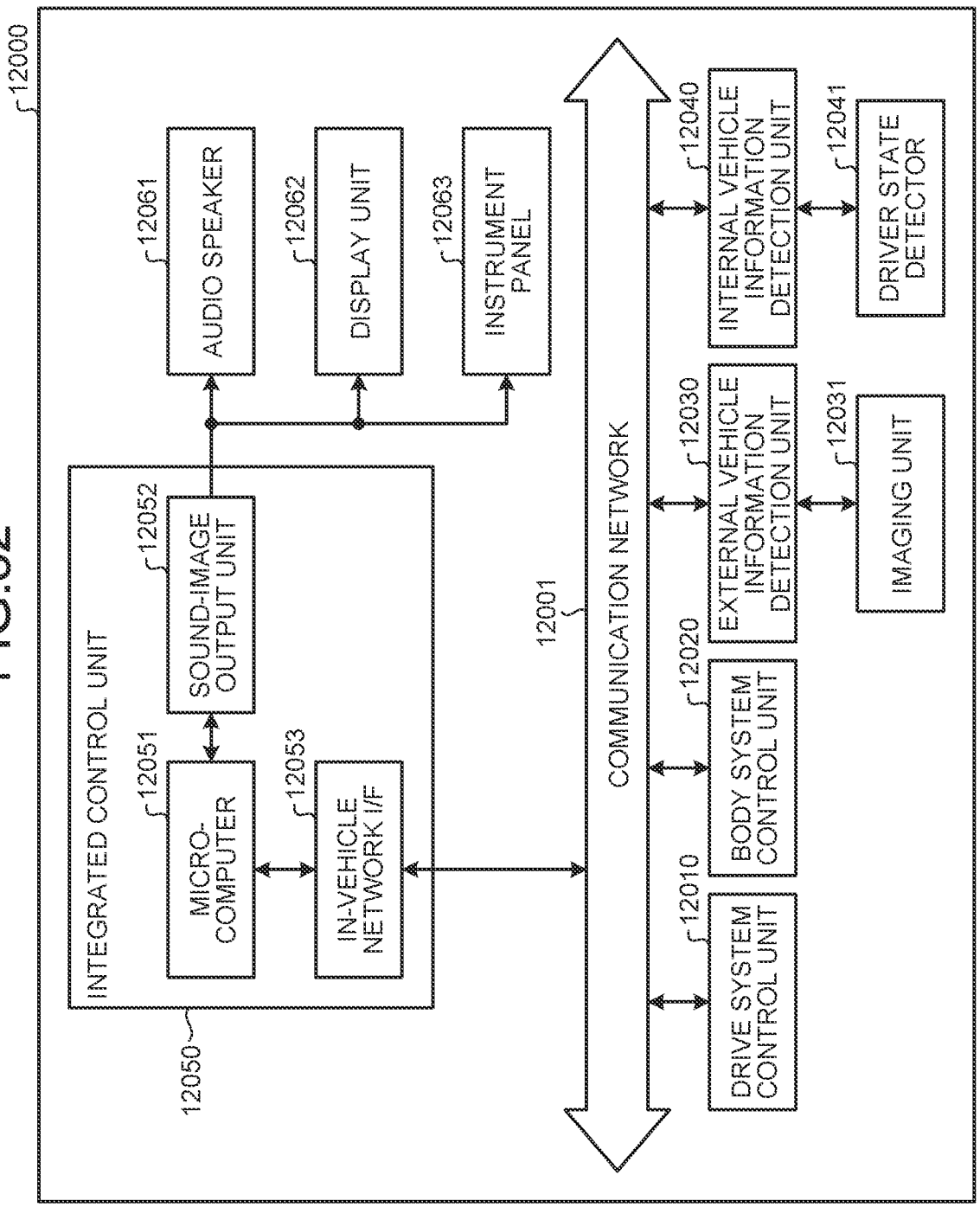
FIG. 32 is a block diagram illustrating a schematic configuration example of a vehicle control system, which is an example of a moving object control system to which the technology according to the present disclosure can be applied.

FIG. 32 is a block diagram illustrating a schematic configuration example of a vehicle control system, which is an example of a moving object control system to which the technology according to the present disclosure can be applied.

A vehicle control system 12000 includes a plurality of electronic control units connected via a communication network 12001. In the example illustrated in FIG. 32, the vehicle control system 12000 includes a drive system control unit 12010, a body system control unit 12020, an external vehicle information detection unit 12030, an internal vehicle information detection unit 12040, and an integrated control unit 12050. In addition, as a functional configuration of the integrated control unit 12050, a microcomputer 12051, a sound-image output unit 12052, and an in-vehicle network interface (I/F) 12053 are illustrated.

The drive system control unit 12010 controls operations of devices related to a drive system of a vehicle according to various programs. For example, the drive system control unit 12010 functions as a control device of a driving force generation device, such as an internal combustion engine and a driving motor, configured to generate a driving force of the vehicle, a driving force transmitting mechanism configured to transmit the driving force to wheels, a steering mechanism that adjusts a steering angle of the vehicle, a braking device that generates a braking force of the vehicle, and the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn signal, and a fog lamp. In this case, the body system control unit 12020 can receive input of radio waves transmitted from a portable device substituted for a key or signals of various switches. The body system control unit 12020 receives input of these radio waves or signals to control a door lock device, the power window device, the lamps, or the like of the vehicle.

The external vehicle information detection unit 12030 detects information regarding the outside of the vehicle on which the vehicle control system 12000 is mounted. For example, an imaging unit 12031 is connected to the external vehicle information detection unit 12030. The external vehicle information detection unit 12030 causes the imaging unit 12031 to capture an image of the outside of the vehicle and receives the captured image. The external vehicle information detection unit 12030 may perform object detection processing or distance detection processing of a person, a car, an obstacle, a sign, a character, or the like on a road surface based on the received image. The external vehicle information detection unit 12030 performs image processing on the received image, and performs object detection processing or distance detection processing based on a result of the image processing.

The imaging unit 12031 is an optical sensor that receives light and outputs an electrical signal according to the amount of the received light. The imaging unit 12031 can output the electrical signal as an image and also as ranging information. In addition, the light received by the imaging unit 12031 may be visible light or invisible light such as infrared light.

The internal vehicle information detection unit 12040 detects internal vehicle information. The internal vehicle information detection unit 12040 is connected with a driver condition detection unit 12041 that detects a condition of a driver, for example. The driver condition detection unit 12041 includes a camera that images the driver, for example, and the internal vehicle information detection unit 12040 may calculate a degree of fatigue or degree of concentration of the driver or may determine whether the driver is dozing off based on detection information input from the driver condition detection unit 12041.

The microcomputer 12051 can calculate a control target value of the driving force generation device, the steering mechanism, or the braking device based on the information regarding the inside or outside of the vehicle acquired by the external vehicle information detection unit 12030 or the internal vehicle information detection unit 12040, and output a control command to the drive system control unit 12010. For example, the microcomputer 12051 can perform cooperative control for the purpose of implementing a function of an advanced driver assistance system (ADAS) including collision avoidance or impact mitigation for the vehicle, travel following a vehicle ahead based on an inter-vehicle distance, constant speed travel, a vehicle collision warning, or a warning for the vehicle deviating a lane.

In addition, the microcomputer 12051 can perform cooperative control for the purpose of automated driving or the like with which the vehicle travels autonomously without depending on the driver's operation by controlling the driving force generation device, the steering mechanism, the braking device, or the like based on information regarding the surroundings of the vehicle acquired by the external vehicle information detection unit 12030 or the internal vehicle information detection unit 12040.

In addition, the microcomputer 12051 can output a control command to the body system control unit 12020 based on the information regarding the outside of the vehicle acquired by the external vehicle information detection unit 12030. For example, the microcomputer 12051 can perform cooperative control for the purpose of anti-glare such as switching from a high beam to a low beam by controlling a head lamp depending on a position of a vehicle ahead or an oncoming vehicle detected by the external vehicle information detection unit 12030.

The sound-image output unit 12052 transmits an output signal of at least one of a sound or an image to an output device that can visually or aurally provide notification of information to a passenger of the vehicle or the outside of the vehicle. In the example of FIG. 32, an audio speaker 12061, a display unit 12062, and an instrument panel 12063 are exemplified as the output device. The display unit 12062 may include at least one of an on-board display and a head-up display, for example.

Figure 33:
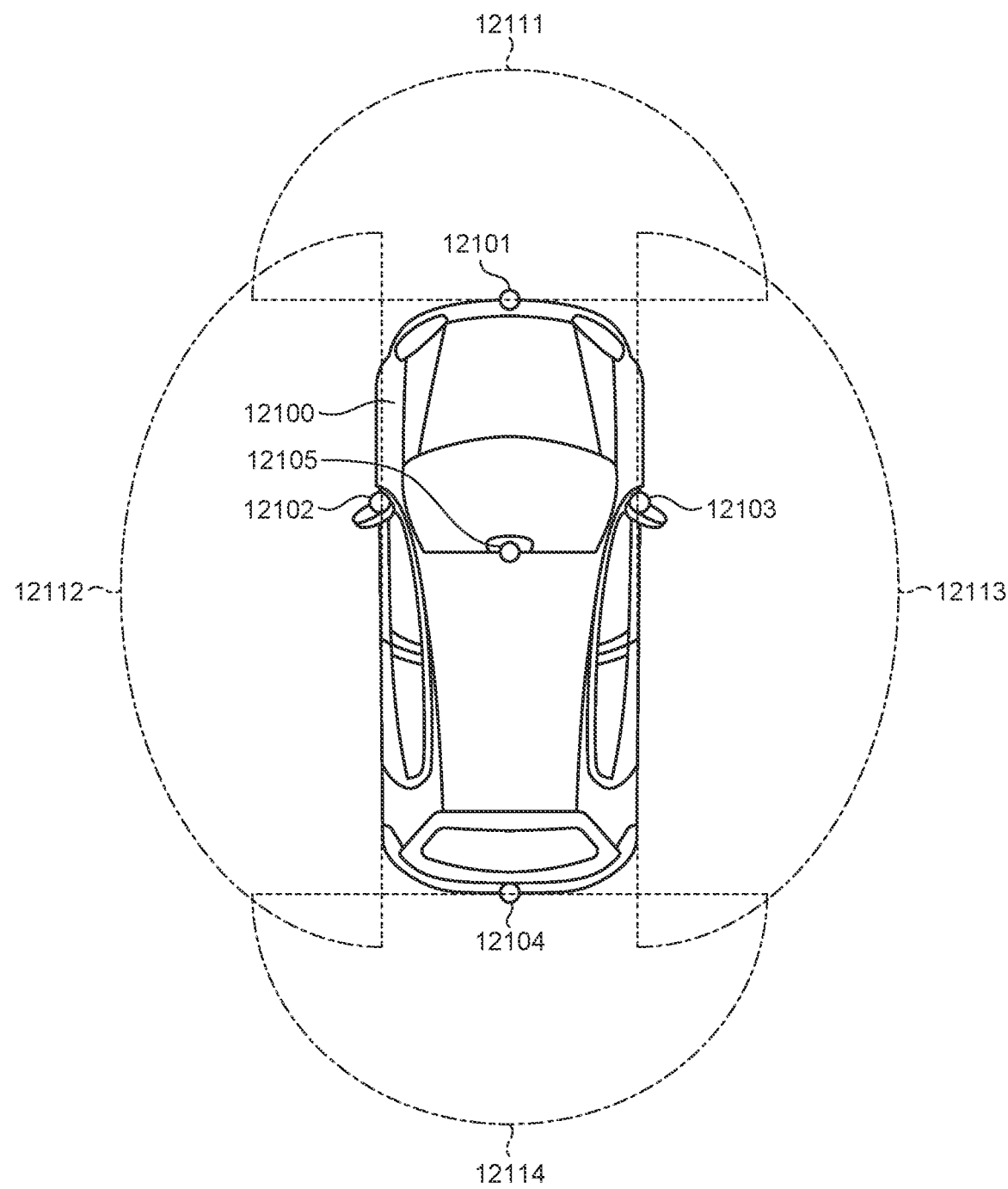
FIG. 33 is a view illustrating an example of an installation position of an imaging unit.

FIG. 33 is a view illustrating an example of an installation position of the imaging unit 12031. In FIG. 33, a vehicle 12100 has an imaging units 12101, 12102, 12103, 12104, and 12105 as the imaging unit 12031.

The imaging units 12101, 12102, 12103, 12104, and 12105 are installed at positions such as a front nose, side mirrors, a rear bumper, a back door, and an upper part of a windshield in a passenger compartment of the vehicle 12100, for example. The imaging unit 12101 installed at the front nose and the imaging unit 12105 installed in the upper part of the windshield in the passenger compartment mainly acquire an image of an area in front of the vehicle 12100. The imaging units 12102 and 12103 installed on the side mirrors mainly acquire images of the sides of the vehicle 12100. The imaging unit 12104 installed on the rear bumper or the back door mainly acquires an image of an area behind the vehicle 12100. The image of the area in front of the vehicle acquired by the imaging units 12101 and 12105 is mainly used to detect a vehicle ahead or a pedestrian, an obstacle, a traffic light, a traffic sign, a lane, or the like.

Note that FIG. 33 illustrates an example of capturing ranges of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, a bird's-eye view image of the vehicle 12100 viewed from above can be obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object within the imaging ranges 12111 to 12114 and a temporal change in the distance (relative speed with respect to the vehicle 12100) based on the distance information obtained from the imaging units 12101 to 12104, and thus, can particularly extract, as a vehicle ahead, a three-dimensional object closest on a path of travel of the vehicle 12100 and traveling at a predetermined speed (for example, 0 km/h or faster) in substantially the same direction as that of the vehicle 12100. Further, the microcomputer 12051 can set an inter-vehicle distance to be secured in advance behind the vehicle ahead, and perform automatic brake control (including follow-up stop control), automatic acceleration control (including follow-up start control), and the like. In this manner, it is possible to perform the cooperative control for the purpose of automated driving or the like for autonomous traveling without depending on the driver's operation.

For example, the microcomputer 12051 classifies three-dimensional object data relating to a three-dimensional object into a two-wheeled vehicle, a standard sized vehicle, a large sized vehicle, a pedestrian, and other three-dimensional objects such as a utility pole, and extracts the data for use in automatic avoidance of an obstacle on the basis of the distance information obtained from the imaging units 12101 to 12104. For example, the microcomputer 12051 distinguishes identifies an obstacle in the vicinity of the vehicle 12100 as an obstacle that can be visually recognized by the driver of the vehicle 12100 or an obstacle that is difficult to be visually recognized by the driver. Then, the microcomputer 12051 determines a risk of collision indicating the degree of risk of collision with each obstacle, and can perform driver assistance to avoid collision in a situation where there is a possibility of collision with the risk of collision equal to or higher than a set value by outputting an alarm to the driver via the audio speaker 12061 and/or the display unit 12062 or performing forced deceleration or evasive steering via the drive system control unit 12010.

At least one of the imaging units 12101 to 12104 may be an infrared camera that detects infrared light. For example, the microcomputer 12051 can recognize a pedestrian by determining whether the pedestrian is present in images captured by the imaging units 12101 to 12104. Such pedestrian recognition is performed by a procedure of extracting feature points in the images captured by the imaging units 12101 to 12104, which are infrared cameras, for example, and a procedure of performing pattern matching on a series of feature points indicating an outline of an object and determining whether the object corresponds to the pedestrian. When the microcomputer 12051 determines that the pedestrian is present in the images captured by the imaging units 12101 to 12104 and recognizes the pedestrian, the sound-image output unit 12052 controls the display unit 12062 such that a rectangular contour for emphasis is superimposed and displayed on the recognized pedestrian. In addition, the sound-image output unit 12052 may also control the display unit 12062 to display an icon or the like indicating the pedestrian at a desired position.

An example of the vehicle control system to which the technology according to the present disclosure can be applied has been described above. The technology according to the present disclosure can be applied to, for example, the imaging unit 12031 and the like among the configurations described above. Specifically, the distance measurement device 1 according to the first embodiment of the present disclosure and the respective modifications thereof described above can be applied to the imaging unit 12031. As the technology according to the present disclosure is applied to the imaging unit 12031, it is possible to perform distance measurement from a traveling vehicle with higher accuracy.

Note that the effects described in the present specification are merely examples and are not restrictive of the disclosure herein, and other effects not described herein also can be achieved.

Note that the present technology can also have the following configurations.

(1) A light reception device comprising:
  a light receiving element in which a current flows according to an incident photon in a state where a predetermined voltage is applied and that returns to the state by a recharge current;
  a generation unit that generates a reference current; and
  a copying unit that copies the reference current generated by the generation unit to generate a copy reference current,
  wherein the recharge current based on the copy reference current is supplied to the light receiving element.

(2) The light reception device according to the above (1), wherein
  the generation unit
  generates the reference current using a reference voltage based on a physical property of a semiconductor material.

(3) The light reception device according to the above (1) or (2), further comprising a current changing unit that changes a current value of the copy reference current generated by the copying unit,
wherein the recharge current based on a current obtained by changing the current value of the copy reference current by the current changing unit is supplied to the light receiving element.

(4) The light reception device according to any one of the above (1) to (3), further comprising
a holding unit that holds a reference voltage according to the reference current generated by the generation unit,
wherein the copying unit
generates the copy reference current based on the reference voltage held in the holding unit.

(5) The light reception device according to the above (4), further comprising:
a first switch unit that controls supply of the reference voltage to the holding unit; and
a second switch unit that controls supply of the copy reference current generated based on the reference voltage held in the holding unit by the copying unit to the light receiving element.

(6) The light reception device according to the above (5), wherein
the second switch unit is
connected between the copying unit and the light receiving element.

(7) The light reception device according to the above (5), further comprising
a third switch unit that controls supply of the reference voltage to the copying unit,
wherein the second switch unit is
connected between the holding unit and the copying unit.

(8) The light reception device according to the above (4), wherein
the copying unit includes
a first copying unit and a second copying unit that are connected in cascade,
the first copying unit
generates a first copy reference current based on the reference voltage held in the holding unit,
the second copying unit
copies the reference current generated by the generation unit to generate a second copy reference current, and
the recharge current based on the first copy reference current and the second copy reference current is supplied to the light receiving element.

(9) The light reception device according to any one of the above (4) to (8), comprising
a plurality of the light receiving elements and a plurality of the copying units corresponding to the plurality of light receiving elements, respectively,
wherein two or more copying units among the plurality of copying units share the single holding unit.

(10) The light reception device according to the above (9), wherein
the plurality of light receiving elements are arrayed in a two-dimensional lattice, and
the plurality of copying units aligned in a row direction or a column direction of the array share the single holding unit among the plurality of copying units corresponding to the plurality of light receiving elements arrayed in the two-dimensional lattice, respectively.

(11) The light reception device according to any one of the above (1) to (10), wherein
the copying unit includes:
a copy source unit to which the reference current is supplied;

a copy destination unit to which a reference voltage based on the reference current is supplied from the copy source unit and that generates the copy reference current based on the supplied reference voltage; and
a buffer amplifier connected between the copy source unit and the copy destination unit.

(12) The light reception device according to any one of the above (1) to (11), wherein
the copying unit includes:
a copy source unit to which the reference current is supplied; and
a copy destination unit to which a reference voltage based on the reference current is supplied from the copy source unit and that generates the copy reference current based on the supplied reference voltage, and
the single copy source unit is shared by a plurality of pairs of the plurality of light receiving elements and a plurality of the copy destination units corresponding to the plurality of light receiving elements.

(13) The light reception device according to the above (1), further comprising:
a delay unit that delays an output of the light receiving element; and
a switch unit that controls supply of the copy reference current from the copying unit to the light receiving element according to the output delayed by the delay unit.

(14) The light reception device according to the above (13), wherein
the copying unit includes:
a copy source unit to which the reference current is supplied; and
a copy destination unit to which a reference voltage based on the reference current is supplied from the copy source unit and that generates the copy reference current based on the supplied reference voltage, and
the delay unit
controls a time of the delay based on the copy reference current generated by the copy destination unit.

(15) The light reception device according to any one of the above (1) to (14), further comprising
a first substrate and a second substrate stacked on the first substrate,
wherein the light receiving element is arranged on the first substrate, and
the generation unit and the copying unit are arranged on the second substrate.

(16) The light reception device according to any one of the above (4) to (10), further comprising
a first substrate and a second substrate stacked on the first substrate,
wherein the light receiving element is arranged on the first substrate, and
the generation unit, the copying unit, and the holding unit are arranged on the second substrate.

(17) A distance measurement device comprising:
a light receiving element in which a current flows according to an incident photon in a state where a predetermined voltage is applied and that returns to the state by a recharge current;
a generation unit that generates a reference current;
a copying unit that copies the reference current generated by the generation unit to generate a copy reference current;
a time measurement unit that measures a time from a light emission timing at which a light source emits light to a light reception timing at which the light receiving element receives reflection light, generated as the light emitted from the light source at the light emission timing is reflected by a measured object, and acquires a measured value;

a histogram generation unit that generates a histogram of the measured values; and a calculation unit that calculates a distance to the measured object based on the histogram, wherein the recharge current based on the copy reference current is supplied to the light receiving element.

(18) The distance measurement device according to the above (17), in which the generation unit generates the reference current using a reference voltage based on a physical property of a semiconductor material.

(19) The distance measurement device according to the above (17) or (18), further including a current changing unit that changes a current value of the copy reference current generated by the copying unit, in which the recharge current based on a current obtained by changing the current value of the copy reference current by the current changing unit is supplied to the light receiving element.

(20) The distance measurement device according to any one of the above (17) to (19), further including a holding unit that holds a reference voltage according to the reference current generated by the generation unit, in which the copying unit generates the copy reference current based on the reference voltage held in the holding unit.

(21) The distance measurement device according to the above (20), further including:

a first switch unit that controls supply of the reference voltage to the holding unit; and a second switch unit that controls supply of the copy reference current generated based on the reference voltage held in the holding unit by the copying unit to the light receiving element.

(22) The distance measurement device according to the above (21), in which the second switch unit is connected between the copying unit and the light receiving element.

(23) The distance measurement device according to the above (21), further including a third switch unit that controls supply of the reference voltage to the copying unit, in which the second switch unit is connected between the holding unit and the copying unit.

(24) The distance measurement device according to the above (20), in which the copying unit includes a first copying unit and a second copying unit that are connected in cascade, the first copying unit generates a first copy reference current based on the reference voltage held in the holding unit, the second copying unit copies the reference current generated by the generation unit to generate a second copy reference current, and the recharge current based on the first copy reference current and the second copy reference current is supplied to the light receiving element.

(25) The distance measurement device according to any one of the above (20) to (24), including a plurality of the light receiving elements and a plurality of the copying units corresponding to the plurality of light receiving elements, respectively, in which two or more copying units among the plurality of copying units share the single holding unit.

(26) The distance measurement device according to the above (25), in which the plurality of light receiving elements are arrayed in a two-dimensional lattice, and the plurality of copying units aligned in a row direction or a column direction of the array share the single holding unit among the plurality of copying units corresponding to the plurality of light receiving elements arrayed in the two-dimensional lattice, respectively.

(27) The distance measurement device according to any one of the above (17) to (26), in which the copying unit includes:

a copy source unit to which the reference current is supplied;

a copy destination unit to which a reference voltage based on the reference current is supplied from the copy source unit and that generates the copy reference current based on the supplied reference voltage; and a buffer amplifier connected between the copy source unit and the copy destination unit.

(28) The distance measurement device according to any one of the above (17) to (27), in which the copying unit includes:

a copy source unit to which the reference current is supplied; and a copy destination unit to which a reference voltage based on the reference current is supplied from the copy source unit and that generates the copy reference current based on the supplied reference voltage, and the single copy source unit is shared by a plurality of pairs of the plurality of light receiving elements and a plurality of the copy destination units corresponding to the plurality of light receiving elements.

(29) The distance measurement device according to the above (17), further including:

a delay unit that delays an output of the light receiving element; and a switch unit that controls supply of the copy reference current from the copying unit to the light receiving element according to the output delayed by the delay unit.

(30) The distance measurement device according to the above (29), in which the copying unit includes:

a copy source unit to which the reference current is supplied; and a copy destination unit to which a reference voltage based on the reference current is supplied from the copy source unit and that generates the copy reference current based on the supplied reference voltage, and the delay unit controls a time of the delay based on the copy reference current generated by the copy destination unit.

(31) The distance measurement device according to any one of the above (17) to (30), further including a first substrate and a second substrate stacked on the first substrate, in which the light receiving element is arranged on the first substrate, and the generation unit and the copying unit are arranged on the second substrate.

(32) The distance measurement device according to any one of the above (20) to (26), further including
a first substrate and a second substrate stacked on the first substrate,
in which the light receiving element is arranged on the first substrate, and
the generation unit, the copying unit, and the holding unit are arranged on the second substrate.

REFERENCE SIGNS LIST

1 DISTANCE MEASUREMENT DEVICE
10, 10a, $10a_1$, $10a_1'$, $10a_n$, $10a_n'$, 10b, $10b_1$, $10b_n$, $10c_1$, $10c_1'$, $10c_n$, $10c_n'$, $10d_1$, $10d_n$, $10e_1$, $10e_n$, 10f, 2010 PIXEL
100 PIXEL ARRAY UNIT
102 PIXEL CONTROL UNIT
103 OVERALL CONTROL UNIT
1000, $1000_1$, $1000_n$, $1000_{n2}$ LIGHT RECEIVING ELEMENT
1022 BGR CIRCUIT
$1051_1$, $1051_n$, 1092 CAPACITOR
1080 BUFFER AMPLIFIER
1011, 1011', 2001 CURRENT SOURCE
1100a, $1100a_1$, $1100a_2$, $1100a_3$, $1100a_4$, 1100b, 1100c COPY SOURCE CIRCUIT
2000 SPAD
2003, 2005, 2006a, 2006b SWITCH
2100 REFERENCE VOLTAGE SOURCE
3000 DELAY CIRCUIT

The invention claimed is:

1. A light reception device comprising:
a light receiving element in which a current flows according to an incident photon in a state where a predetermined voltage is applied and that returns to the state by a recharge current;
a generation circuit that generates a reference current;
a holding circuit that holds a reference voltage according to the reference current generated by the generation circuit;
a copying circuit that copies the reference current generated by the generation circuit to generate a copy reference current, wherein the copying circuit generates the copy reference current based on the reference voltage held in the holding circuit, and the recharge current is based on the copy reference current and is supplied to the light receiving element;
a first switch circuit that controls supply of the reference voltage to the holding circuit; and
a second switch circuit that controls supply of the copy reference current to the light receiving element.

2. The light reception device according to claim 1, wherein the generation circuit generates the reference current using a reference voltage based on a physical property of a semiconductor material.

3. The light reception device according to claim 1, further comprising:
a current changing circuit that changes a current value of the copy reference current generated by the copying circuit, wherein the recharge current based on a current obtained by changing the current value of the copy reference current by the current changing circuit is supplied to the light receiving element.

4. The light reception device according to claim 1, wherein the second switch circuit is connected between the copying circuit and the light receiving element.

5. The light reception device according to claim 1, further comprising:
a third switch circuit that controls supply of the reference voltage to the copying circuit, wherein the second switch circuit is connected between the holding circuit and the copying circuit.

6. The light reception device according to claim 1, wherein
the copying circuit includes a first copying circuit and a second copying circuit that are connected in cascade,
the first copying circuit generates a first copy reference current based on the reference voltage held in the holding circuit,
the second copying circuit copies the reference current generated by the generation circuit to generate a second copy reference current, and
the recharge current based on the first copy reference current and the second copy reference current is supplied to the light receiving element.

7. The light reception device according to claim 1, wherein
the light receiving element is one of a plurality of light receiving elements,
the copying circuit is one of a plurality of copying circuits corresponding to the plurality of light receiving elements, and
two or more of the plurality of copying circuits share the holding circuit.

8. The light reception device according to claim 7, wherein
the plurality of light receiving elements are arranged in a two-dimensional array, and
the two or more of the plurality of copying-itis circuits that share the holding circuit are aligned in a row direction or a column direction of the array.

9. The light reception device according to claim 1, wherein
the copying circuit includes:
a copy source circuit to which the reference current is supplied;
a copy destination circuit to which a reference voltage based on the reference current is supplied from the copy source circuit and that generates the copy reference current based on the supplied reference voltage; and
a buffer amplifier connected between the copy source circuit and the copy destination circuit.

10. The light reception device according to claim 1, wherein
the copying circuit includes:
a copy source circuit to which the reference current is supplied; and
a copy destination circuit to which a reference voltage based on the reference current is supplied from the copy source circuit and that generates the copy reference current based on the supplied reference voltage,
the light receiving element is one of a plurality of light receiving elements,
the copy destination circuit is one of a plurality of copy destination circuits corresponding to the plurality of light receiving elements, and
the copy source circuit is shared by the plurality of light receiving elements and the plurality of the copy destination circuits.

11. The light reception device according to claim 1, further comprising:
a first substrate and a second substrate stacked on the first substrate, wherein
the light receiving element is arranged on the first substrate, and the generation circuit and the copying circuit are arranged on the second substrate.

12. The light reception device according to claim 1, further comprising:
a first substrate and a second substrate stacked on the first substrate, wherein
the light receiving element is arranged on the first substrate, and the generation circuit, the copying circuit, and the holding circuit are arranged on the second substrate.

13. A distance measurement device comprising the light reception device according to claim 1.

14. A light reception device comprising:
a light receiving element in which a current flows according to an incident photon in a state where a predetermined voltage is applied and that returns to the state by a recharge current;
a generation circuit that generates a reference current;
a copying circuit that copies the reference current generated by the generation circuit to generate a copy reference current, wherein the recharge current based on the copy reference current is supplied to the light receiving element;
a delay circuit that delays an output of the light receiving element; and
a switch circuit that controls supply of the copy reference current from the copying circuit to the light receiving element according to the output delayed by the delay circuit.

15. The light reception device according to claim 14, wherein
the copying circuit includes:
a copy source circuit to which the reference current is supplied; and
a copy destination circuit to which a reference voltage based on the reference current is supplied from the copy source circuit and that generates the copy reference current based on the supplied reference voltage, and
the delay circuit controls a time of the delay based on the copy reference current generated by the copy destination circuit.

16. A distance measurement device comprising the light reception device according to claim 14.

* * * * *